United States Patent
Wang

(10) Patent No.: US 7,115,942 B2
(45) Date of Patent: Oct. 3, 2006

(54) METHOD AND APPARATUS FOR NONVOLATILE MEMORY

(76) Inventor: Chih-Hsin Wang, 6585 Gillis Dr., San Jose, CA (US) 95120

( * ) Notice: Subject to any disclaimer, the term of this patent is extended or adjusted under 35 U.S.C. 154(b) by 0 days.

(21) Appl. No.: 11/007,907

(22) Filed: Dec. 8, 2004

(65) Prior Publication Data

US 2006/0017091 A1    Jan. 26, 2006

Related U.S. Application Data

(63) Continuation-in-part of application No. 10/897,808, filed on Jul. 24, 2004, now abandoned.

(60) Provisional application No. 60/626,326, filed on Nov. 8, 2004.

(51) Int. Cl.
H01L 29/76 (2006.01)
G11C 16/04 (2006.01)

(52) U.S. Cl. .............. 257/321; 257/26; 365/185.18
(58) Field of Classification Search .............. 257/26, 257/321
See application file for complete search history.

(56) References Cited

U.S. PATENT DOCUMENTS

| | | |
|---|---|---|
| 5,029,130 A | 7/1991 | Yeh |
| 5,095,344 A | 3/1992 | Harari |
| 5,146,426 A * | 9/1992 | Mukherjee et al. ......... 257/316 |
| 5,268,319 A | 12/1993 | Harari |
| 5,280,446 A | 1/1994 | Ma et al. |
| 5,286,994 A | 2/1994 | Ozawa et al. |
| 5,429,965 A | 7/1995 | Shimoji |
| 5,432,739 A | 7/1995 | Pein |
| 5,557,122 A | 9/1996 | Shrivastava et al. |
| 5,563,083 A | 10/1996 | Pein |
| 5,714,766 A | 2/1998 | Chen et al. |
| 5,768,192 A | 6/1998 | Eitan |
| 5,780,341 A | 7/1998 | Ogura |
| 5,822,242 A | 10/1998 | Chen |
| 5,838,039 A | 11/1998 | Sato et al. |
| 5,847,427 A | 12/1998 | Hagiwara |
| 5,847,996 A | 12/1998 | Guterman et al. |
| 5,883,409 A | 3/1999 | Guterman et al. |
| 5,973,356 A | 10/1999 | Noble et al. |
| 6,002,152 A | 12/1999 | Guterman et al. |
| 6,080,995 A | 6/2000 | Nomoto |
| 6,088,263 A | 7/2000 | Liu et al. |
| 6,091,104 A | 7/2000 | Chen |
| 6,103,573 A | 8/2000 | Harari |
| 6,104,057 A | 8/2000 | Nakanishi et al. |

(Continued)

OTHER PUBLICATIONS

U.S. Appl. No. 10/105,741, filed Sep. 25, 2000, Kianian et al.

(Continued)

*Primary Examiner*—Dao H. Nguyen

(57) ABSTRACT

Method and apparatus on charges injection using piezo-ballistic-charges injection mechanism are provided for non-volatile memory device. The device has a strain source, an injection filter, a tunneling gate, a ballistic gate, a charge storage region, a source, and a drain with a channel defined between the source and drain. The strain source permits piezo-effect in ballistic charges transport to enable the piezo-ballistic-charges injection mechanism. The injection filter permits transporting of charge carriers of one polarity type from the tunneling gate through the blocking material and the ballistic gate to the charge storage region while blocking the transport of charge carriers of an opposite polarity from the ballistic gate to the tunneling gate. The present invention further provides an energy band engineering method permitting the memory device be operated without suffering from disturbs, from dielectric breakdown, from impact ionization, and from undesirable RC effects.

31 Claims, 32 Drawing Sheets

U.S. PATENT DOCUMENTS

| | | |
|---|---|---|
| 6,313,487 B1 | 11/2001 | Kencke et al. |
| 6,384,451 B1 * | 5/2002 | Caywood .................... 257/321 |
| 6,388,922 B1 | 5/2002 | Fujiwara et al. |
| 6,426,896 B1 | 7/2002 | Chen |
| 6,449,189 B1 | 9/2002 | Mihnea et al. |
| 6,469,343 B1 | 10/2002 | Miura et al. |
| 6,525,371 B1 | 2/2003 | Johnson |
| 6,555,865 B1 | 4/2003 | Lee |
| 6,580,124 B1 | 6/2003 | Cleeves et al. |
| 6,580,642 B1 * | 6/2003 | Wang .................... 365/185.18 |
| 6,680,505 B1 | 1/2004 | Ohba et al. |
| 6,709,928 B1 | 3/2004 | Jenne et al. |
| 6,734,105 B1 | 5/2004 | Kim |
| 6,747,310 B1 | 6/2004 | Fan |
| 6,756,633 B1 | 6/2004 | Wang et al. |
| 6,791,883 B1 | 9/2004 | Swift et al. |
| 6,952,032 B1 * | 10/2005 | Forbes et al. ................ 257/314 |

OTHER PUBLICATIONS

U.S. Appl. No. 10/192,291, filed Jul. 24, 2003, Wang.
U.S. Appl. No. 09/925,134, filed Jan. 1, 2004, Harari et al.
U.S. Appl. No. 10/791,486, filed Aug. 26, 2004, Harari.
U.S. Appl. No. 10/776,483, filed Aug. 19, 2004, Kianian et al.
U.S. Appl. No. 10/799,180, filed Sep. 9, 2004, Yuan et al.
U.S. Appl. No. 10/718,662, filed Jul. 8, 2004, Kan et al.
U.S. Appl. No. 09/862,078, filed Jan. 24, 2002, Chen.
U.S. Appl. No. 09/942,338, filed Feb. 5, 2004, Caywood.
U.S. Appl. No. 09/955,285, filed Dec. 5, 2002, Kim.
U.S. Appl. No. 09/881,332, filed Dec. 19, 2002, Jones et al.
U.S. Appl. No. 10/330,851, filed Jul. 3, 2003, Lee et al.
U.S. Appl. No. 10/348,267, filed Jul. 17, 2003, Jones et al.
U.S. Appl. No. 10/643,724, filed May 27, 2004, Cho.
U.S. Appl. No. 10/388,631, filed Sep. 23, 2004, Bae et al.
U.S. Appl. No. 10/457,249, filed Dec. 9, 2004, Wang.
U.S. Appl. No. 10/040,724, filed May 1, 2003, Wang et al.
U.S. Appl. No. 10/409,407, filed Oct. 7, 2004, Chen et al.
U.S. Appl. No. 10/797,296, filed Dec. 16, 2004, Lee et al.
U.S. Appl. No. 10/850,031, filed Oct. 28, 2004, Wang et al.
U.S. Appl. No. 10/848,982, filed Oct. 28, 2004, Wang.
C. A. Mead, "The Tunnel-Emission Amplifier", Proceedings of the IRE, pp. 359-361, 1960.
Fischetti et al., "Six-band k.p calculation of hole mobility in silicon inversion layers: depedence on surface . . . ," Journal of Appl. Physics, vol. 94, pp. 1079-1095, 2003.
Hensel et al., Cyclotron Resonance Experiments in Uniaxially Stressed Silicon: Valence Band Inverse Mass Parameters and Deformation . . . , Phys. Rev. 129, pp. 1141-1062, 1963.
Vogelsang et al., "Electron Mobilities and High-Field Drift Velocity in Strained Silicon on Silicon-Germanium Substrate", IEEE Trans. on Electron Devices, pp. 2641-2642, 1992.
Hinckley et al., "Hole Transport Theory in Pseudomorphic Si1-xGex Alloys Grown on Si(001) Substrates, " Phys. Rev. B, 41, pp. 2912-2926, 1990.

* cited by examiner

25-A

25-B

25-C

METHOD AND APPARATUS FOR NONVOLATILE MEMORY

RELATED APPLICATIONS

This application claims the benefit of U.S. Provisional Patent Application Ser. No. 60/626,326 filed Nov. 8, 2004. This application is a Continuation-In-Part of U.S. patent application Ser. No. 10/897,808 filed on Jul. 24, 2004 now abandoned, entitled "ELECTRICALLY ALTERABLE MEMORY CELL".

TECHNICAL FIELD

The present invention deals with nonvolatile memory, and relates more specifically to Electrically Programmable Read Only Memories (EPROM) and Electrically Erasable and Programmable Read Only Memories (EEPROM). More particularly, the present invention relates to methods and apparatus on charges injection using piezo-ballistic-charges injection mechanism and to memory cell structures. Charge states of memory cells are altered by injecting piezo-ballistic holes and by injecting piezo-ballistic electrons onto floating gate or charge storage sites of non-volatile memory cells for erase and for program operations, respectively.

BACKGROUND OF THE INVENTION

Non-volatile semiconductor memory cells permitting charge storage capability are well known in the art. The charges are typically stored in a floating gate to define the states of a memory cell. One such non-volatile memory cell has been proposed in U.S. application Ser. No. 09/942,338, which is hereby incorporated by reference.

The present invention can best be understood with an understanding of how the memory cells in prior art are constructed and how they are operated.

FIG. 1 (prior art) shows a cell architecture 100, wherein there is a tunneling gate 10, a ballistic gate 12, a floating gate 14, a source 16 and a drain 18 with a channel 20 therebetween, and a body 22 in a substrate of a first conductivity type (e.g. p-type). The ballistic gate 12 can be also termed as grid gate. However, term "ballistic gate" is preferable due to its nature on passing ballistic charge, and is employed hereinafter. The source 16 and drain 18 are formed in the substrate and have a second conductivity type (e.g. n-type). The floating gate 14 is disposed over and insulated from the channel 20 by a floating gate dielectric 24. The ballistic gate 12 is disposed over and insulated from the floating gate 14 by a retention dielectric 26. Likewise, the tunneling gate 10 is disposed over and insulated from the ballistic gate 12 by a layer of tunneling dielectric 28. A dielectric filler 29 is disposed around floating gate 14 and having its top surface be coincident with the top surface of the ballistic gate 12.

Ballistic hot hole and hot electron are injected into floating gate of prior art memory cells for erase and program operations, respectively, through injection mechanism first illustrated in the tunnel emission amplifier (see Mead, "The Tunnel Emission Amplifier," Procedings of the IRE, vol. 48, pp. 359–361, 1960). FIG. 2A (prior art) illustrates the ballistic hot hole injection of such mechanism in together with the energy band diagram for regions from tunneling gate 10 to floating gate 14 along a vertical axis (not shown) in cell 100. The tunneling gate 10 is biased positively with respect to the ballistic gate 12 to permit holes 30 in the tunneling gate 10 to tunnel through a tunneling barrier having a valence band barrier height 32 between a valence band 10b of the tunneling gate 10 and a valence band 28b of the tunneling dielectric 28. These holes in the ballistic gate region 12 can transport at energy higher than the valence band 12b of that region with some of these holes being able to reach the interface between the ballistic gate 12 and the retention dielectric 26. When this positive bias is increased to a value such that those holes have energy higher than a hole barrier height 34 at the interface, the holes will be able to enter a valence band 26b of the retention dielectric region 26, making their way through that region and be collected on the floating gate 14. To complete the erase operation, a sufficient amount of holes must be injected onto the floating gate 14 to neutralize negative charges thereon.

The ballistic hot electron injection for programming prior art memory cell is done similarly to the ballistic hot hole injection except by reversing the bias polarity. Referring to FIG. 2B (prior art), the tunneling gate 10 is biased negatively with respect to the ballistic gate 12 to permit electrons 31 in the tunneling gate 10 to tunnel through the tunneling dielectric 28. These electrons in the ballistic gate region 12 can transport at energy higher than a conduction band 12a of that region with some of these electrons being able to reach the interface between the ballistic gate 12 and the retention dielectric 26, surmounting an electron barrier 35 and entering the floating gate 14.

The charge injection mechanism employed in prior art is the same mechanism illustrated for amplifier application (see Mead, "The Tunnel Emission Amplifier," Procedings of the IRE, vol. 48, pp. 359–361, 1960). However, there are several fundamental problems associated with the charge injection mechanism when such mechanism is employed for memory operation. Further, there are several problems in the prior art memory cell need to be considered.

Problems on Charge Injection Mechanism of Prior Art

It is known that there are various types of holes, namely the light-hole (LH) and the heavy-hole (HH), in semiconductors (e.g. Si, Ge, GaAs etc.). The light-hole has a lighter effective mass than the heavy-hole, and difference between them depends on the band structure of the valence sub-bands of semiconductors. Prior art did not distinguish these two different types of holes while employing ballistic hole injection mechanism for erasing prior art memory cells. Further, the prior art did not teach the effects associated with these two types of holes on the injection mechanism. Thus, the injection scheme employed in prior art is believed to suffer from following problems:

1) Low Injection Efficiency

It is known that the population of holes in a semiconductor is primarily of the heavy-hole (HH). This is to first order due to its larger density-of-state effective mass. For example, in silicon, it is known the HH occupied about 80 percent of the total population of holes (see, for example, Fischetti et al., Journal of Appl. Physics, vol. 94, pp. 1079–1095, 2003). Further, it is known the ballistic carrier transport is characterized by its mean-free-path, where a ballistic carrier having a longer mean-free-path can transport a longer distance without scattering. The mean-free-path is approximately inversely proportional to the mass of the carriers. Therefore, HH typically has a shorter mean-free-path, and are more likely to experience scattering events through interacting with other types of carriers (e.g. phonons). Thus, a ballistic HH is more prone to loose its ballistic nature during its transport in a semiconductor region. When a ballistic HH transports at energy greater than its thermal energy, it is therefore more likely to loose its energy to become a thermal carrier. Even not loosing all its energy, HH can have its energy component in the direction to the floating gate region (or targeted destination) be significantly lowered such that the hole has insufficient energy to surmount the barrier height 34 of the insulator 26. In other words, when ballistic holes are employed for erasing prior art memory cells, since the majority population of the hole carriers are of the HH type, which has a shorter mean-free-path, most of the supplied holes cannot contribute to the erase operation as anticipate. This causes waste on total current. The combined effects of population and effective mass result in the ballistic hole injection efficiency significantly lower than one usually can expect. (Here, the efficiency is defined as number of charges injected compared to total number of charges supplied).

2) Higher Power Consumption and Slower Erase Speed

The aforementioned effects were ignored in prior art memory cells, and hence the cells require more electrical current be supplied, thus consuming more electric power, in order to complete an erase operation. Further, the low hole injection efficiency in prior art cells can result in slow erase problem when implementing the cells in their product applications.

Problems on Parasitic-Electrons Backward Injection

Please refer to FIG. 3A on this problem. FIG. 3A is similar to FIG. 2A except with additional parasitic electrons 36 and 37 in the valence band 12b and conduction band 12a, respectively. The electrons 36 and 37 are also known as the valence electrons 36 and the conduction electrons 37, respectively. Both electrons 36 and 37 are shown transporting along a backward direction (hereinafter "backward injection") from ballistic gate 12 to tunneling gate 10 when holes 30 are injected from tunneling gate 10 to ballistic gate 12 along a forward direction (hereinafter "forward injection") for erase operation. To suppress these parasitic electrons, prior art taught requirement on material for ballistic gate 12, where material with larger work function, such as a heavily doped p-type polysilicon ("p+ polysilicon"), is required. P+ polysilicon is taught in the prior art because electrons 37 in that material is usually negligible. Further, prior art taught a symmetrical tunneling stack structure comprising tunneling gate 10, tunneling dielectric 28, and ballistic gate 12, wherein tunneling gate 10 and ballistic gate 12 are of p+ polysilicon. The tunneling dielectric 28 is constructed in a single layer of oxynitride with oxide fraction engineered at level less than about 77% such that current flow of the backward injected electrons can be kept at similar current level as that of the forward injected holes 30. In other words, the current of backward injected electrons in prior art cell cannot be entirely suppressed. This causes waste on total current as the forward injected charge and its current is the one of interest for cell operations. Further, there are several other fundamental deficiencies on the symmetrical tunneling structure and cell structure of prior art. The issue is described next with reference to FIGS. 3A and 3C.

Referring to FIG. 3A, for ballistic gate 12 of a p+ polysilicon in prior art, electrons 37 in that region is usually negligible when a low voltage is applied between tunneling gate 10 and ballistic gate 12. Therefore, tunneling current of electrons 37 is negligible. The parasitic electrons thus mainly comprise electrons 36 of valence band 12b and are tunneled to tunneling gate 10 through a trapezoidal-shaped barrier (also known as "direct tunneling"). However, when a voltage of erase operation (e.g. 5V) is applied between tunneling gate 10 and ballistic gate 12, the portion of ballistic gate 12 next to tunneling dielectric 28 can be inadvertently inverted and thus a layer of electrons 37 can still be formed therein. The electrons 37 are formed near the interface between tunneling dielectric 28 and ballistic gate 12 and can be emitted into tunneling gate 10 along path 37a to become hot electrons having energy higher than a minimum of conduction band 10a of that region. The tunneling is through a triangle-shaped tunneling barrier (also known as "Fowler-Nordheim tunneling") having a barrier height 33 that is lower than that of electrons 36 by an energy gap 12c of the ballistic gate 12. Therefore, due to the lower barrier height and the triangular shaped barrier for electrons 37, a much stronger tunneling current is expected once tunneling process for electrons 37 starts. FIG. 3C illustrates the parasitic currents $J_{CE}$ and $J_{VE}$, associated with conduction electrons ("CE") 37 and valence electrons ("VE") 36, respectively. The voltage dependence of current $J_{CE}$ is seen much stronger than that of current $J_{VE}$ due to the much stronger dependence of current on voltage when charges tunneling through a triangle-shaped barrier. Parasitic current $J_{CE}$ is seen dominating the total current in the higher voltage range (e.g. about 5V). The results show that electrons 37 dominate the parasitic electrons 36 in valence band 12b and hence the total parasitic electrons tunneled into the tunneling gate 10. Note that this effect is work function independent. The p+ polysilicon/oxynitride/p+ polysilicon tunneling stack in prior art overlook such effect, and hence the prior art cell 100 can suffer from the parasitic carriers backward tunneling. Therefore it cannot function properly.

Problems on Parasitic-Holes Backward Injection

Parasitic holes backward injection problem is another major problem for the mechanism employed in prior art. Please refer to FIG. 3B on this problem. FIG. 3B is similar to FIG. 2B except with additional parasitic holes 38 shown in the valence band 12b and some others elements (e.g. electrons 40 and 40') to be discussed in a later session. Holes 38 are shown transporting in the backward direction from ballistic gate 12 to tunneling gate 10 when electrons 31 are injected in the forward direction for program operation of prior art cell. The problem on backward injected holes 38 is caused by the requirement on higher work function in prior art. Further there are shown barrier height 10c for forward injected electrons 31, and barrier height 39 for backward injected holes 38. Referring to FIG. 3B, as work function of the ballistic gate 12 is increased, once it's beyond a level where the barrier 39 becomes less than the barrier height 10c, parasitic holes 38 can be backward injected to tunneling gate 10 and can result in problems to the program operation similar to that caused by the parasitic electrons to the erase operation. Therefore, the symmetrical tunneling structure of prior art cannot be optimized to suppress parasitic charge carriers for both program and erase operations simultaneously. Such problem prevents tunneling gate 10 in the prior art cell from being used as a single electrode for supplying both types of charges (i.e. electrons and holes). Therefore, it is believed prior art require two separate tunneling gates: one for electron tunneling injection, and the other one for hole tunneling injection. This requirement results in larger cell size, and limits the cell of prior art from practical application.

Problems on Impact Ionization

In addition to the problems described above, the injection mechanism and energy band structure employed in prior art also can suffered from impact ionization problem. FIG. 3B shows the impact ionization problem in the prior art band structure in FIG. 2B. There are shown electrons 40 in the conduction band 10a of tunneling gate 10. In the program operation of prior art, a typical voltage of −2 V and a +2 V is applied to the tunneling gate 10 and ballistic gate 12, respectively. The voltage difference between these gates has to be greater than a minimum voltage in order to supply sufficient energy for electrons 31 (see FIG. 3B) to surmount the barrier height 35 to enter the floating gate 14. However, due to the high bias thus introduced across tunneling dielectric 28, an inversion layer of electrons 40 can be formed in the conduction band 10a of the tunneling gate 10 of p+ polysilicon. Further, another mechanism that can form electrons 40 is through the impact generation process triggered by the backward injected holes 38. As is clearly shown in FIG. 3B that as these holes 38 enter into tunneling gate 10, their energy can be high enough to generate, through impact ionization process, secondary electrons 40 in conduction band 10a or energetic electrons 40' having energy higher than conduction band 10a. These conduction electrons 40 and 40' thus generated are termed "Impact-Ionized CE" and behave very differently than the electrons 31 at the valence band 10b. Similar to that illustrated in FIG. 3C, in such range of bias, the current of CE ($J_{CE}$) is much larger than the current of VE ($J_{VE}$). In other words, the generated CE 40 and 40' (either through inversion or through impact-ionization) can dominate the tunneling current between tunneling gate 10 and ballistic gate 12 of prior art.

Likewise, impact ionization problem can also happen in ballistic gate 12 and can be triggered by electrons 40 or by energetic electrons 40' transported from tunneling gate 10. As described above, these electrons 40 and 40' are inadvertently generated under the bias condition for program operation. The presence of these electrons is not desirable as they carry a much higher energy than that carried by the electrons 31. As illustrated in FIG. 3B, these electrons 40 and 40' can tunnel through the tunneling dielectric 28 at such a high energy into ballistic gate 12 and subsequently causes impact ionization therein, where pairs of electrons 40b and holes 40a are created.

It is now clear that the impact ionization and the inversion layer formation can exist in the tunneling gate 10 in the energy band structure for the ballistic injection scheme of prior art. All these effects can create parasitic electrons 40 and 40' in tunneling gate 10. The effects and the parasitic electrons in the tunneling gate region 10 were not taken into account in the prior art. These effects are uncontrollable, where current can unduly increase to result in current loading issue on supporting circuitry for memory operations. To avoid these problems in program operation, the allowable maximum voltage between gates 10 and 12 has to be limited under a threshold voltage to avoid the formation of electrons 40 and/or 40' in tunneling gate 10. The range between the minimum and the maximum program voltages defines a workable voltage range for program operation of prior art, and is quite narrow for the injection mechanism employed in prior art (less than about 0.6V). The cell structure in prior art thus demands stringent control on the threshold voltage, and is believed having low manufacturability yield and difficulties in practical applications.

Similar to the program operation, in the erase operation (referring to FIG. 3A), the impact-ionization process can also occur in tunneling gate 10 due to electrons 37 backward injected from ballistic gate 12. The backward injected electrons 37 have an energy high enough to impact ionized charge carriers in tunneling gate 10 to cause loading issue on supporting circuitry for memory operations. The injection mechanism, energy band and cell structure in prior art thus face similar issues in both the program and the erase operations, and the memory is believed having low manufacturability yield and difficulties in practical applications.

Problems on Dielectric Breakdown

Please refer to FIG. 2A for the illustration. In the erase operation of prior art, a typical voltage of +2.5 V and a −2.5V is applied to tunneling gate 10 and ballistic gate 12, respectively. The voltage difference between these two gates has to be greater than a minimum voltage in order to supply sufficient energy for holes 30 to surmount the barrier height 34. However, for the energy band structures proposed in the prior art, such voltage results in a maximum field in the range of about 10 MV/cm to about 20 MV/cm across the tunneling dielectric layer 28. In such range of high field, the tunneling dielectric 28 is believed suffered from dielectric breakdown (see FIG. 3C). To avoid a dielectric breakdown event in cell operation, the maximum allowable voltage between gates 10 and 12 has to be limited under the dielectric breakdown voltage. The range between the minimum and the maximum voltages defines a workable voltage range for the erase operation, and is quite narrow in prior art (typically less than about 0.7V). The cell structure in prior art thus demands stringent control on the dielectric breakdown, and is believed having difficulties in practical applications.

Problems on Parasitic Capacitance

In the energy band structure and cell structure of prior art, the thickness of the tunneling dielectric layer 28 is chosen with a limitation typically in the range of about 2 nanometer to 4 nanometer ("nm" hereinafter) in order to permit charge carriers tunneling through that layer. Therefore, it results in a large parasitic capacitance C between gates 10 and 12, and is undesirable as it introduces adverse impact on cell operation. The capacitance issue can be better understood by referring to the diagram in FIG. 3D (prior art), wherein $C_{BG-TG}$ is the capacitance between ballistic gate 12 and tunneling gate 10, and $C_{BG-FG}$ is the capacitance between ballistic gate 12 and floating gate 14. The total capacitance seen by ballistic gate 12 comprises two main components shown in FIG. 3D, and approximately equals the summation of $C_{BG-FG}$ and $C_{BG-TG}$. In most situations, the total capacitance can be dominated by $C_{BG-TG}$ due to the much thinner thickness for the tunneling dielectric layer 28 than that for the retention dielectric layer 26, which is typical in the range of about 7 nm to about 12 nm. The capacitance issue is worse when employing dielectric with higher dielectric constant (e.g. oxynitride), which is provided in the prior art for suppressing the parasitic electrons in ballistic gate 12 during hole injection for the erase operation. Therefore, the cell architecture in prior art further suffer from the compromise between suppressing the parasitic electrons and suppressing the total capacitance of ballistic gate 12.

Problems on Large Resistance

In the prior art, ballistic gate layer 12 is desirable to be with a thickness in the range of a few times of the mean-free path of carrier scattering (typically in the range of 10–20 nm), in order to permit the injected carriers transporting through ballistic gate 12 with good efficiency. The needs on a thin thickness unavoidably results in a high sheet resistance to that layer. As described earlier, to reduce parasitic electron tunneling (see FIG. 3A), prior art is limited to using p-type Si for both tunneling gate 10 and ballistic gate 12 when polysilicon is used as the material for these gates. It is known that a heavily doped p-type polysilicon ("p+ polysilicon") typically has a higher resistivity than that of a heavily doped n-type polysilicon ("n+ polysilicon"). Therefore, prior art suffers from a much larger resistance R on both tunneling gate 10 and ballistic gate 12.

The adverse effect of a large R on memory cell performance can be understood from several directions. First, it can cause a large signal delay due to the combining effects of the large R and the large C (i.e. the RC delay). This is particularly a main issue on cell operation as the RC delay can limit the speed on accessing a memory cell when embedded in a large memory array. Secondly, for disturb prevention on un-selected cells, an optimum set of predetermined voltages usually are required to be applied to those cells. However, due to the RC delay, voltages on un-selected cells can be different than the desired values, and hence cell disturb is more prone to happen. Furthermore, the large R can combine with a large current I to result in a IR effect, which can cause a voltage drop when passing a voltage in a signal line. The effect prevents the voltage on a designated electrode of a memory cell from reaching its desired level, and hence can adversely impact cell operation. For example, the adverse impact on an un-selected cell can be an undesired cell disturb, where the cell state is unintentionally changed from one logic state (e.g. a "0") to the other (e.g. a "1"). The IR impact on a selected cell can be a slower speed on cell operations (i.e. program, erase, and read operations).

Problems on Weak Voltage-Dependence of Tunneling Current

The energy band structure in prior art is constructed to permit charge carriers of one type tunneling from tunneling gate 10 to ballistic gate 12 at a current level similar to that for the backward injected parasitic electrons. This results in weak voltage-dependence on the current-voltage relationship. For example, the current for an erase disable condition (i.e. the condition to prevent an unselected cell from an erase disturb) is seen only $10^4$ times lower than that for the erase condition. Similar results can be seen in the program disable condition of prior art. Therefore, unselected cells in prior art are prone to cell disturb issues in both program and erase operations.

These problems can be overcome in accordance with one aspect of the present invention by providing a piezo-ballistic-charge-injection mechanism. Employing the mechanism, the present invention further provides technique altering effective mass of ballistic charge carriers and hence its mean-free-path. Additionally, employing the mechanism, the present invention provides technique increasing carriers population in sub-bands or valleys favorable to their transport. The piezo-ballistic-charge-injection mechanism is implemented in cell structures in accordance with the present invention. Further, these problems can be overcome in accordance with another aspect of the present invention by providing a barrier height engineering concept on energy band structure, by providing a novel method altering barrier heights, by providing injection filter structures, and by providing new cell structures.

DISCLOSURE OF THE INVENTION

It is the object of the invention to identify and to provide a new injection mechanism and methods, and to devise energy band structure and cell structures for nonvolatile memory.

Briefly, a preferred embodiment of the present invention is method and apparatus providing piezo-ballistic-charge-injection. A strain material is provided in a charge injector comprising a strained tunneling gate, a strained ballistic gate, and an injection filter disposed therebetween. The strain material provides mechanical stress to the strained tunneling gate to provide piezo-effect to that region to permit piezo-ballistic-charge-injection mechanism. The charge injection filter permits transporting of charge carriers of one polarity type from the strained tunneling gate through the strained ballistic gate to a charge storage region disposed adjacent thereto and blocks transporting of charge carriers of an opposite polarity from the strained ballistic gate to the strained tunneling gate.

Briefly, another preferred embodiment of the present invention is method and apparatus providing piezo-ballistic-charge-injection. A strain material is provided in a charge injector comprising a strained tunneling gate, a strained ballistic gate, and an injection filter disposed therebetween. The strain material provides mechanical stress to the strained ballistic gate to provide piezo-effect to that region to permit piezo-ballistic-charge-injection mechanism. The charge injection filter permits transporting of charge carriers of one polarity type from the strained tunneling gate through the strained ballistic gate to a charge storage region disposed adjacent thereto and blocks transporting of charge carriers of an opposite polarity from the strained ballistic gate to the strained tunneling gate.

Briefly, another preferred embodiment of the present invention is method and apparatus providing piezo-ballistic-charge-injection. A strain material is provided in a charge injector comprising a strained tunneling gate, a strained ballistic gate, and an injection filter disposed therebetween. The strain material provides mechanical stress to the strained tunneling gate and to the strained ballistic gate to provide piezo-effect to those regions to permit piezo-ballistic-charge-injection mechanism. The charge injection filter permits transporting of charge carriers of one polarity type from the strained tunneling gate through the strained ballistic gate to a charge storage region disposed adjacent thereto and blocks transporting of charge carriers of an opposite polarity from the strained ballistic gate to the strained tunneling gate.

Summary on Advantages of the Present Invention

1) The present invention provides piezo-ballistic-charge-injection mechanism for memory cell operations (e.g. erase and program). High injection efficiency can be achieved by employing such mechanism.

2) The present invention addresses parasitic charges issue.

The energy band structure and cells provided in the present invention illustrate that the requirement on a large work function for region where ballistic charge traverses, as required in the prior art, is not necessary. Further, the cell structures of the present invention removes the requirement in the prior art on maintaining a similar current level for the forward and the backward injected carriers. The backward injection current can be reduced by the injection filter to fix the current waste problem;

3) The present invention provides the injection filter structure permitting thicker dielectrics be used in the cell. A thicker dielectric has the advantage on manufacturing control, thus the memory cell of the present invention is more manufacturable;

4) The present invention permits cell operations without suffering dielectric breakdown problem;

5) The present invention avoids impact ionization problems;

6) The present invention permits cell operation without cell disturb by providing energy band structure that is more effective on cell disturb prevention in un-selected cells than that provided in the prior art;

7) The present invention suppresses large R effect and permits lower sheet-resistance in SBG and in STG; and 8) The present invention suppresses large C effect;

These and other objects and advantages of the present invention will become clear to those skilled in the art in view of the description of the preferred embodiment as described herein and as illustrated in the figures of the drawings.

BRIEF DESCRIPTION OF THE DRAWINGS

The invention is herein described, by ways of example only, with reference to the accompanying drawings, wherein FIG. 1 (prior art) illustrates a cross sectional view of a memory cell architecture of the prior art.

DETAILED DESCRIPTION OF THE INVENTION

Embodiments of the present invention described in the following detailed description are directed at injection mechanisms, methods and memory cell structures. Those of ordinary skill in the art will realize that the detailed description is illustrative only and is not intended to restrict the scope of the claimed inventions in any way. Other embodiments of the present invention, beyond those embodiments described in the detailed descriptions, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will be appreciated that the development effort on achieving specific goals can vary from one implementation to another and from one manufacturer to another. Such efforts might be complex and time-consuming, but would nevertheless be a routine undertaking of engineering for those of ordinary skill in the art having the benefit of this disclosure.

Piezo-effect is a well-known physical phenomenon in solid-state physics. Piezo-effect can change electrical properties of a semiconductor material when a mechanical stress (either in compressive or tensile form) is applied to such material (see Pikus and Bir, Symmetry and Strain-Induced Effects in Semiconductors, New York: Wiley, 1974). This mechanical stress results in a strain in the material. It breaks the symmetry within the crystal lattice and hence deforms the potential therein. Some well-known applications of the piezo-effect on semiconductors (e.g. silicon) are piezo-resistive effect in resistors, piezo-junction effect in bipolar transistors and diodes, piezo-FETs in MOSFETs, and piezo-Hall effect in sensors.

Ballistic carrier transport is a well-known phenomenon in solid state physics. It represents charge carriers transporting in semiconductor crystal without scattering at all (i.e. in a "ballistic" way). Under these conditions, the transport of carriers resembles that in vacuum, but with the effective mass and group velocity of the carriers in the semiconductor.

The present invention provides the application of the piezo-effect to the ballistic charge carrier transport. A piezo-ballistic-charge-injection mechanism is provided with illustrations made herein to various embodiments of cell structures for nonvolatile memory.

Piezo-Ballistic-Charge-Injection Mechanism

Figure 4:
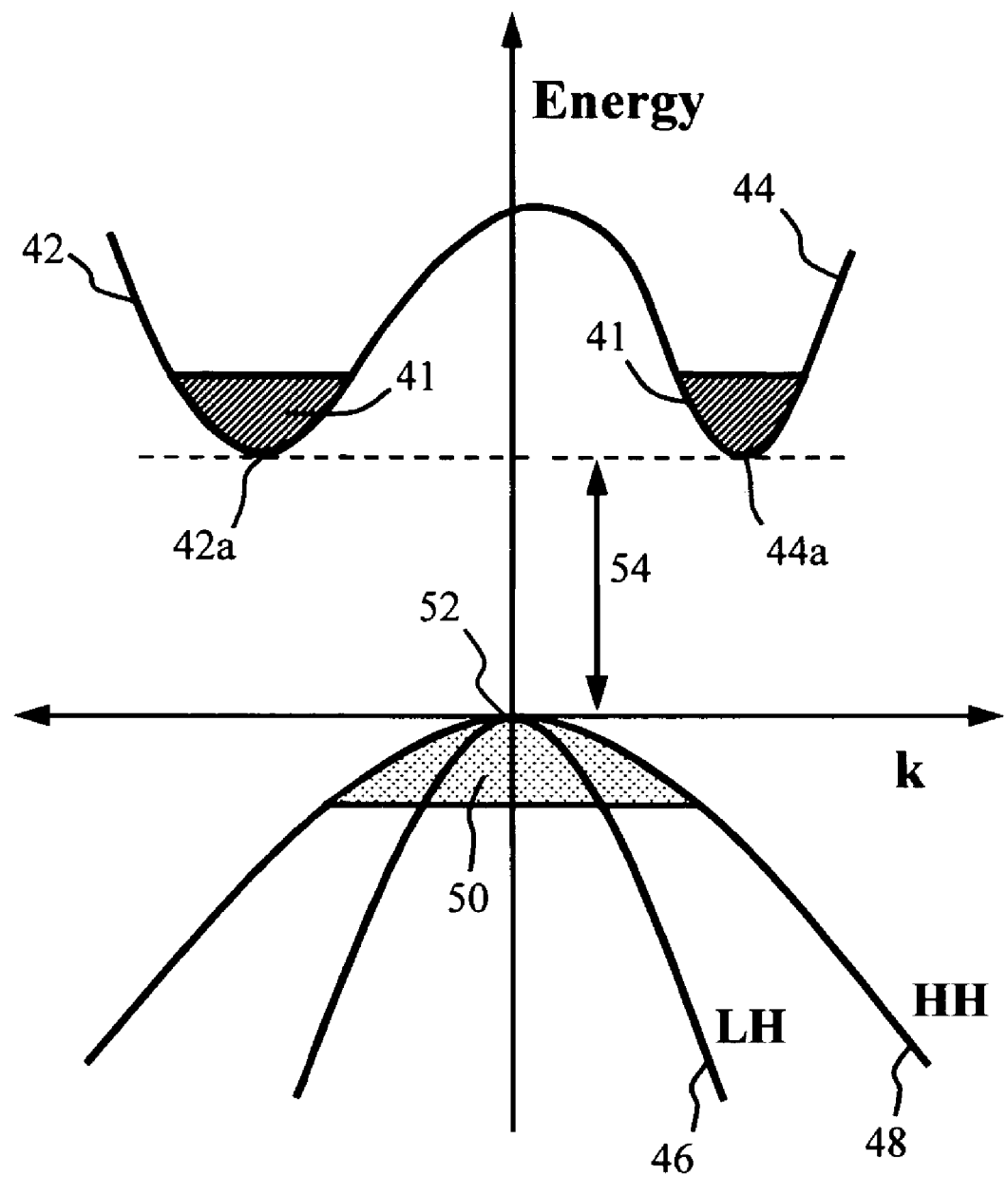
FIG. 4 is a schematic diagram illustrating the dispersion relationship between energy E and momentum vector k for a semiconductor without strain.
Figure 5:
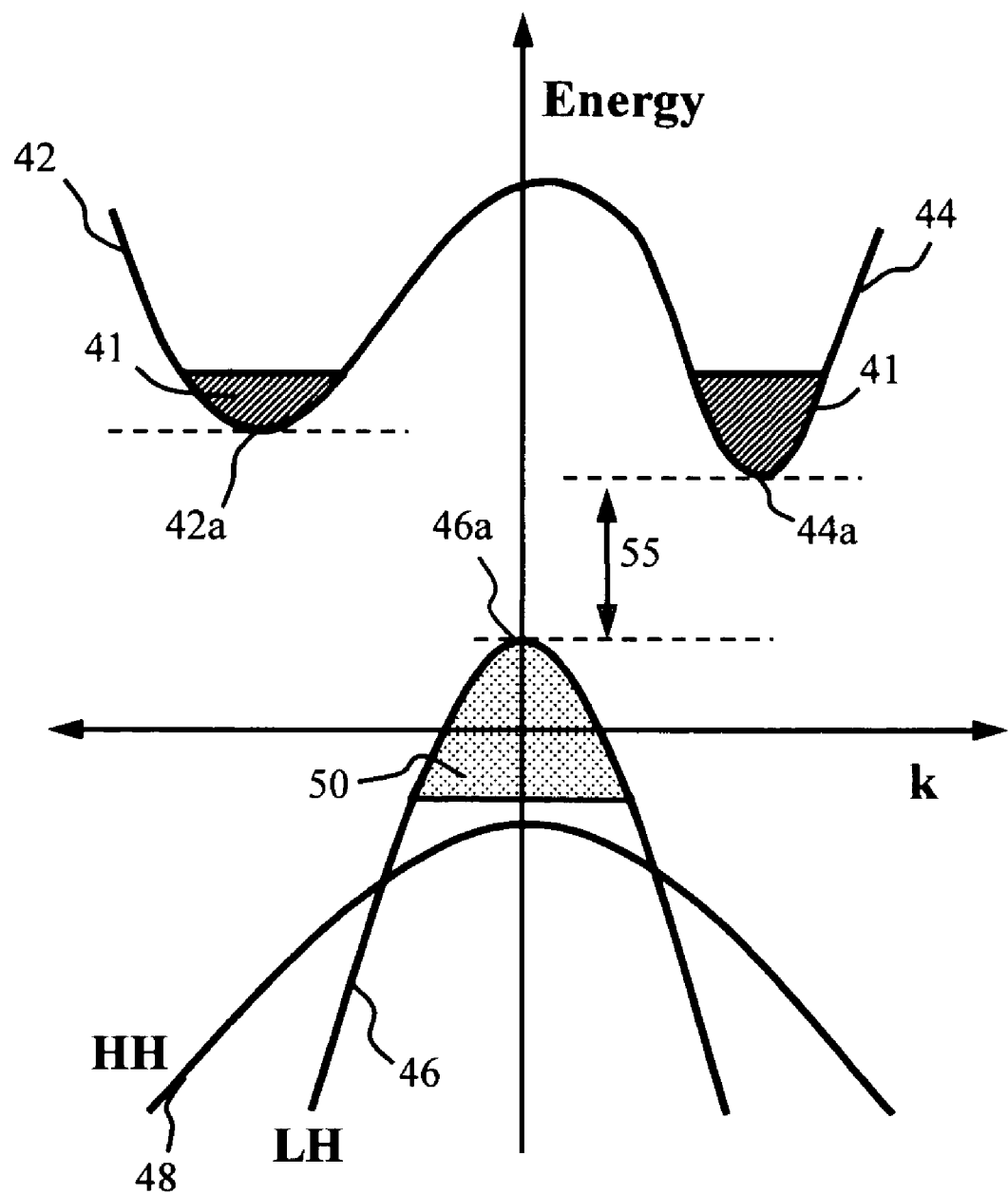
FIG. 5 is a schematic diagram illustrating the dispersion relationship between energy E and momentum vector k for a semiconductor under tensile stress.
Figure 6:
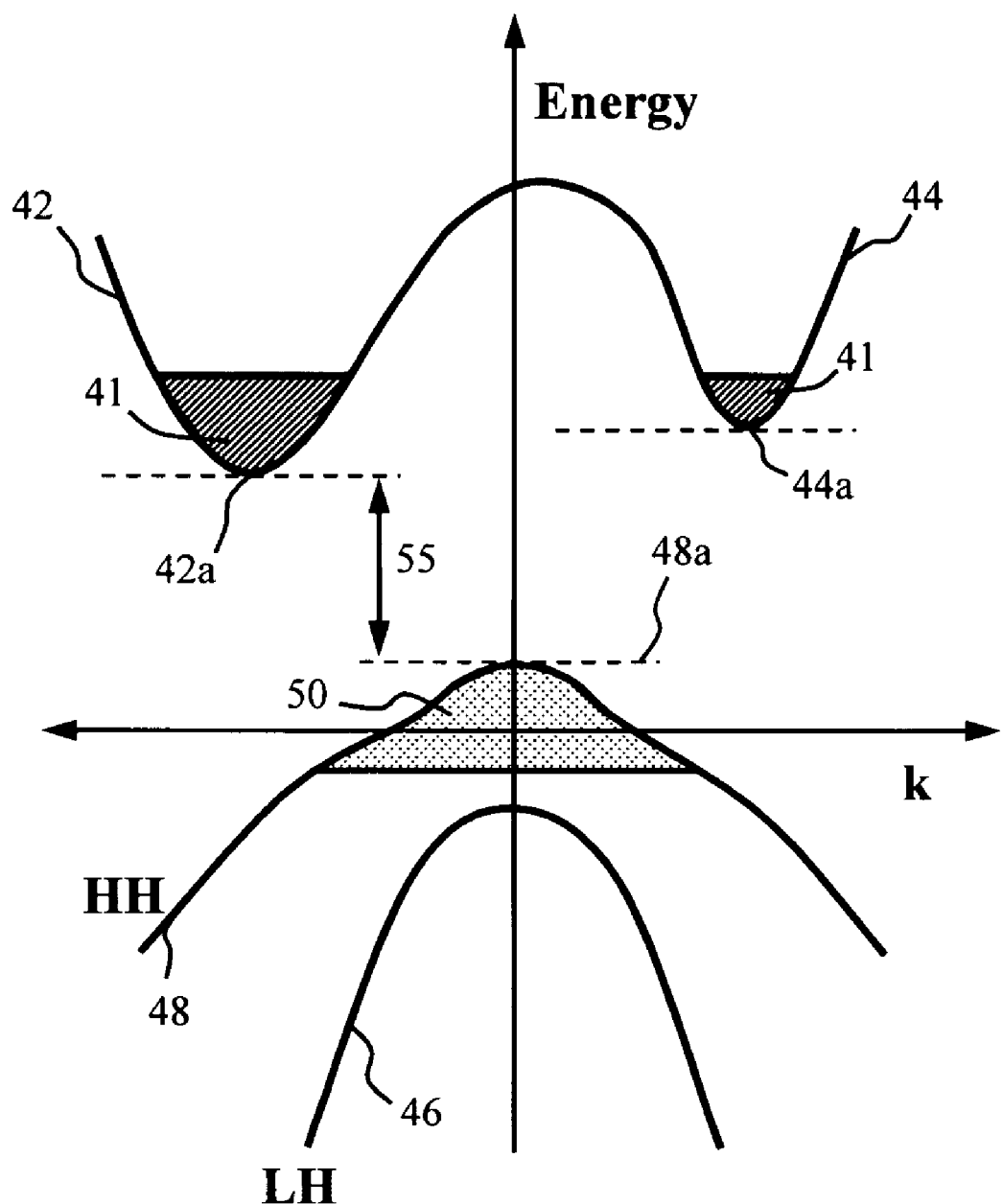
FIG. 6 is a schematic diagram illustrating the dispersion relationship between energy E and momentum vector k for a semiconductor under compressive stress.

It is known that when a strain is in presence in semiconductors, it can split valleys in conduction band and degeneracy in valence sub-bands of HH and LH (see Hensel et al., "Cyclotron Resonance Experiments in Uniaxially Stressed Silicon: Valence Band Inverse Mass Parameters and Deformation Potentials, Phys. Rev. 129, pp. 1141–1062, 1963). FIGS. 4, 5 and 6 provide schematic diagrams illustrating the dispersion relationship between energy E and momentum vector k for a semiconductor without strain, under tensile stress, and under compressive stress, respectively. FIG. 4 shows electrons 41 filled in two conduction band valleys 42 and 44 having minima 42a and 44a, respectively. The minima 42a and 44a are shown at similar energy level. With the different curvatures on the dispersion curves shown for the valleys, the left valley 42 has a heavier effective mass than the right one 44. Also shown are dispersion curves for LH and HH sub-bands 46 and 48 filled with holes 50. LH and HH sub-bands 46 and 48 are shown having energy degeneracy at a valence band maximum 52. The conduction band minima 42a or 44a and the valence band maximum 52 are separated by an energy band gap 54.

FIG. 5 shows dispersion relationship similar to FIG. 4 except the semiconductor is strained with tensile stress. The conduction band valleys are shown shifted with their minima moving upward (left valley 42) or downward (right valley 44). This shift redistributes the electron population within the two valleys, where electrons 41 are more populated in the valley 44 due to a lower energy level on the conduction band minimum 44a. Repopulating electrons 41 to reside primarily in valley 44 is desirable for two reasons. First, it provides desirable effect on electron transport in the semiconductor due to the lighter electron effective mass in the conduction valley 44. Second, the separation of the valleys is known being able to reduce inter-valley scattering of electrons. These effects can be more specifically illustrated by using silicon as an example. The strain in silicon can cause splitting of the six-fold degenerate conduction band into two-fold and four-fold degenerate valleys with most electrons (about 100 percent of the entire electrons) populated in the two-fold degenerate valley having low effective mass along electron transport direction. This strain effect is known to increase electron mobility by about 50 percent and drift velocity by about 16 percent in strained-Si MOSFETs (a type of piezo-FETs, see Vogelsang et al., "Electron Mobilities and High-Field Drift Velocity in Strained Silicon on Silicon-Germanium Substrate", IEEE Trans. on Electron Devices, pp. 2641–2642, 1992). Similar strain effect can be applied to enhance the transport of ballistic charge carriers. Thus, ballistic electron injection efficiency in silicon can be enhanced by repopulating electrons to the two-fold degenerate valley. This can be achieved through applying stress to silicon to cause strain along direction of electron transport. It is thus clear the piezo-effect can result in heavily populated "piezo" electrons, which have a lighter mass and lower scattering rates. When combining these effects to ballistic electron injection, it provides a piezo-ballistic-electron-injection mechanism in accordance with one embodiment of the present invention.

FIG. 5 also illustrates the strain effect of tensile stress in semiconductor can further lift the degeneracy of valence sub-bands 46 and 48, where the LH sub-band 46 is shown shifted upward and the HH sub-band 48 is shown shifted downward. Having this effect and the effect shifting down the conduction band valley 44, the energy band gap 55 can be narrower than the energy band gap 54 of the unstrained case of FIG. 4. Using silicon as an example, for tensile strained silicon layer (e.g. forming a silicon layer on a $Si_{1-x}Ge_x$ layer), the energy level of the two-fold degeneracy in silicon can be shifted down by about 0.18 eV and the LH degeneracy can be shifted up by about 0.12 eV for a Ge mole fraction x equals about 30 percent. The resulted energy band gap 55 thus is about 0.8 eV. Lifting the LH and HH degeneracy can further reduce inter-band scattering between LH and HH. Moreover, a deformation on valence sub-bands can reduce effective mass of the light-holes. As a result, the mean-free-path of ballistic light-holes can be longer in a strained semiconductor than that in an unstrained one. FIG. 5 also shows that with lifting the degeneracy of LH and HH sub-bands, holes 50 can be repopulated from the HH sub-band 48 to LH sub-band 46. In fact, with silicon strained under the tensile stress, LH population can be increased from about 20 percent to about 90 percent of entire holes population (see Fischetti et al., Journal of Appl. Physics, vol. 94, pp. 1079–1095, 2003). Further, it is known that LH has a much lower scattering rate than that of HH (see Hinckley et al., "Hole Transport Theory in Pseudomorphic $Si_{1-x}Ge_x$ Alloys Grown on Si(001) Substrates," Phys. Rev. B, 41, pp. 2912–2926, 1990). Thus, ballistic hole injection efficiency can be enhanced by repopulating holes from HH to LH sub-bands. This can be achieved through applying tensile stress to regions where holes are injected from. With the heavily populated LH and their lower scattering rate, when applying these combined effects to ballistic charge injection, it provides a method employing piezo-effect on ballistic-charge-injection. The method enhances the ballistic holes injection efficiency through injecting ballistic light-holes, and is provided as another embodiment of the piezo-ballistic-charge-injection mechanism in accordance with the present invention.

FIG. 6 illustrates dispersion relationship similar to FIG. 5 except the semiconductor is under strain of compressive stress. Similar to the tensile stress, the compressive stress can lift the degeneracy of valence sub-bands 46 and 48, but in an opposite way as compared to that shown in FIG. 5. The LH sub-band 46 is shown shifted downward and the HH sub-band 48 is shown shifted upward. Nevertheless, lifting the HH and LH degeneracy can reduce inter-band scattering between LH and HH. Due to this shift on valence sub-bands, the holes are shown primarily populated in the HH valence sub-band. Further, the valence sub-bands are shown with deformed curvatures as compared to those shown in FIG. 4 of the unstrained case. The deformed HH valence sub-band in FIG. 6 can reduce effective mass of the heavy-holes to a lighter one. As a result, the mean-free-path of ballistic heavy-holes in a strained semiconductor can be longer than that of an unstrained one.

Figure 7:
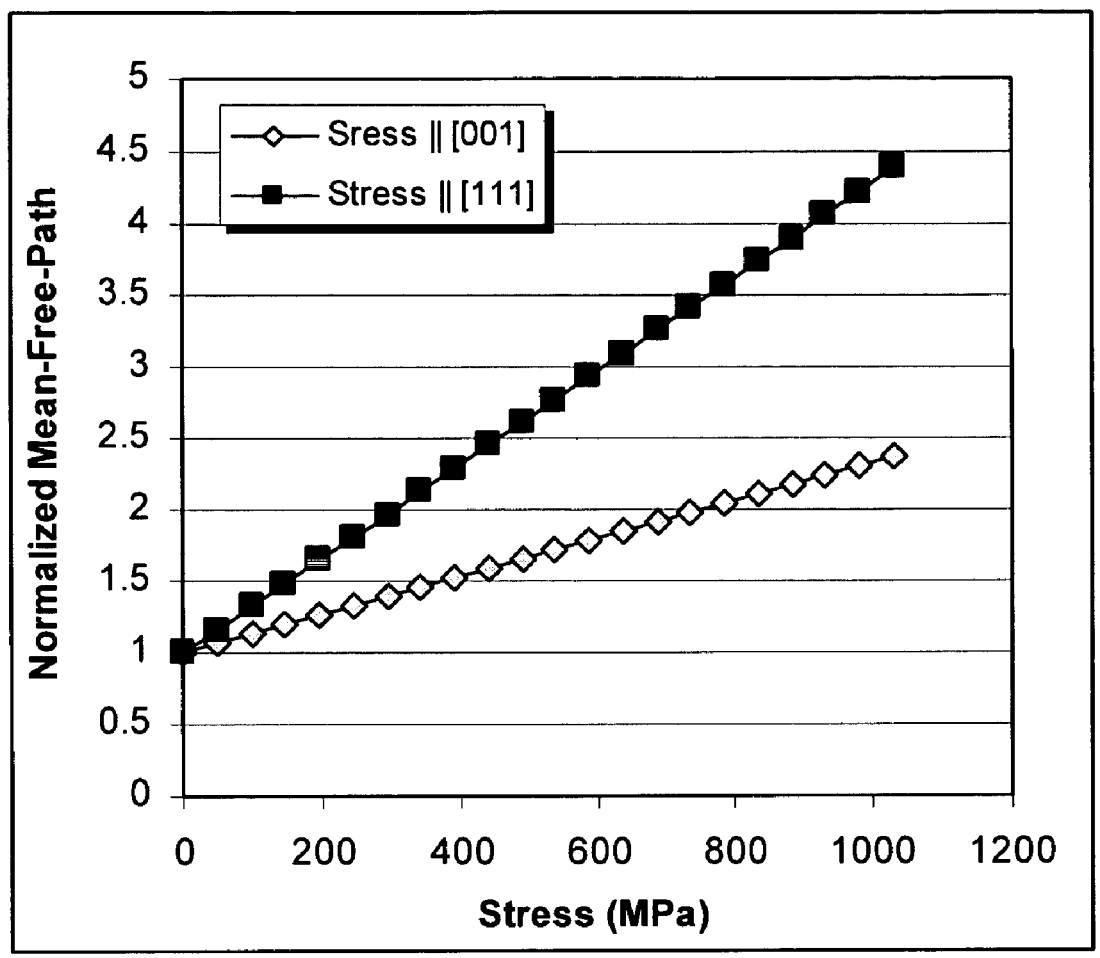
FIG. 7 is a plot illustrating normalized mean-free-path versus stress calculated for compressive strained silicon.

It is known that the effective mass of a lifted valence sub-band to first order can be shifted linearly with stress (see Hensel et al., "Cyclotron Resonance Experiments in Uniaxially Stressed Silicon: Valence Band Inverse Mass Parameters and Deformation Potentials, Phys. Rev. 129, pp. 1141–1062, 1963, and see Hinckley et al., "Hole Transport Theory in Pseudomorphic $Si_{1-x}Ge_x$ Alloys Grown on Si(001) Substrates," Phys. Rev. B, 41, pp. 2912–2926, 1990). Employing this relationship in together with the relationship between effective mass and mean-free-path, the present invention provides a method to alter the mean-free-path of ballistic charges. This method represents another embodiment of the piezo-ballistic-charge-injection mechanism, and is illustrated by adjusting the level of the stress with stress axis aligned to the direction of charge transport. FIG. 7 shows an example of the effect of stress on mean-free-path. The compressive stress on strained silicon is used as an example to illustrate the effect on HH. Referring to FIG. 7, the vertical axis represents a normalized mean-free-path, which is the ratio of the mean-free-path in strained silicon to that in unstrained silicon. As can be seen in the plot, the normalized mean-free-path increases linearly with increasing stress. Further, the enhancement effect on mean-free-path is more significant for stress axis parallel to [111] than to [001] of the crystallographic direction in silicon.

Figure 8:
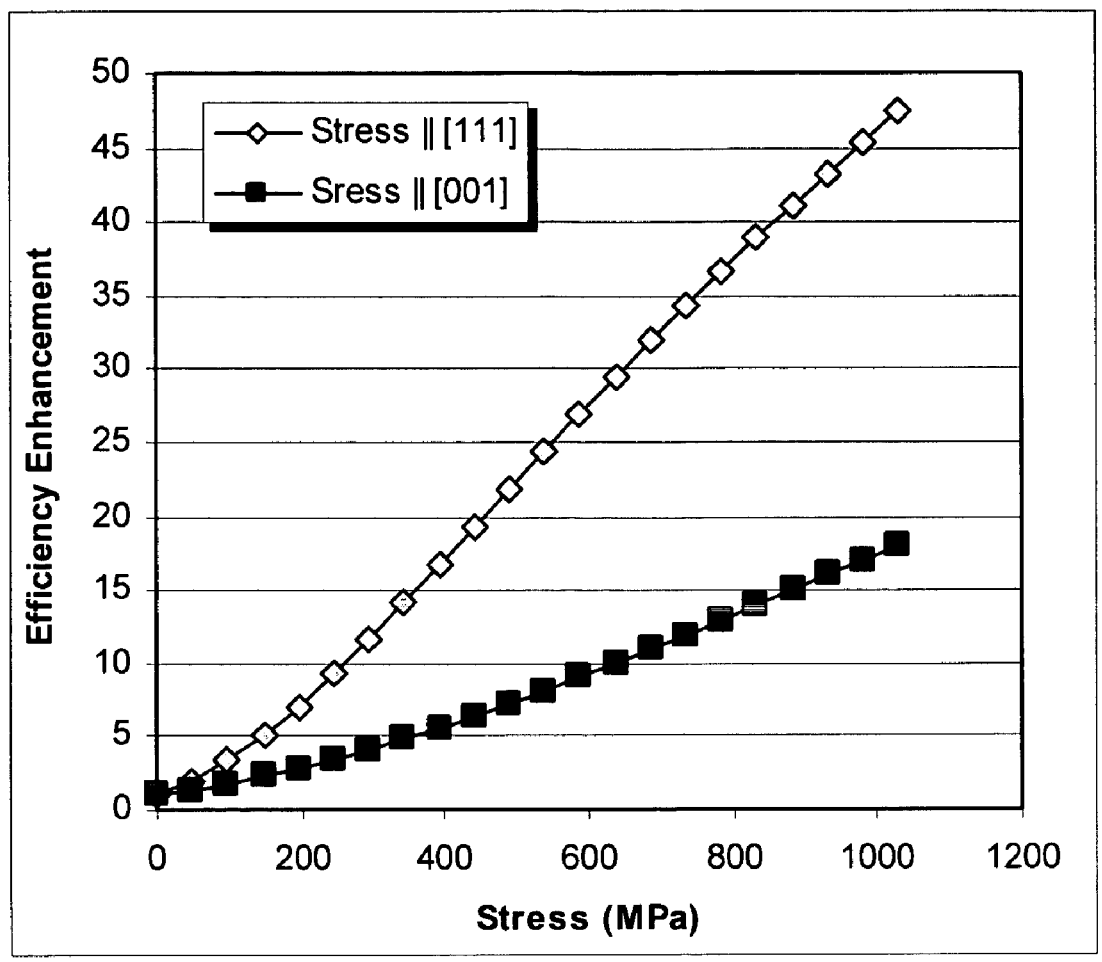
FIG. 8 is a plot illustrating efficiency enhancement versus stress in compressive strained silicon with stress axis as the plotting parameter.

FIG. 8 illustrates the efficiency enhancement versus the compressive stress for the piezo-ballistic hole injection. The efficiency enhancement is the ratio of the efficiency of strained silicon to the efficiency of unstrained silicon. As can be seen in the plot, the enhancement increases super-linearly for stress in a moderate mechanical stresses (e.g. in the range of about 200 mega Pascal ("MPa") or lower), and becomes approximately linearly proportional to the stress in a higher range (e.g. in the range of about 400 MPa or higher). Further, the enhancement effect is much more significant for stress axis parallel to [111] than to [001]. About twenty times and about fifty times higher on the efficiency are illustrated achievable for stress axis along [001] and [111] directions, respectively.

Figure 9:
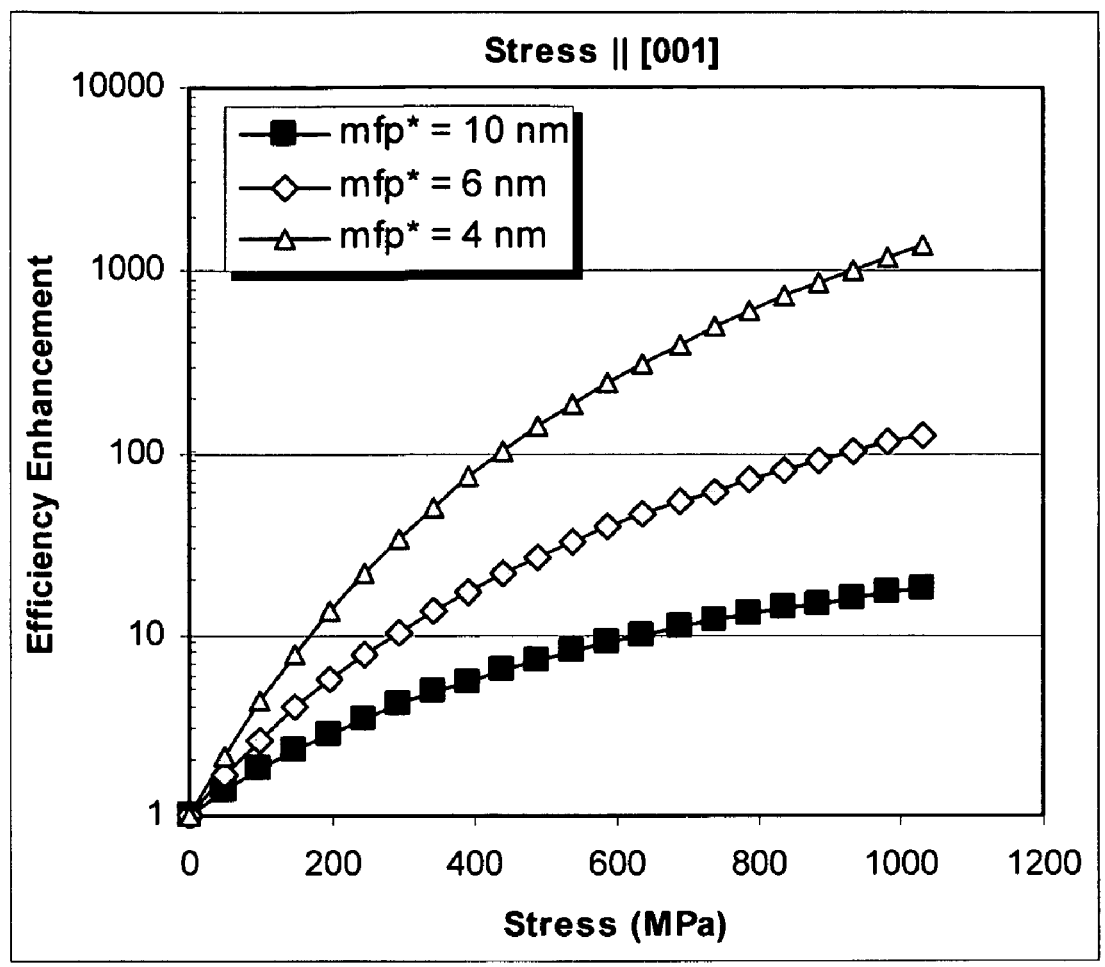
FIG. 9 is a plot illustrating efficiency enhancement versus stress in compressive strained silicon with mean-free-path of unstrained silicon as the plotting parameter.

FIG. 9 illustrates the sensitivity of the efficiency enhancement on the mean-free-path of unstrained silicon ("mfp*" hereinafter). It should be noted that the difference on the mfp* can be due to, for example, different levels of impurity concentration in semiconductor. The stress axis in parallel with crystallographic direction [001] is chosen in this illustration. Referring to FIG. 9, it is noted that the efficiency enhancement can be more significantly increased in a case having a shorter mfp* (e.g. 4 nm) than in a case having a longer mfp* (e.g. 10 nm) when stresses of both cases are held at a same level. For example, the efficiency enhancement can be 1000 times higher when a stress of 1000 MPa is applied to a silicon having mfp* of 4 nm, whereas the same stress can only achieve 10 times enhancement on efficiency in a silicon having mfp* of 10 nm. The effect demonstrated here is advantageous for scaled memory cell in advanced technologies, where a shorter mfp* is anticipated due to heavier impurity concentration in silicon. This is because a heavier impurity concentration in silicon can assist cell scaling into smaller geometry (for example, it can avoid unduly increase on resistance of regions where ballistic-charges traverse when scaling a memory cell).

It should also now be clear that ballistic hole injection with heavy-hole can exist and can reduce the erase efficiency when employing ballistic hole mechanism of prior art for erase operation of memory cells. It should also be clear that the transport mechanism of ballistic carriers (LH, HH, or electrons) can be altered by employing the piezo-ballistic-charge-injection mechanism. It should also be clear to those of ordinary skill in the art that the teachings of this disclosure can be applied to select different type of stress (e.g. tensile or compressive stress) and to change the axis of the stress through which the holes population and their mean-free-path are altered such that the injection efficiency in these cases can be enhanced.

Although the forgoing discussion has focused on injection of piezo-holes, it will be clear to those ordinary skills in the art that similar considerations, their effects and advantages apply to piezo-ballistic-electrons-injection. Further, although the forgoing discussion has focused on semiconductor (e.g. silicon), it will be clear to those ordinary skills in the art that similar considerations, their effects and advantages apply to other type of conductors (e.g. TiN, TaN, $Si_{1-x}Ge_x$ alloys etc.).

Figure 10:
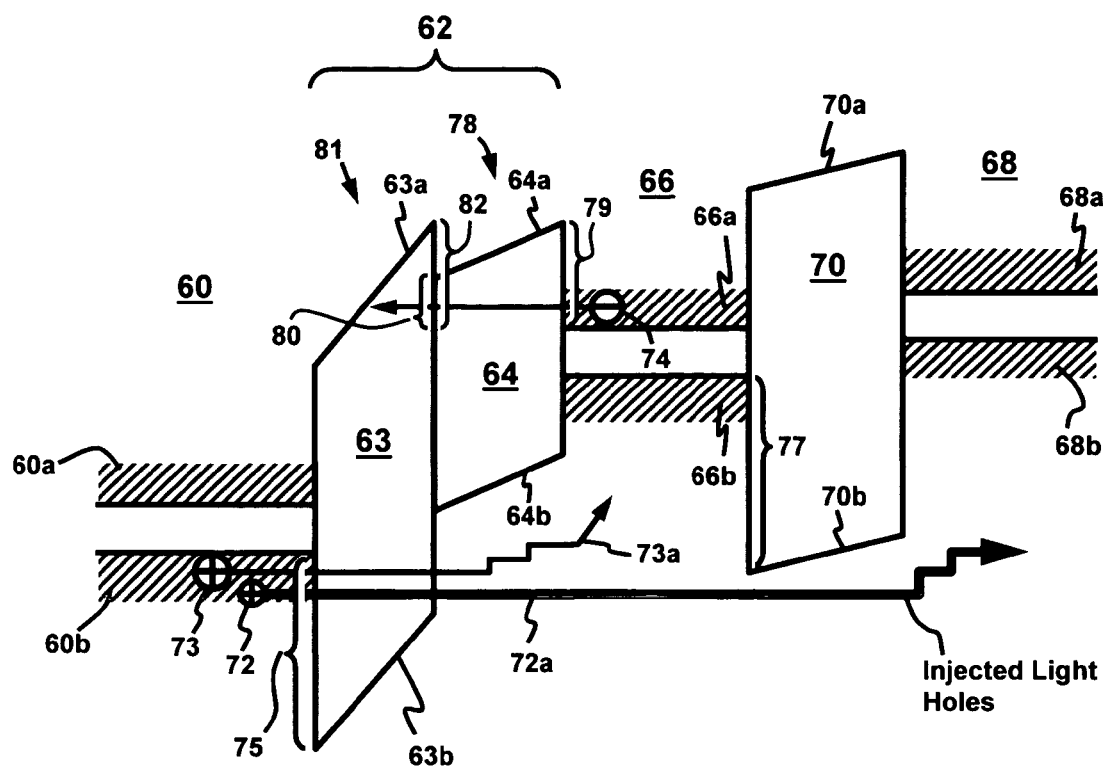
FIG. 10 is an energy band diagram in accordance with the present invention illustrating the piezo-ballistic-charge-injection mechanism for injecting piezo-ballistic-holes, and further illustrating the barrier heights and the trapezoidal barrier structure for blocking the piezo-electrons from backward injection.

FIG. 10 provides an energy band diagram to illustrate the piezo-ballistic-charge-injection mechanism for injecting piezo-ballistic-holes. Referring to FIG. 10, there is shown a strained tunneling-gate ("STG") 60, a charge injection filter 62 having a tunneling dielectric ("TD") 63 and a blocking dielectric ("BD") 64, a strained ballistic gate ("SBG") 66, a retention dielectric ("RD") 70, and a charge storage region ("CSR") 68. The energy band diagram is illustrated for STG 60 of a heavily doped p-type polycrystalline silicon ("p+ polysilicon") and SBG 66 of a heavily doped n-type polycrystalline silicon ("n+ polysilicon"). Also shown are conduction bands 60a, 63a, 64a, 66a, 70a, and 68a of STG 60, TD 63, BD 64, SBG 66, RD 70, and CSR 68, respectively. Likewise, there are shown valence bands 60b, 63b, 64b, 66b, 70b, and 68b of STG 60, TD 63, BD 64, SBG 66, RD 70, and CSR 68, respectively. The spacing between the conduction band and valence band of each region represents an energy gap of that region. In accordance with one preferred embodiment of the injection filter 62, the energy band gap of TD 63 is shown wider than that of the BD 64.

Referring to FIG. 10, the STG 60 is strained to have the majority population of holes be comprised of the LH 72. This can be done by, for example, applying a tensile stress to the STG 60 in accordance with one embodiment of the piezo-ballistic-charge-injection mechanism. Also shown in FIG. 10 is the HH 73, which can coexist with the LH 72 in STG 60 but at a much lower population (e.g. at about 5 to about 20 percent of the total hole population).

The STG 60 can be biased positively with respect to the SBG 66 to inject piezo-ballistic holes. The bias permits both types of holes 72 and 73 in STG 60 region to tunnel through a tunneling barrier having a valence band barrier height 75 between valence band 60b of STG 60 and valence band 63b of TD 63. While traversing SBG 66, the HH 73 can experience strong scattering and hence lose its energy to become HH 73a. Therefore, HH 73 cannot be injected into CSR 68. The LH 72, however, behaves very differently from the HH 73. Due to its longer mean-free-path, the LH 72 can traverse the SBG 66 with much less scattering than the HH 73.

Therefore, LH can preserve their energy at level higher than the valence band 66b of SBG 66 while traversing SBG 66. Some of these holes are able to reach the interface between SBG 66 and RD 70. When this positive bias is increased to a value such that those LH have energy higher than a hole barrier height 77, the LH 72 will be able to enter the valence band 70b of RD 70, making their way through RD 70 and be collected on CSR 68.

It is noted that while STG 60 is strained under the mechanism described herein, the SBG region 66 can also be strained under a condition in accordance with another embodiment of the piezo-ballistic-charge-injection mechanism such that the mean-free-path of holes traversing the SBG region 66 can be longer than mfp* of that region. For example, this can be done by applying a compressive stress to SBG 66 to take advantage on the effect shown in FIG. 7.

The charge injection filter 62 is disposed in between the STG 60 and the SBG 66 to permit transporting charge carriers of one polarity type (e.g. LH 72) from the STG 60 through the SBG 66 to the CSR 68 and to block transporting charge carriers of an opposite polarity type (e.g. electrons 74) from the SBG 66 to the STG 60. For the piezo-ballistic-hole-injection shown in FIG. 10, LH 72 and HH 73 are shown transporting in a forward direction, whereas under the same bias polarity, electrons 74 in SBG 66 are shown transporting in a backward direction. The energy band structure in FIG. 10 shows the backward-injected carriers (i.e. electrons 74) has to transport through more barriers than the forward-injected carriers (i.e. LH 72 and HH 73) do. A first electron barrier 78 blocking the backward injected electrons 74 comprises barrier heights 79 and 80 at an entrance side and at an exit side, respectively. Both barrier heights 79 and 80 are referenced to conduction band 64a of BD 64. A second electron barrier 81 having a barrier height 82 at its entrance side forms another barrier blocking electrons 74. The barrier height 82 is referenced to conduction band 63a of TD 63 at the interface between TD 63 and BD 64.

The charge injection filter provided herein is based on a barrier height engineering concept. One specific embodiment illustrated in the present invention comprises a p+ polysilicon for the STG 60, a silicon dioxide ("oxide") layer for the TD 63, a silicon nitride ("nitride") layer for the BD 64, and an n+ polysilicon for the SBG 66. The n+ polysilicon is considered for SBG 66 due to several considerations. A major consideration lies in the much higher solid solubility for n-type impurities (e.g. Arsenic, phosphorous etc) than that for p-type impurities (e.g. Boron). Impurity with a higher solid solubility is desirable as it usually can dope the silicon heavier to result in a lower sheet resistance, and is favorable for integrated circuits (IC) application. In the embodiment, polysilicon is employed as the material for STG 60 and SBG 66 due to its well proven yieldability, manufacturability, and compatibility with state of the art IC technology. An oxide with a thickness of about 7 nm to 10 nm is employed for the RD 70 due to the same reason. The oxide layer used for TD 63 can be with a thickness in the range of about 1.5 nm to 4 nm and preferably in the range of about 2 nm to 3.5 nm. The thickness of TD 63 layer is chosen in the range where charge-carriers (electrons, LH or HH) transporting across the layer are primarily through the direct tunneling mechanism. The thickness of BD 64 is chosen to block charge-carriers from tunneling through both BD 64 and TD 63 layers when a modest voltage in the range of about 1 V to about 2.5V is applied between STG 60 and SBG 66. The thickness of BD 64 is further chosen to permit one type of charge carriers (e.g. LH) transporting in the forward direction and to block the other type of charge carriers (e.g. electrons) from transporting in the backward direction when in a higher voltage range (3V or higher). As will be described in the barrier height engineering theory hereinafter, the selection on thickness of BD 64 is also determined by it dielectric constant. In general, the thickness of BD 64 can be thinner or thicker than that of TD 63 provided the tunneling stack of TD 63 and BD 64 can effectively meet the forgoing requirements. For example, in the specific embodiment, if an oxide with 3 nm (or 30 Å) is chosen for TD 63, then the minimum thickness for BD 64 can be about 2 nm (or 20 Å) or thicker. For the specific embodiment, the oxide for TD 63 can be a HTO (high temperature oxide) or a TEOS layer formed by using conventional deposition technique, or a thermal oxide by using thermal oxidation technique well-known in the art. The nitride for BD 64 can be a high quality nitride without charge trapping centers in its band gap. This high quality nitride can be formed in $NH_3$ (ammonia) ambient at a high temperature (e.g. 1050° C.) by using, for example, RTN (Rapid Thermal Nitridation) technique well-known in the art.

Barrier Height Engineering for Piezo-Ballistic-Holes-Injection

Figure 11:
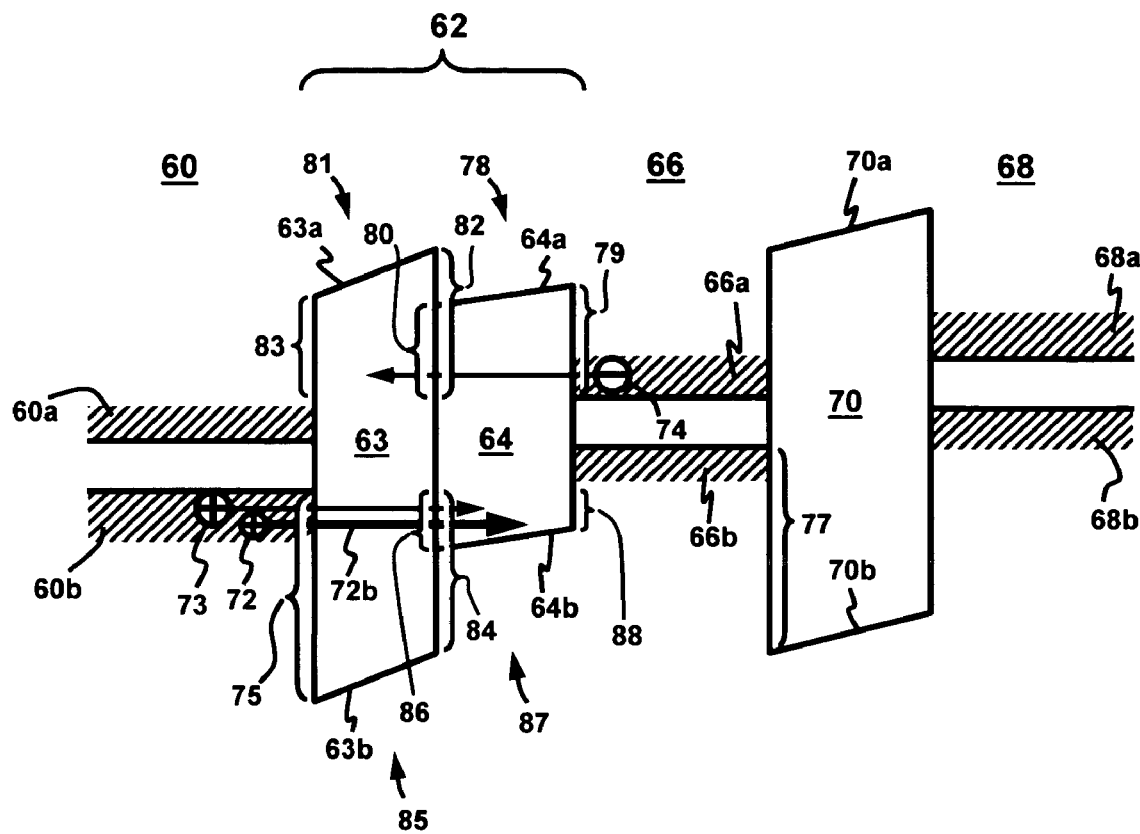
FIG. 11 is an energy band diagram in accordance with the present invention illustrating the barrier height engineering for piezo-ballistic-holes-injection mechanism.

A greater detail on the barrier height engineering concept is now provided. FIG. 11 illustrates an energy band diagram similar to that in FIG. 10 except with less band bending in the energy band of the injection filter 62 to reveal more details on barrier heights. In addition to those regions and their reference indicators shown in FIG. 10, in FIG. 11 there is shown a barrier height 83 of conduction band offset between 63a and 66a. The barrier height 83 is at the exit side of the second electron barrier 81 for blocking the backward injected electrons 74. Moreover, there is shown a barrier height 84 of valence band offset between 63b and 60b. The barrier heights 75 and 84 are at the entrance and the exit sides, respectively, of a first hole barrier 85 for blocking the forward injected holes 72 and 73. Further shown are a barrier height 86 of valence band offset between 64b and 60b at the entrance side of a second hole barrier 87, and a barrier height 88 of valence band offset between 64b and 60b at the exit side of the second hole barrier 87. The second hole barrier 87 also has the effect on blocking the forward injected holes 72 and 73. The STG 60 is strained to have the hole population in that region be primarily of the LH 72. Therefore, the LH 72 is anticipated having a heavier injection flow. An arrow 72b of a wider line width is depicted in FIG. 11 to illustrate the heavier flow for the LH carrier as a result of this effect.

It is now clear that with the energy band structure in accordance with the present invention, there are two hole barriers 85 and 87 relevant to the forward injected piezo-ballistic-charges of LH 72 and HH 73. Similarly, there are two electron barriers 78 and 81 relevant to the backward injected electrons 74 in SBG 66. To permit an efficient piezo-ballistic-charge-injection, it is desirable that the barriers heights of the first and the second hole barriers 85 and 87 can be electrically altered to assist the forward injection of piezo-ballistic-charges. In a contrast, to block the electrons 74 in SBG 66 from backward injection into STG 60, it is desired to keep the barrier heights 79 and 80 of the first electron barrier 78, and the barrier heights 82 and 83 of the second electron barrier 81 high enough through out the voltage range for the piezo-ballistic charge injection.

The barrier height 86 ($\Delta\Phi_{VH\_TB}$) of the second hole barrier 87 can be expressed to a first order by following formula:

$$\Delta\Phi_{VH\_TB} = \Delta\Phi_{VB\_TB} - |V'_{TD}| \quad (1)$$

where $\Delta\Phi_{VB\_TB}$ is the valence band offset between STG 60 and BD 64 under flat-band condition, which represents the condition when electric fields in TD 63 and BD 64 are zero.

$V'_{TD}$ is the voltage drop across TD 63 during piezo-ballistic-hole-injection, and is expressed as $$V'_{TD} = (V_a - V_{fb})/[1 + (\in_{TD}*T_{BD})/(\in_{BD}*T_{TD})].$$

$V_a$ is the applied voltage across STG 60 and SBG 66;

$V_{fb}$ is the flat-band voltage;

$\in_{TD}$ and $\in_{BD}$ is the dielectric constant for TD 63 and BD 64, respectively; and $T_{TD}$ and $T_{BD}$ is the thickness for TD 63 and BD 64, respectively.

Similarly, the barrier height 82 ($\Delta\Phi_{CE\_GT}$) of the second barrier 81 for blocking electrons backward injection can be expressed as following formula:

$$\Delta\Phi_{CE\_GT} = \Delta\Phi_{CB\_GT} - |V'_{BD}| \quad (2)$$

where $\Delta\Phi_{CB\_GT}$ is the conduction band offset between SBG 66 and TD 63 under flat-band condition, $V'_{BD}$ is the voltage drop across BD 64 during piezo-ballistic-hole-injection, and is expressed as $$V'_{BD} = (V_a - V_{fb})/[1 + (\in_{BD}*T_{TD})/(\in_{TD}*T_{BD})].$$

Based on the theory, a concept on engineering barrier height for selectively filtering charge carriers is provided herein. From the formula (1) and (2) provided herein, it is clear that barrier height 86 ($\Delta\Phi_{VH\_TB}$) and barrier height 82 ($\Delta\Phi_{CE\_GT}$) have different dependence on $V_a$. The voltage dependence permits the two barrier heights 86 and 82 be electrically altered by applying a voltage across the dielectrics. Furthermore, the barrier height dependence on voltage is asymmetrical and is primarily determined by the combined effects of dielectric constant and dielectric thickness (i.e. the "$\in T$ effect"). In other words, by proper selecting a set of "$\in T$" for TD 63 and for BD 64, one barrier height can be electrically altered in a different degree than the other. In an extreme case, at an applied bias, one barrier height can be altered to become disappear while the other one stays in similar range as one in the flat-band condition.

Figure 12:
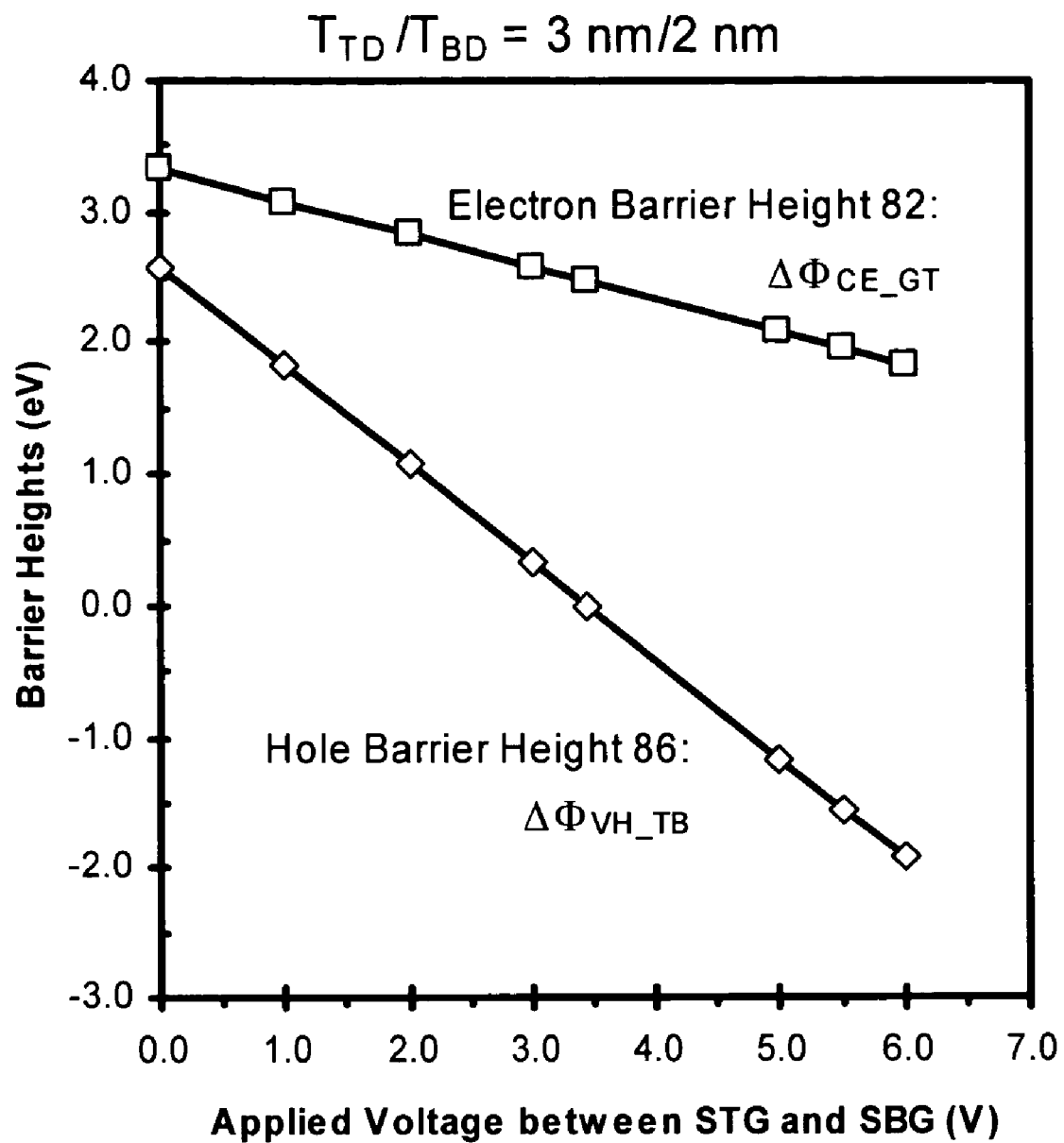
FIG. 12 illustrates the effect of the barrier height engineering in accordance with the present invention on barrier heights for piezo-ballistic-holes-injection, wherein the barrier height of forward injected holes and the barrier height of backward injected electrons can be altered in different degree by voltage between STG and SBG.

This effect is provided in the present invention and is used for charge injection, charge blocking, and charge filtering. The effect can become clearer with referencing to FIG. 12. FIG. 12 illustrates an example on the barrier height engineering concept using the theory described herein. As is apparent, the barrier height 86 ($\Delta\Phi_{VH\_TB}$) for holes 72 and 73 in STG 60 decreases at a faster rate than the barrier height 82 ($\Delta\Phi_{CE\_GT}$) for electrons 74 in SBG 66. In fact, the barrier height 86 disappears (i.e. equals zero) at an applied voltage of about +3.5 V between STG 60 and SBG 66 while there is still a barrier height of about 2.5 eV remained for the barrier height 82 ($\Delta\Phi_{CE\_GT}$). Thus, when the applied voltage is altered beyond this point, both LH 72 and HH 73 can tunnel through TD 63 without being blocked by BD 64 layer (as illustrated in FIG. 10). This effect permits LH and HH (72 and 73) be injected along the forward direction. Turning back to FIG. 12, the much weaker dependence of the barrier height 82 ($\Delta\Phi_{CE\_GT}$) on the applied voltage maintains the barrier for blocking electrons 74 in this voltage range and hence prevents electrons 74 from backward injected into STG 60 (as illustrated in FIG. 10). The barrier height engineering concept here provides a method through which an electrically alterable filter can be constructed to filter out the unwanted carriers (e.g. the backward injected electrons 74) without affecting the transport of the wanted carriers (e.g. the forward injected piezo-ballistic-holes 72 and/or 73).

It is desirable to maintain a trapezoidal-shaped band structure for the first electron barrier 78 in the BD 64 region within voltage range used for injecting piezo-ballistic-holes. This can be achieved by keeping the voltage across BD 64 ($V'_{BD}$) be less than the barrier height 79 ($\Delta\Phi_{CE\_GB}$) of the first electron barrier 78. This barrier structure can be clearer captured by referring back to FIG. 10, wherein barrier heights 79 and 80 form a trapezoidal shape of structure in barrier 78 with barrier heights 79 and 80 at its entrance side and at its exit side, respectively. A trapezoidal barrier is advantageous because it provides a stronger effect on blocking electrons from backward tunneling than that can be provided by a triangular shaped barrier. The barrier height 79 of the trapezoidal barrier equals the conduction band offset between SBG 66 and BD 64. The barrier height 80 of the trapezoidal barrier to first order equals $\Delta\Phi_{CE\_GB} - V'_{BD}$; where $\Delta\Phi_{CE\_GB}$ is the conduction band offset between SBG 66 and BD 64. In the specific embodiment, for the applied voltage in the range of about +5 V to about +6 V, the barrier height 80 is about 1.1 eV to about 0.9 eV. Thus, the trapezoidal barrier is maintained through out the injection process of piezo-ballistic-holes. It is clear that the barrier height 80 can be made higher by lowering V'$_{BD}$ through optimizing dielectric constant and thickness of TD 63 and BD 64, as taught in the "∈T effect" and the foregoing theory.

The energy band in FIG. 10 is illustrated with piezo-ballistic-holes 72 and 73 injected through TD 63, through BD 64, and into SBG 66 region. The energy band is illustrated to reflect the barrier engineering concept with emphasis on the barriers that are used to block parasitic electrons 74 from backward injection. Due to the larger dielectric constant illustrated for BD 64 region, a smaller band bending and hence a smaller voltage across BD 64 is illustrated. The voltage across TD 63 is illustrated larger than that across BD 64 due to its smaller dielectric constant. A larger dielectric constant for BD 64 region is desirable for following considerations. First, it permits the energy band of BD 64 region be more like the original "rectangular shape" structure in the flat-band condition. This provides a more effective first electron barrier 78 in BD 64 for blocking unwanted charge carriers (e.g. the parasitic electrons 74) from backward injection. Furthermore, the larger dielectric constant of BD 64 permits a larger portion of the applied voltage appearing across TD 63 region. It thus preserves the effects on tunneling the wanted charges (e.g. LH 72) while the applied voltage is maintained at the same level. Some of these holes will be able to traverse the SBG 66 region through piezo-ballistic-charges-injection mechanism to reach the interface between SBG 66 and RD 70, and subsequently be collected on CSR 68 region.

For the specific embodiment, voltage of STG 60 is chosen in the range of about +5.0 V to about +6.0 V relative to voltage of SBG 66 for the piezo-ballistic-holes-injection.

The forgoing illustration on the piezo-ballistic-charge-injection and the barrier height engineering is made on holes. Similar illustration can be made for injecting piezo-electrons, and is described next for completeness.

Barrier Height Engineering for Piezo-Ballistic-Electrons-Injection

Figure 1:
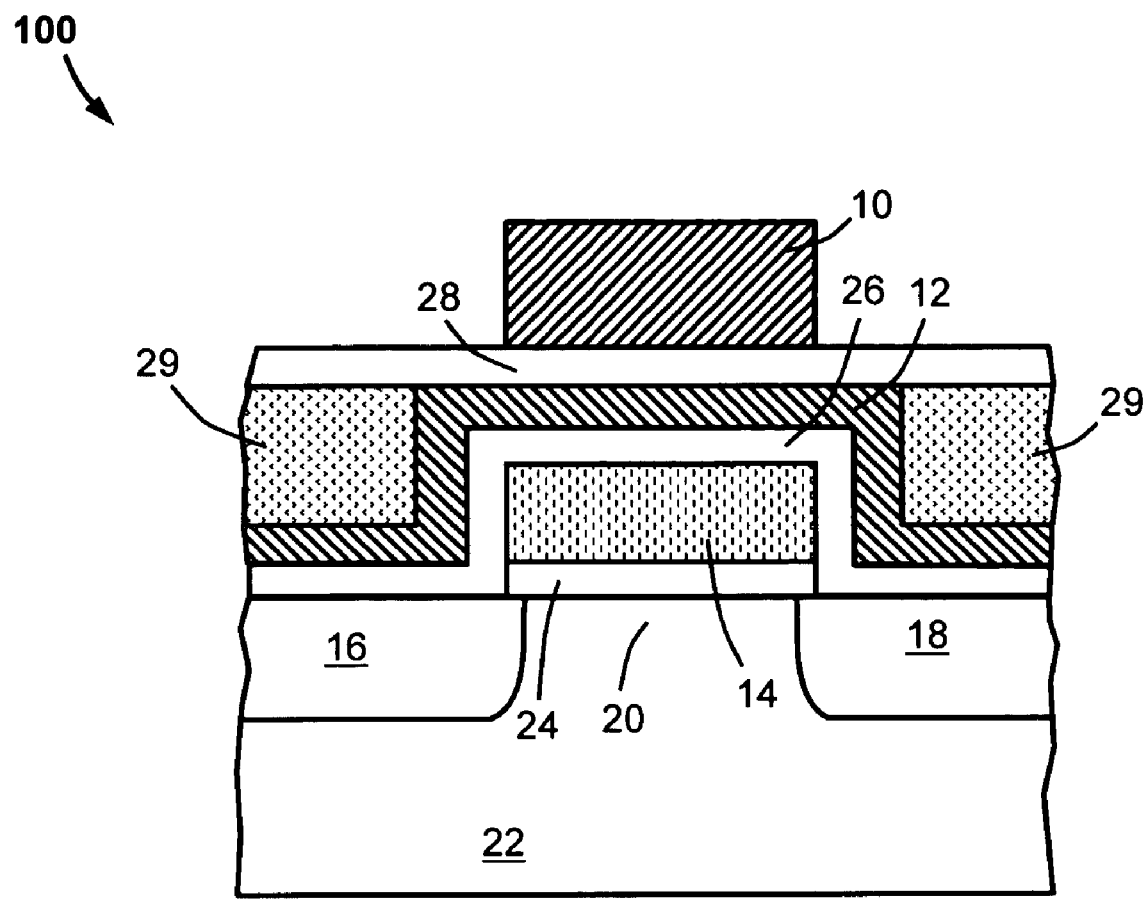
Figure 2A:
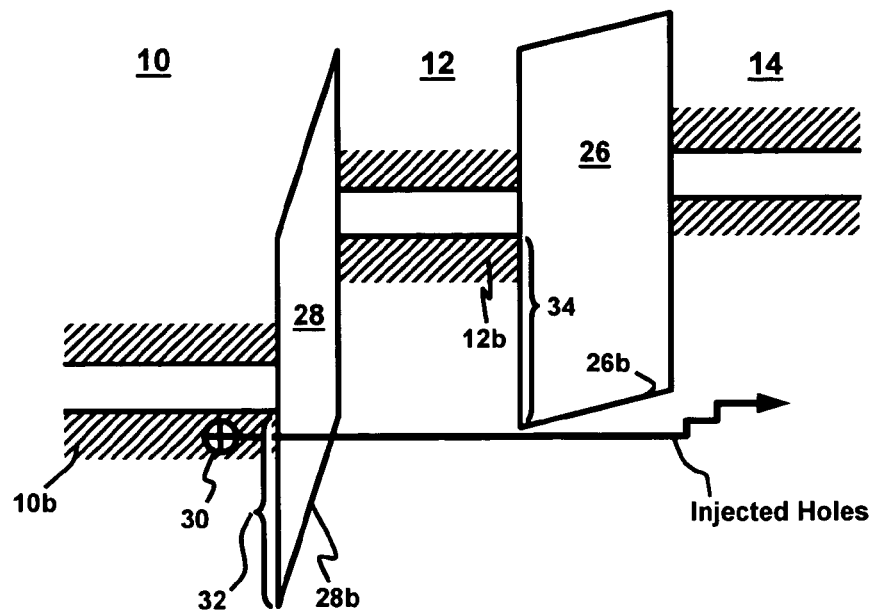
FIG. 2A (prior art) is the energy band diagram of the structure of FIG. 1, illustrating the known energy band structure and the known hole injection method of the prior art.
Figure 2B:
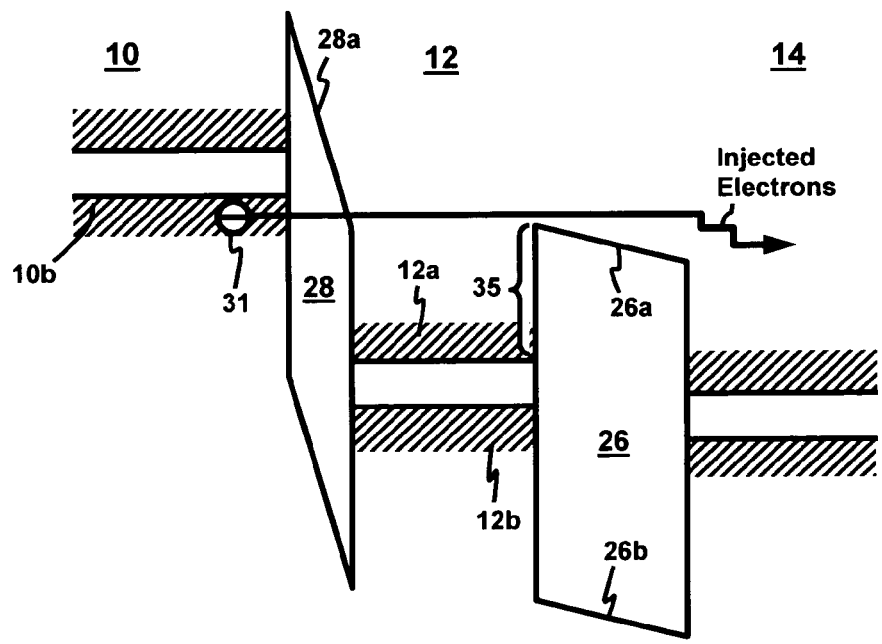
FIG. 2B (prior art) is the energy band diagram of the structure of FIG. 1, illustrating the known energy band structure and the known electron injection method of the prior art.
Figure 13:
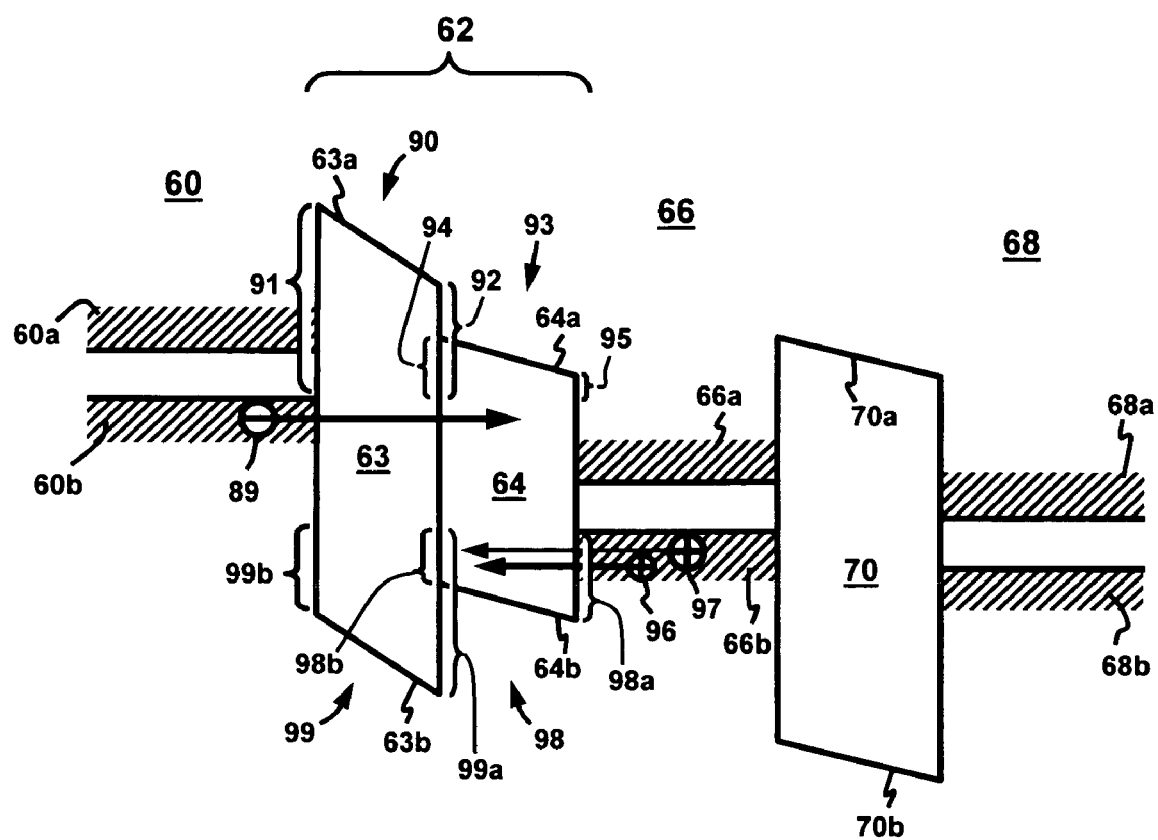
FIG. 13 is an energy band diagram in accordance with the present invention illustrating the barrier height engineering for piezo-ballistic-electrons-injection mechanism.

Turning now to FIG. 13, there is shown an energy band diagram with piezo-electrons 89 in the valence band 60b of STG 60, and with piezo LH 96 and HH 97 in the valence band 66b of SBG 66. The diagram is similar to the diagram in FIG. 11 except STG 60 is negatively biased with respect to the SBG 66 by about 1 V to about 2 V. The potential of CSR 68 is shown positive with respect to the SBG 66 potential by about 0.75 V. Under this bias polarity between STG 60 and SBG 66, electrons 89 are shown transporting in a forward direction, whereas under the same bias polarity, LH 96 and HH 97 SBG 66 are shown transporting in a backward direction. The energy band diagram is illustrated for a p+ polysilicon STG 60 and an n+ polysilicon SBG 66. The LH 96 and HH 97 are unlikely to exist in an n+ SBG 66 in this bias condition. However, in a worse case situation, they can exist in SBG 66 in the bias range (e.g. 4 V) used for piezo-electron injection, where an inversion layer of holes can be formed. Here, LH 96 and HH 97 are shown for illustrating the barriers associated with it to consider this effect. It is worth noting that in prior art the n+ polysilicon cannot be employed for the ballistic gate 12 in FIG. 2 due to its lower work function than that of a p+ polysilicon. The n+ polysilicon is considered for SBG 66 due to several considerations. A major consideration lies in the much higher solid solubility for n-type impurities (e.g. Arsenic, phosphorous etc) than that for p-type impurities (e.g. Boron). Impurity with a higher solid solubility is desirable as it usually can dope the silicon heavier to result in a lower sheet resistance, and is favorable for integrated circuits (IC) application.

In FIG. 13, there are two barriers relevant to the tunneling injection of piezo-electrons 89 from valence band 60b of STG 60. The first one is illustrated as a barrier 90 having barrier heights 91 and 92. The barrier height 91 equals the offset between valence band 60b and conduction band 63a at the entrance side of the barrier 90. The barrier height 92 equals the offset between valence band 60b and conduction band 63a at the exit side of the barrier 90. The second one is illustrated as a barrier 93 having barrier heights 94 and 95. The barrier height 94 equals the offset between valence band 60b and conduction band 64a at the entrance side of the barrier 93. The barrier height 95 equals the offset between valence band 60b and conduction band 64a at the exit side of the barrier 93. Similarly, there are two barriers relevant to the backward injected LH 96 and HH 97 in valence band 66b of SBG 66. Referring back to FIG. 13, the first one is illustrated as a barrier 98 having barrier heights 98a and 98b. The barrier heights 98a and 98b equal the offset between valence band 66b and valence band 64b at the entrance side and the exit side of the barrier 98, respectively. The second barrier is illustrated as a barrier 99 having barrier heights 99a and 99b. The barrier heights 99a and 99b equal the offset between valence band 66b and valence band 63b at the entrance side and the exit side of the barrier 99, respectively.

Turning back to FIG. 13, the backward injected LH 96 and HH 97 can result in undesired problems. For example, it can trigger impact-ionization in STG 60 when they got backward injected into that region due to their higher energy than the valence band 60b. Further, these holes do not contribute to memory operation when employing the piezo-ballistic-electron-injection for a program operation of a memory. Therefore, it can waste electrical current and hence power. It is thus desirable to block LH 96 and HH 97 from backward injection into STG 60. The holes backward injection problem can be overcome in accordance with an aspect of the present invention by keeping the barrier heights of barriers 98 and 99 high enough through out the bias range in piezo-ballistic-electron injection.

Referring to FIG. 13, the barrier height 94 ($\Delta\Phi_{VE\_TB}$) of the second barrier 93 for injecting piezo-electrons 89 can be expressed to a first order by following formula:

$$\Delta\Phi_{VE\_TB} = \Delta\Phi_{CB\_TB} + Eg - |V_{TD}| \quad (3)$$

where $\Delta\Phi_{CB\_TB}$ is the conduction band offset between STG 60 and BD 64 when under the flat-band condition, $V_{TD}$ is the voltage drop across TD during piezo-ballistic-electron-injection, and is expressed as $$V_{TD} = (V_a - V_{fb})/[1 + (\in_{TD} * T_{BD})/(\in_{BD} * T_{TD})];$$

$V_a$ is the applied voltage across STG 60 and SBG 66;

$V_{fb}$ is the flat-band voltage;

Similarly, the barrier height 99a ($\Delta\Phi_{VH\_GT}$) of the second barrier 99 for holes backward tunneling can be expressed as following formula:

$$\Delta\Phi_{VH\_GT} = \Delta\Phi_{VB\_GT} - |V_{BD}| \quad (4)$$

where $\Delta\Phi_{VB\_GT}$ is the valence band offset between SBG 66 and TD 63 under flat-band condition, $V_{BD}$ is the voltage drop across BD 64 during piezo-ballistic-electron-injection, and is expressed as $$V_{BD}=(V_a-V_{fb})/[1+(\in_{BD}*T_{TD})/(\in_{TD}*T_{BD})].$$

From the foregoing formula (3) and (4), it is clear that barrier height 94 ($\Delta\Phi_{VE\_TB}$) and barrier height 99a ($\Delta\Phi_{VH\_GT}$) have different dependence on $V_a$. The barrier height dependence on voltage is asymmetrical and is primarily determined by the combined effects of dielectric constant and dielectric thickness (i.e. the "∈T effect"). This effect is similar to that provided by barrier heights 86 and 82 in the barrier height engineering for piezo-ballistic-hole-injection. It is therefore clear that the barriers for piezo-ballistic-electron-injection can be electrically altered in a similar way as that provided for piezo-ballistic-hole-injection.

Figure 14:
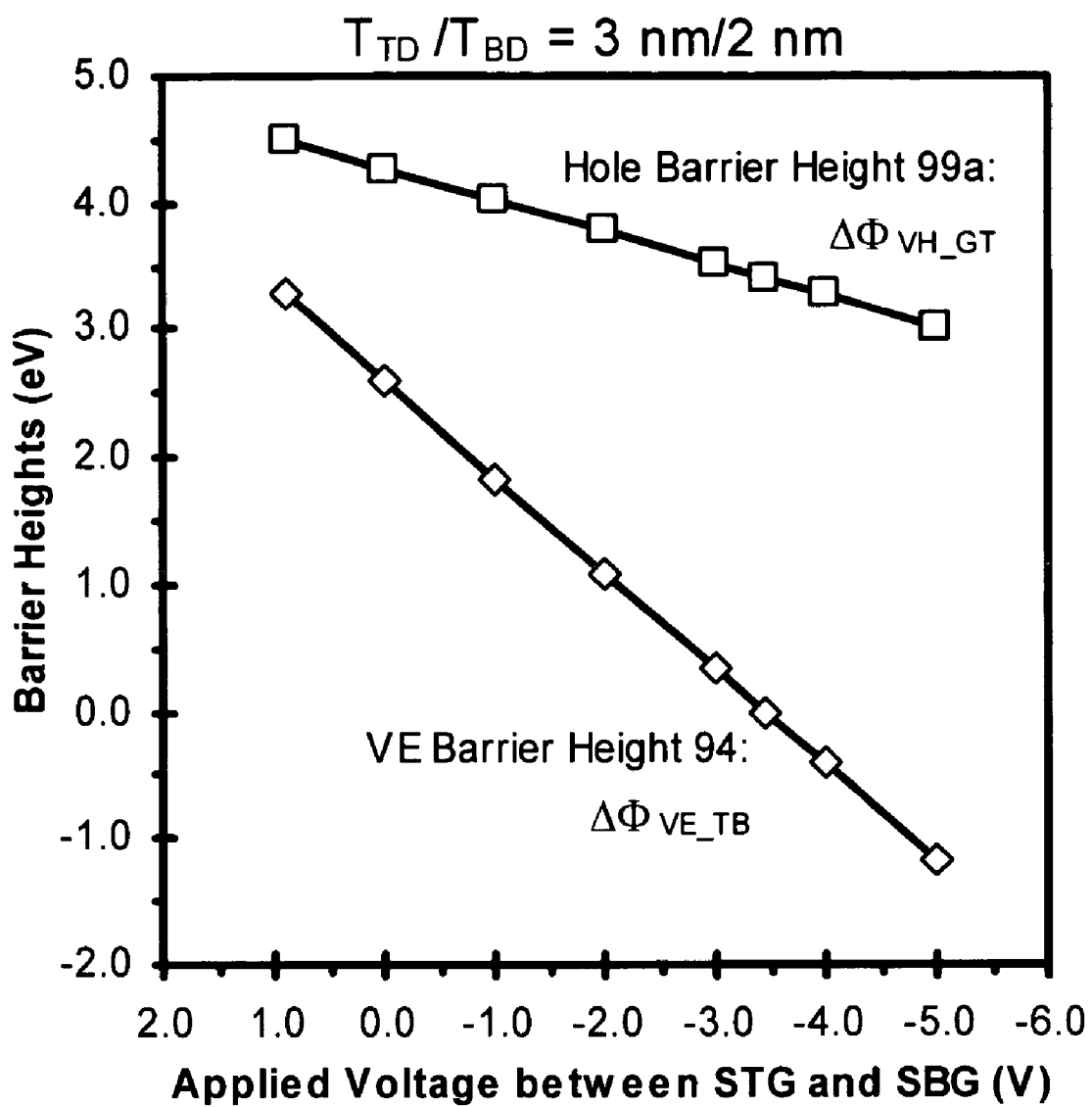
FIG. 14 illustrates the effect of the barrier height engineering in accordance with the present invention on barrier heights for piezo-ballistic-electrons-injection, wherein the barrier height of the forward injected electrons and the barrier height of the backward injected holes can be altered in different degree by voltage between STG and SBG.
Figure 15:
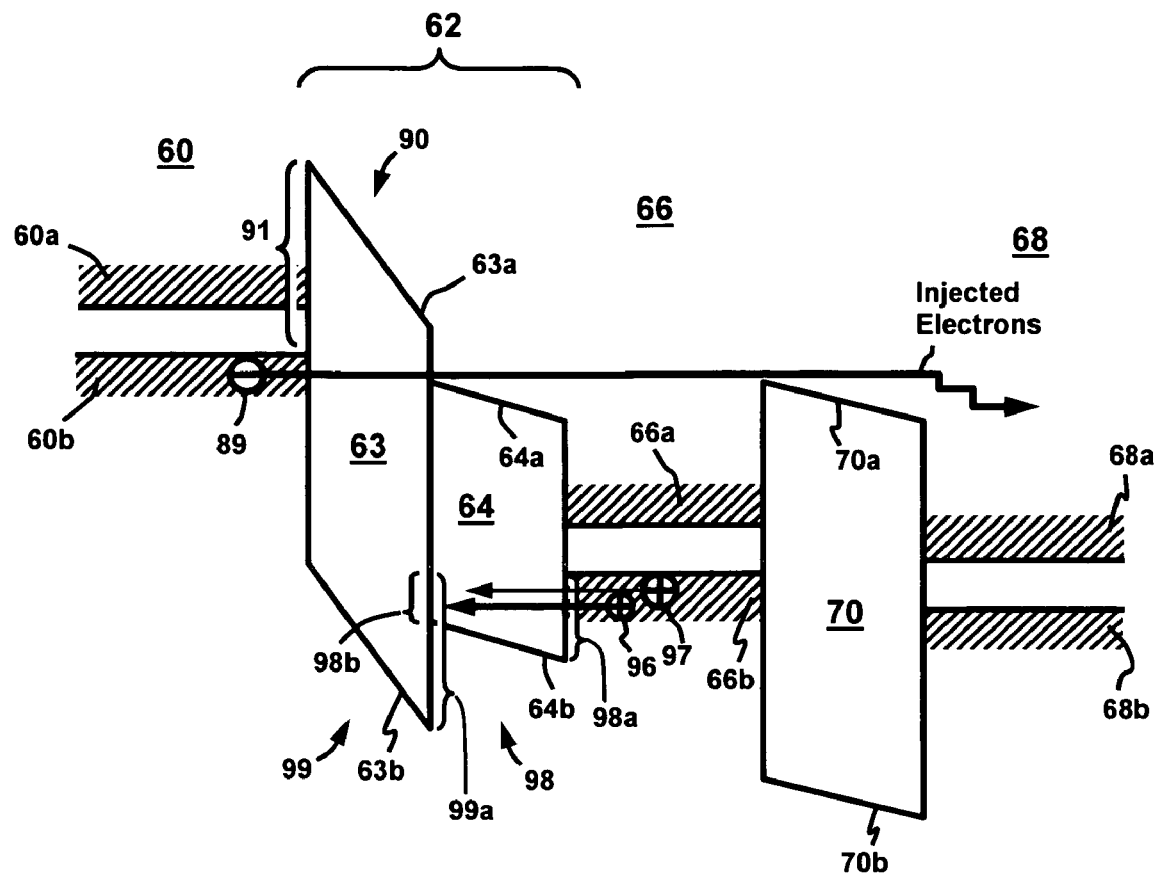
FIG. 15 is an energy band diagram in accordance with the present invention illustrating the piezo-ballistic-charge-injection mechanism for injecting piezo-ballistic-electrons, and further illustrating the barrier heights and the trapezoidal barrier structure for blocking the piezo-LH and HH carriers from backward injection.

FIG. 14 illustrates an example on the barrier height engineering concept using the theory described herein for piezo-ballistic-electron-injection. As is apparent, when decreasing the applied voltage between STG 60 and SBG 66, the barrier height 94 ($\Delta\Phi_{VE\_TB}$) for electrons at STG 60 decreases faster than the barrier height 99a ($\Delta\Phi_{VH\_GT}$) for LH 96 and HH 97 in SBG 66. The barrier height 94 ($\Delta\Phi_{VE\_TB}$) in fact disappears (i.e. equals zero) at an applied voltage of about −3.5V while there is still a sufficient barrier height of about 3.4 eV remained for the barrier height 99a ($\Delta\Phi_{VH\_GT}$). FIG. 15 illustrates the energy band diagram when the applied voltage is decreased beyond this voltage level. As shown, the second barrier 93 for piezo-electrons 89 shown in FIG. 13 disappears in FIG. 15 as the applied voltage is decreased beyond this level. Therefore, piezo-electrons 89 in STG 60 can tunnel through TD 63 in direct tunneling without being blocked by BD 64 layer. This permit the piezo-electrons be injected in the forward direction. The much weaker dependence of barrier height 99a ($\Delta\Phi_{VH\_GT}$) on the applied voltage maintains the barrier 99 for blocking holes in this voltage range and hence can prevent holes from backward injection. Therefore, the barriers engineering concept here actually provides a method through which an electrically alterable filter is constructed for piezo-ballistic-electron-injection. The filter provides unique feature filtering out the unwanted carriers (i.e. the backward injected LH 96 and HH 97) without affecting the transport of the wanted carriers (i.e. the forward injected electrons 89).

Figure 16:
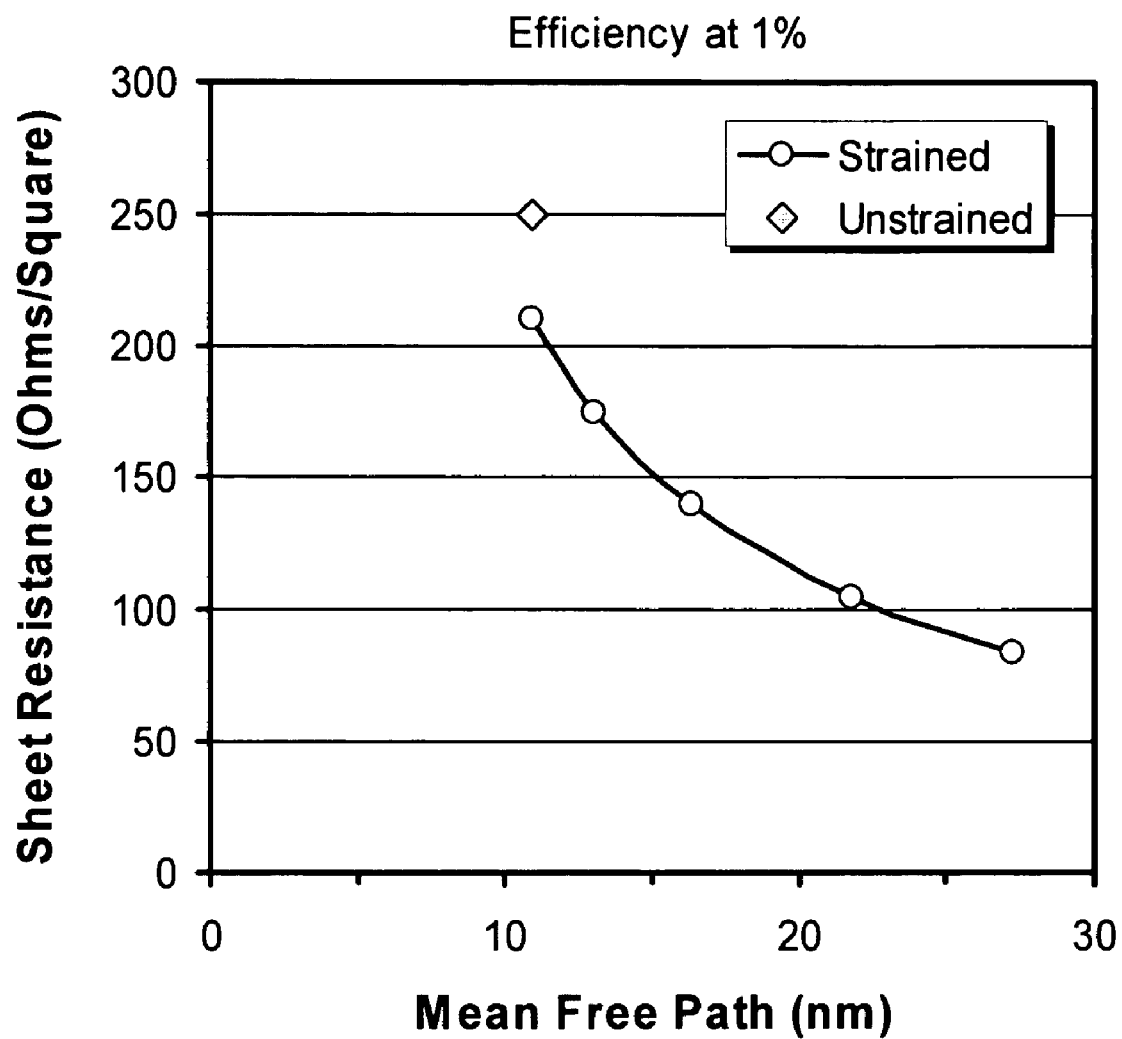
FIG. 16 is a plot illustrating the dependence of sheet resistance of SBG on mean-free-path for piezo-electrons injection efficiency at 1 percent.

FIG. 15 further illustrates the piezo-ballistic-electron-injection mechanism. Proper mechanical stress is provided in STG 60 and/or SBG 66 to create strain therein and hence to generate piezo-effect on electrons 89 on their populations and their transport properties. With a sufficient voltage (e.g. about −4 V) across gates 60 and 66, the piezo-electrons 89 can traverse SBG 66, transport through RD 70, and finally get injected onto CSR 68. For the specific embodiment, voltage of STG 60 is chosen in the range of about −3.5 V to about −4.0 V relative to voltage of SBG 66. Using the piezo-ballistic-electron-injection mechanism, the electrons 89 can be injected onto CSR 68 at higher efficiency than that achievable by injecting normal electrons of unstrained silicon. This is due to the lower scattering rate and longer mean-free-path of the piezo-electrons, as described earlier (see, e.g. FIG. 5 and its description). This effect provides means in accordance with one aspect of the present invention to fix the problems on large resistance in prior art. FIG. 16 shows the dependence of sheet resistance of SBG 66 on mean-free-path when the injection efficiency is maintained at a fixed value of 1 percent. By employing the piezo-ballistic-electron-injection mechanism, the sheet resistance can be reduced, for example, from 250 Ohms/square for an unstrained case to about 220 Ohms/square for a strained case of similar mean-free-path. Employing the mechanism, further reduction on sheet resistance can be achieved by increasing the mean-free-path from 10 nm to about 28 nm without compromising injection efficiency.

Figure 17:
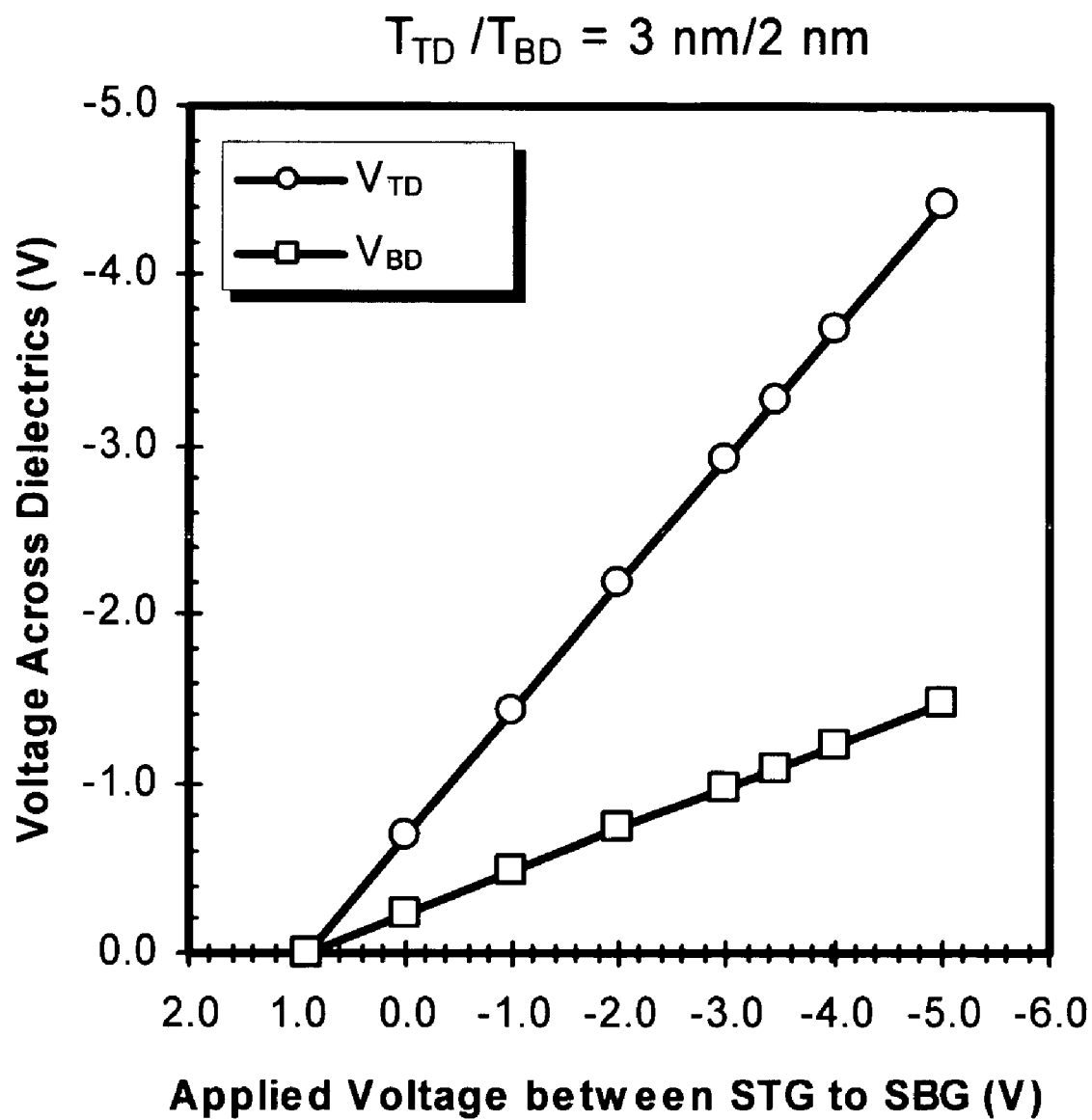
FIG. 17 is a plot illustrating the effect of applied voltage between STG and SBG on voltages across tunneling and blocking dielectrics in energy band structure in accordance with the present invention.

FIG. 17 shows the effect of voltages across each dielectric and their dependence on the applied voltage between gates STG 60 and SBG 66. The materials in the specific embodiment here are assumed for TD 63 and BD 64. As is apparent, $V_{TD}$ is much larger than $V_{BD}$ for a same applied voltage between gates 60 and 66. In other words, a much larger voltage is seen across the material having a lower ∈T effect. Note that ∈T effect can be dominated by the dielectric constant provided the thicknesses of both dielectrics are in similar range. FIG. 17 further shows that the injection filter provides a voltage divider function, where the applied voltage is divided and shared by TD 63 and BD 64 regions. The effect here can prevent the problem on dielectric breakdown and hence provides advantages over the prior art. For example, for an applied voltage of about −4V, the total voltage across the prior art dielectric 28 can be about −4.9V, which can be close to the onset of dielectric breakdown. In a contrast, due to the effect on the band structure of the present invention, this applied voltage results in about −3.7V across TD 63 and about −1.2V across BD 64. Thus, the voltage divider function of the filter provides more margins for preventing the dielectric breakdown problem. Although this discussion has focused on injection of piezo-electrons, it will be clear to those ordinary skills in the art that similar considerations, their effects and advantages apply to piezo-ballistic-holes-injection.

It is desirable to keep the voltage across BD ($V_{BD}$) be less than the barrier height 98a in voltage range normally used for piezo-ballistic-electrons injection. Keeping $V_{BD}$ lower than barrier height 98a is desirable because it can maintain a trapezoidal-shaped band structure for holes barrier 98 in 13D 64 to block the backward injected LH and HH more effectively. This barrier structure can become clear by referring to FIG. 15, wherein barrier height 98a forms one side of the barrier 98 (the entrance side for holes 96 and 97) and barrier height 98b forms the other side of the barrier (the exit side for holes 96 and 97). The barrier height 98b at the exit side of the trapezoidal barrier 98 to first order equals $\Delta\Phi_{VB\_GB}-V_{BD}$, where $\Delta\Phi_{VB\_GB}$ is the barrier height 98a. In the specific embodiment, for an applied voltage of −4V between STG 60 and SBG 66, the barrier height 98b is about 0.7 eV, and hence the trapezoidal structure for barrier 98 is maintained. It is clear that barrier height 98b can be made higher by lowering $V_{BD}$ through optimizing dielectric constant and thickness of TD 63 and BD 64, as taught in the foregoing theory.

One of the unique portions of the present invention lies in the effects provided by the barrier height engineering concept and its implementation in the injection filter. The effects remove requirement on a large work function for the SBG 66 material in prior art. Furthermore, the injection filter provides voltage divider function, permitting voltage applied between STG 60 and SBG 66 be divided and shared by BD 64 and TD 63 without compromising piezo-ballistic-charge-injection. The voltage divider function can resolve the dielectric breakdown problem in prior art. Moreover, impact-ionization problem in STG 60, which can be triggered by the backward injected charge carriers, can be effectively resolved while suppressing these carriers from backward injection by employing the injection filter.

It is thus clear the energy band structure of the present invention can effectively block parasitic charge carriers from backward injection during the piezo-ballistic-electrons-injection or the piezo-ballistic-holes-injection. Thus, the charge injection filter 62 provides charge filtering mechanism to "purify" the charge flow. Though not required, it is generally desirable that the material for SBG 66 has a Fermi level in the flat band condition lies in about the middle of the energy band gap of BD 64 to best utilize the charge blocking mechanism when the band structure and the injection mechanism are employed in constructing memory cells.

Barrier Heights Engineering for Disturb Prevention

As employing the ballistic charge injection mechanism and energy band structure of the prior art in memory cell 100 placed in an array environment, cell state (e.g. a "0") can be unintentionally changed to the other state (e.g. a "1") during the useful lifetime of usage due to cumulative disturbance introduced while conducting cell operations (e.g. program, erase, and read) throughout other cells that are within a same memory array. As will be described herein, the prior art cell is prone to these types of disturb problems. These disturb problems can however be solved with the piezo-ballistic-charge-injection mechanism and energy band structure of the present invention.

Program Disturb

Program disturb can happen in an unselected memory cell in a memory array while programming a selected cell using the piezo-ballistic-electrons-injection mechanism. The worse case for program disturb corresponds to the situation when CSR 68 of an unselected cell is positively charged (e.g. in the erased state). Turning now back to FIG. 13, disturb is caused by inadvertently inject charges onto CSR 68, and hence is to do with the forward injected charge carriers (e.g. electrons 89). It is thus clear that an effective blocking on forward injected electrons can prevent a disturb event. The charge blocking mechanism of the present invention relies on two barriers provided in FIG. 13. A first one is the barrier 90 having barrier heights 91 ($\Delta\Phi_{VE\_TT}$) and 92 ($\Delta\Phi_{VE\_TTB}$) at entrance side and exit side, respectively, for the incoming electrons 89. The barrier height 92 relates to the barrier height 91 through formula:

$$\Delta\Phi_{VE\_TTB} = \Delta\Phi_{VE\_TT} - |V_{TD}|, \quad (5)$$

where $V_{TD}$ is the potential across TD 63 when a voltage of program disturb is applied between STG 60 and SBG 66. By keeping a positive value for $\Delta\Phi_{VE\_TTB}$, these two barrier heights can keep the barrier 90 be a trapezoidal shape barrier in TD 63.

Similarly, a second barrier is the barrier 93 having barrier heights 94 ($\Delta\Phi_{VE\_TB}$) and 95 ($\Delta\Phi_{VE\_TBG}$) at entrance side and exit side, respectively, for the incoming electrons 89. The barrier height 95 relates to the barrier height 94 through formula:

$$\Delta\Phi_{VE\_TBG} = \Delta\Phi_{VE\_TB} - |V_{BD}|, \quad (6)$$

where $V_{BD}$ is the potential across BD 64 when the voltage of program disturb is applied between STG 60 and SBG 66. By keeping a positive value for $\Delta\Phi_{VE\_TBG}$, these two barrier heights can form a trapezoidal barrier in BD 64 for blocking the incoming electrons 89. Thus, with the trapezoidal barrier structure for both barriers 90 and 93, the energy band structure provides an effective mechanism blocking incoming electrons 89 and hence prevents program disturb.

Figure 18A:
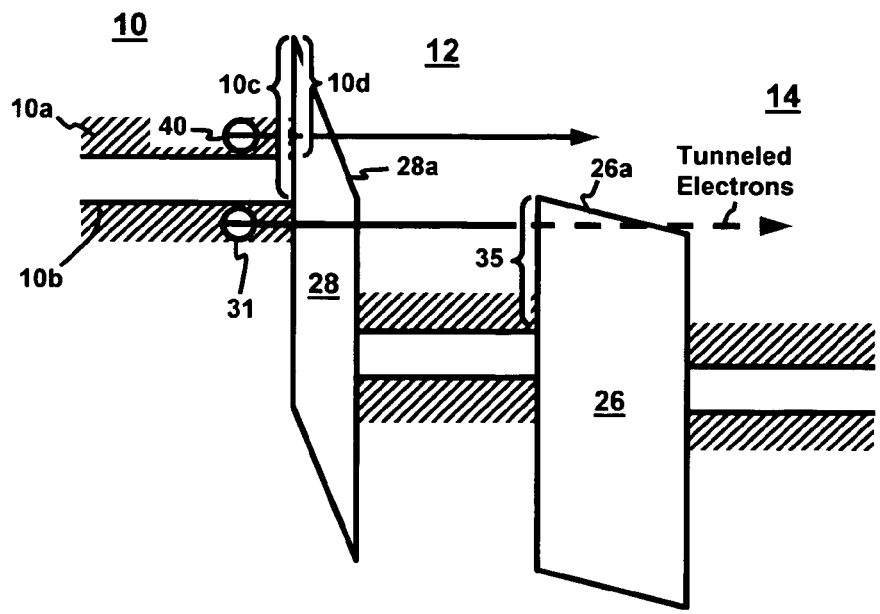
FIG. 18A (prior art) is the energy band diagram of the structure of FIG. 1, illustrating the unknown problem on barrier heights for blocking charges transport when biasing prior art memory cell under the condition for program disturb prevention.

FIG. 18A shows a similar diagram as in FIG. 13 for the prior art. In FIG. 18A, there is shown the barrier height 10c ($\Delta\Phi_{VE\_TT}$), which corresponds to the barrier height for electrons 31. Under the bias for disturb prevention, electrons 31 is shown be able to transport through dielectric 28 in direct tunneling mechanism and can reach the interface between regions 12 and 26. The disturb prevention of prior art thus fully relies on keeping the energy level of electrons 31 lower than the barrier height 35 to ensure retention dielectric 26 be the barrier blocking the forward injected electrons 31 from entering floating gate 14. However, there are situations that these electrons can enter into floating gate 14 through tunneling into the conduction band 26a of retention dielectric 26 in Fowler-Nordheim tunneling mechanism when retention dielectric 26 has an triangle-shaped energy band structure shown in FIG. 18A. In such an event, a change on cell state can occur as enough electrons are inadvertently introduced and accumulated on floating gate 14. This effect results in a cell disturb. Also shown in FIG. 18A is the conduction electrons 40 in the p+ polysilicon tunneling gate 10 with a barrier height 10d illustrated as the barrier height associated thereto. Electrons 40 in a p+ polysilicon is usually negligible in normal voltage range (e.g. ~2V) and can become significant in higher voltage (e.g. ~3V) when the p+ polysilicon is inverted. FIG. 18A shows that electrons 40 can be inadvertently injected into floating gate 14, even the cell is biased under condition for preventing a program disturb. The cumulative disturbance introduced by this effect can also result in a cell disturb.

With the barrier height engineering concept, the energy band structure constructed in the present invention provides a more effective structure preventing the program disturb than that in the prior art. Referring back to FIG. 13, the trapezoidal barrier 93 formed by BD 64 provides an additional blocking barrier to the incoming electrons 89. The barrier heights 94 and 95 of this barrier can be optimized by a proper selection on the dielectric constant and thickness for TD 63 and BD 64, as taught in the theory for barrier height engineering, such that they can be electrically altered in different degree than the barrier heights 91 and 92 of TD 63. In general, it is desired to keep the two barrier heights 94 and 95 of the trapezoidal barrier high enough to block the electrons 89. For disturb prevention, a program-disturb voltage $V_{pd}$ between STG 60 and SBG 66 is chosen such that the energy level of electrons 89 in STG 60 is under the barrier heights 94 and 95. It should be noted that the trapezoidal barrier in BD 64 can be preserved by keeping a positive value for the barrier height 95 (i.e. the one at the exit side). This can be achieved by choosing a large value for the conduction band offset ($\Delta\Phi_{CB\_TB}$) between STG 60 and BD 64 through proper selection on materials for TD 63 and BD 64 or by keeping $V_{pd}$ at a value lower than the summation of the barrier height $\Delta\Phi_{CB\_TB}$, the flatband voltage ($V_{fb}$), and energy band gap (Eg) of SBG 66. A better way to capture the method provided here for disturb prevention is by referring to the expression for the barrier height 95 ($\Delta\Phi_{VE\_TBG}$) described in formula (6), which can be further expressed as $$\Delta\Phi_{VE\_TBG} = \Delta\Phi_{CB\_TB} + Eg - (|V_{pd}| + V_{fb}).$$

As is clear mathematically in this formula, keeping the magnitude of $V_{pd}$ lower than the summation of $\Delta\Phi_{CB\_TB}$, Eg, and $-V_{fb}$, can keep the barrier height 95 ($\Delta\Phi_{VE\_TBG}$) having a positive height, thus can preserve the trapezoidal barrier shape for barrier 93. For the specific embodiment, voltage of STG 60 is chosen in the range of about −1.0 V to about −2.0 V relative to voltage of SBG 66 for program disturb prevention.

As described hereinbefore, the barrier height engineering permits a portion of $V_{pd}$ be dropped across BD 64 region.

Therefore, the voltage across TD 63 is lower than that in the prior art. A lower voltage across TD 63 can prevent the formation of conduction electrons in the p+ polysilicon of STG 60, and hence prevents program disturb caused by the higher energy electrons 40 that occur in prior art. In the situation where electrons 40 do get formed in STG 60, program disturb of electrons 40 can be suppressed by keeping the two barrier heights, 94 and 95, of the trapezoidal barrier high enough such that electrons 40 can be blocked from tunneling through TD 63 and BD 64. This can be done through optimizing the barrier structure, as taught in the barrier height engineering theory.

Erase Disturb

Erase disturb can happen in an unselected memory cell in a memory array while erasing a selected cell using the piezo-ballistic-holes-injection mechanism. The worse case for erase disturb corresponds to the situation when CSR 68 of the unselected cell is negatively charged (e.g. in the programmed state). Please turn back to FIG. 11 for the illustration. FIG. 11 illustrates the energy band diagram corresponding to this situation, wherein an erase disturb voltage is assumed to be about +2 V between STG 60 to SBG 66. The charge blocking mechanism for erase disturb prevention of the present invention relies on two barriers provided in FIG. 11. A first one is the barrier 85 having barrier heights 75 ($\Delta\Phi_{VH\_TT}$) and 84 ($\Delta\Phi_{VH\_TTB}$) at entrance side and exit side, respectively, for the incoming LH 72 and HH 73. The barrier height 75 relates to the barrier height 84 through formula:

$$\Delta\Phi_{VH\_TTB} = \Delta\Phi_{VH\_TT} - |V'_{TD}|, \qquad (7)$$

where $V'_{TD}$ is the potential across TD 63 during the erase disturb. Thus, by keeping a positive value for $\Delta\Phi_{VE\_TTB}$, these two barrier heights can maintain a trapezoidal shape barrier for the barrier 85 in TD 63.

Similarly, a second barrier is the barrier 87 having barrier heights 86 ($\Delta\Phi_{VE\_TB}$) and 88 ($\Delta\Phi_{VE\_TBG}$) at entrance side and exit side, respectively, facing the incoming LH 72 and HH 73. The barrier height 86 relates to the barrier height 88 through formula:

$$\Delta\Phi_{VH\_TBG} = \Delta\Phi_{VH\_TB} - |V'_{BD}|, \qquad (8)$$

where $V'_{BD}$ is the potential across BD 64 during the erase disturb. By keeping a positive value for $\Delta\Phi_{VH\_TBG}$, these two barrier heights can form a trapezoidal shape barrier for the barrier 87 in BD 64. Thus, with the double trapezoidal barrier structure of barriers 85 and 87, the energy band structure in FIG. 11 provides an effective mechanism blocking incoming LH 72 and HH 73 and hence prevents erase disturb.

Figure 18B:
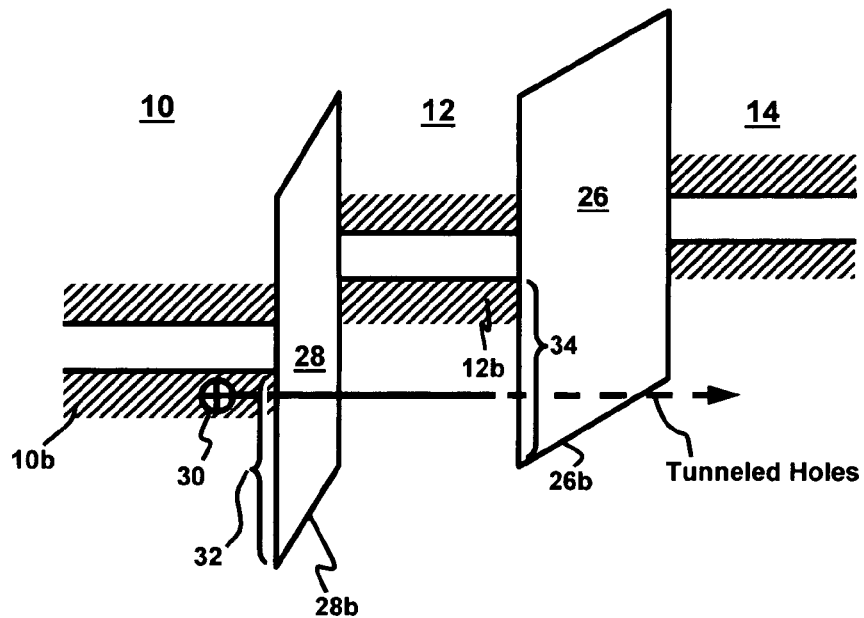
FIG. 18B (prior art) is the energy band diagram of the structure of FIG. 1, illustrating unknown problem on barrier heights for blocking charges transport when biasing the prior art memory cell under the condition for erase disturb prevention.

Turning now to FIG. 18B, a similar analysis is now made based on the energy band structure of the prior art. In FIG. 18B, the barrier height 32 cannot block holes 30 as tunneling dielectric 28 is designed to permit holes 30 tunneling therethrough as gate 10 is positively bias relative to gate 12. The disturb prevention of the prior art thus fully rely on keeping the energy level of holes lower than the barrier height 34 to ensure retention dielectric 26 be the barrier blocking the incoming holes from entering floating gate 14. However, there are situations that these holes can enter into floating gate 14 through tunneling into the valence band 26b of retention dielectric 26 in Fowler-Nordheim tunneling mechanism when dielectric 26 has an "triangle-shaped" energy band structure shown in FIG. 18B. In such an event, a change on cell state can occur as enough holes are inadvertently introduced and accumulated on floating gate 14. This result in an erase disturb to an unselected cell. Thus, the energy band structure and cell structure of prior art is more vulnerable to disturb problem.

With the barrier height engineering concept, the energy band constructed in the present invention provides a more effective structure preventing the erase disturb in the memory cell. Referring back to FIG. 11, the trapezoidal barrier 87 formed by BD 64 provides a more effective structure to block the incoming LH 72 and HH 73. The barrier heights 86 and 88 can be optimized by a proper selection on the dielectric constant and thickness for TD 63 and BD 64, as taught in the theory for energy band engineering, such that they can be electrically altered in different degree than the barrier heights 75 and 84 of TD 63. In general, it is desired to keep the two barrier heights, 86 and 88, of the trapezoidal barrier 87 high enough in unselected cells for disturb prevention, and to keep such two barriers low enough in selected cells for erase operation. For disturb prevention, the voltage between STG 60 and SBG 66 is chosen such that the energy level of LH 72 and HH 73 is lower than the barrier heights 86 and 88. It should be noted that the trapezoidal barrier 87 in BD 64 can be preserved by keeping a positive value for the barrier height 88 (i.e. the one at the exit side). This can be achieved by choosing a large value for a valence band offset ($\Delta\Phi_{VB\_TB}$) between valence bands 64b and 60b through proper selection on materials for TD 63 and BD 64 or by keeping erase disturb voltage $V_{ed}$ at a value lower than the summation of this valence band offset and the flat band voltage $V_{fb}$. A better way to capture the method provided here for disturb prevention is by referring to the formula for the barrier height 88 ($\Delta\Phi_{VH\_TBG}$), which is expressed as $$\Delta\Phi_{VH\_TBG} = \Delta\Phi_{VB\_TB} - (V_{ed} - V_{fb}).$$

As is clear mathematically in this formula, keeping $V_{ed}$ lower than the summation of $\Delta\Phi_{VB\_TB}$ and $V_{fb}$ can keep the barrier height 88 ($\Delta\Phi_{VH\_TBG}$) having a positive height, thus can preserve the trapezoidal barrier shape.

For the specific embodiment, voltage of STG 60 is chosen in the range of about +2.0 V to about +2.5 V relative to voltage of SBG 66 for erase disturb prevention.

Figure 3A:
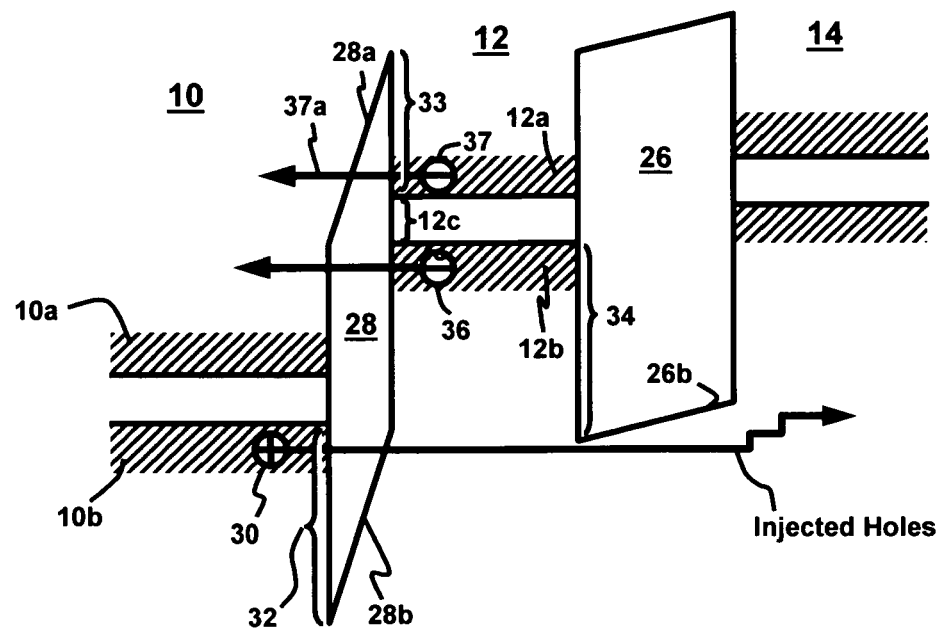
FIG. 3A is the energy band diagram of the structure of FIG. 1, illustrating the unknown problems in energy band structure for hole injection in erasing memory cell of the prior art.
Figure 3B:
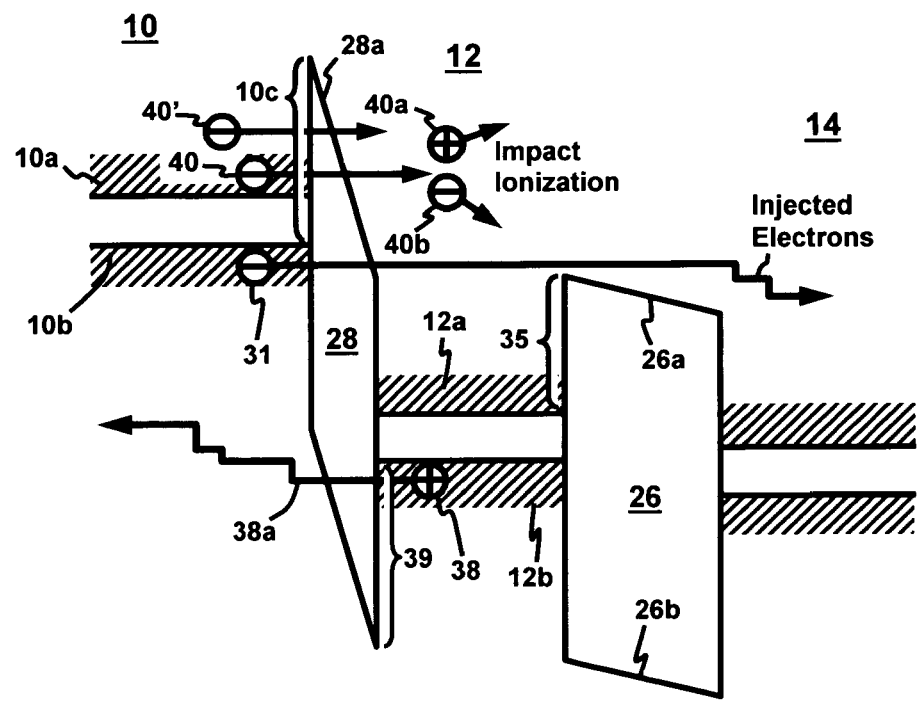
FIG. 3B is the energy band diagram of the structure of FIG. 1, illustrating the unknown problems in energy band structure for electron injection in programming memory cell of the prior art.
Figure 3C:
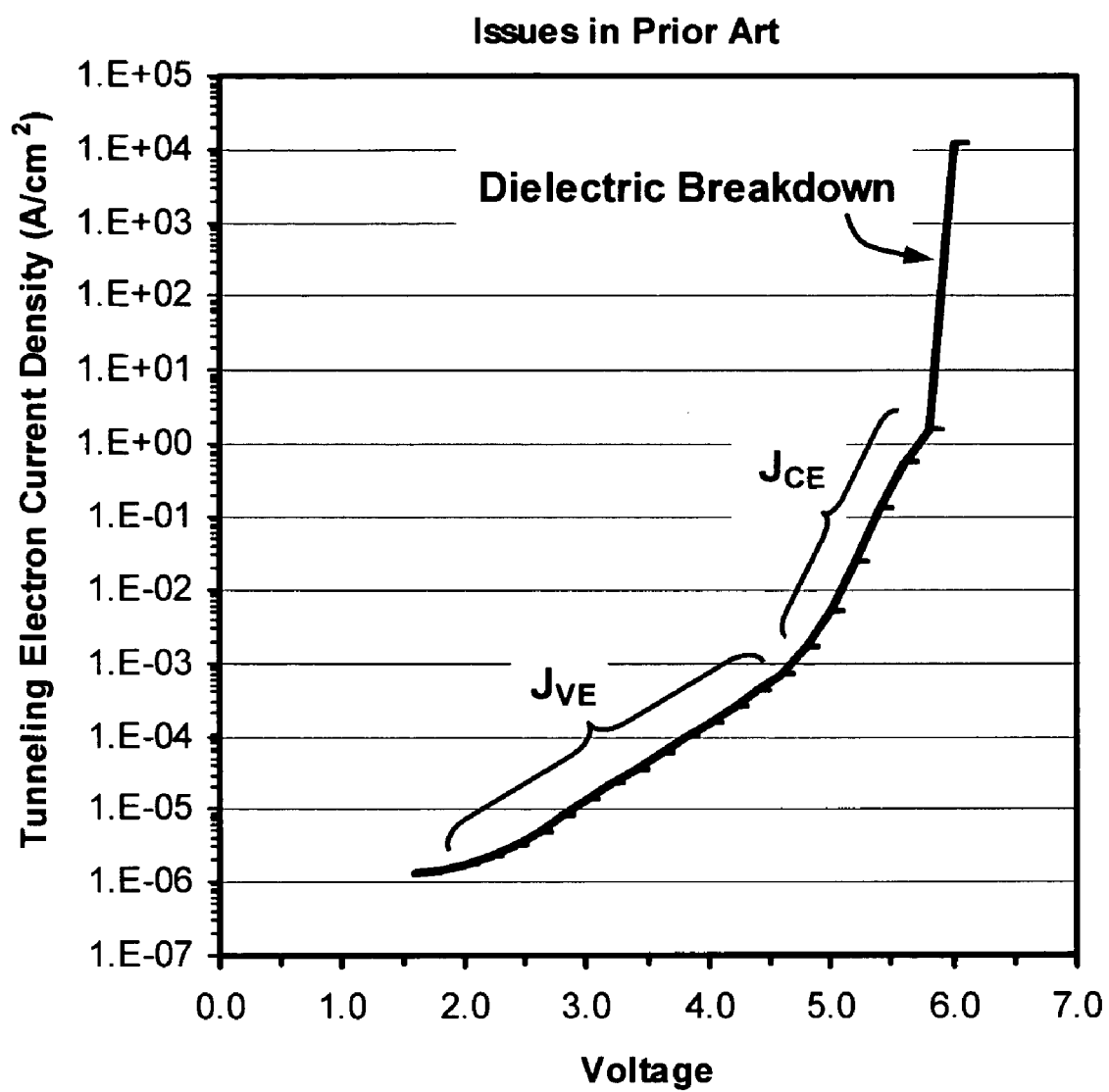
FIG. 3C illustrates the tunneling electron current density as a function of the applied voltage for various electron current components, and further illustrating the dielectric breakdown problem in the energy band structure of prior art in erase operation.
Figure 3D:
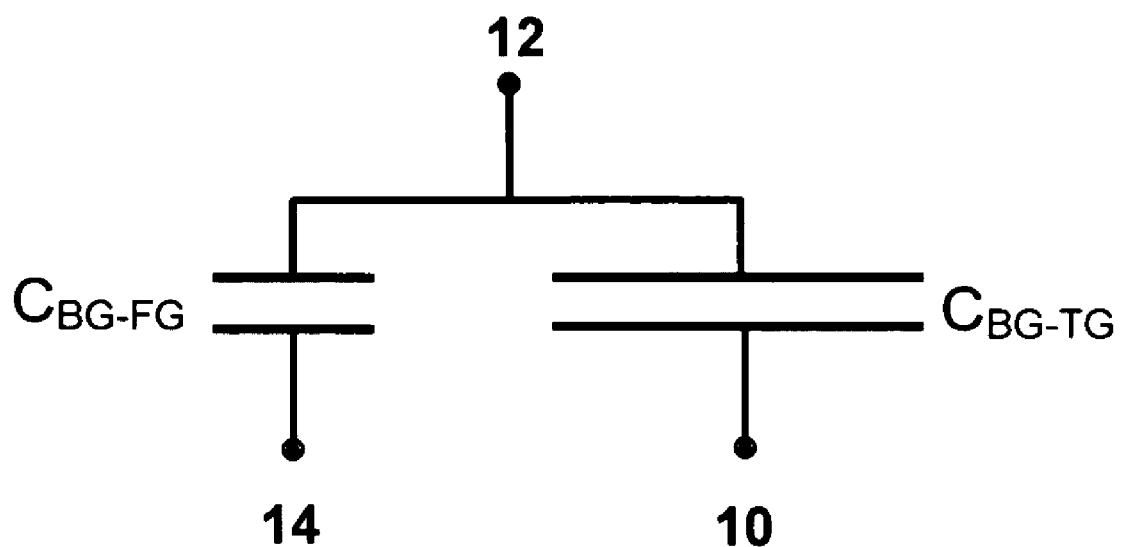
FIG. 3D illustrates various parasitic capacitances associated with the ballistic gate of the memory cell of the prior art.
Figure 19:
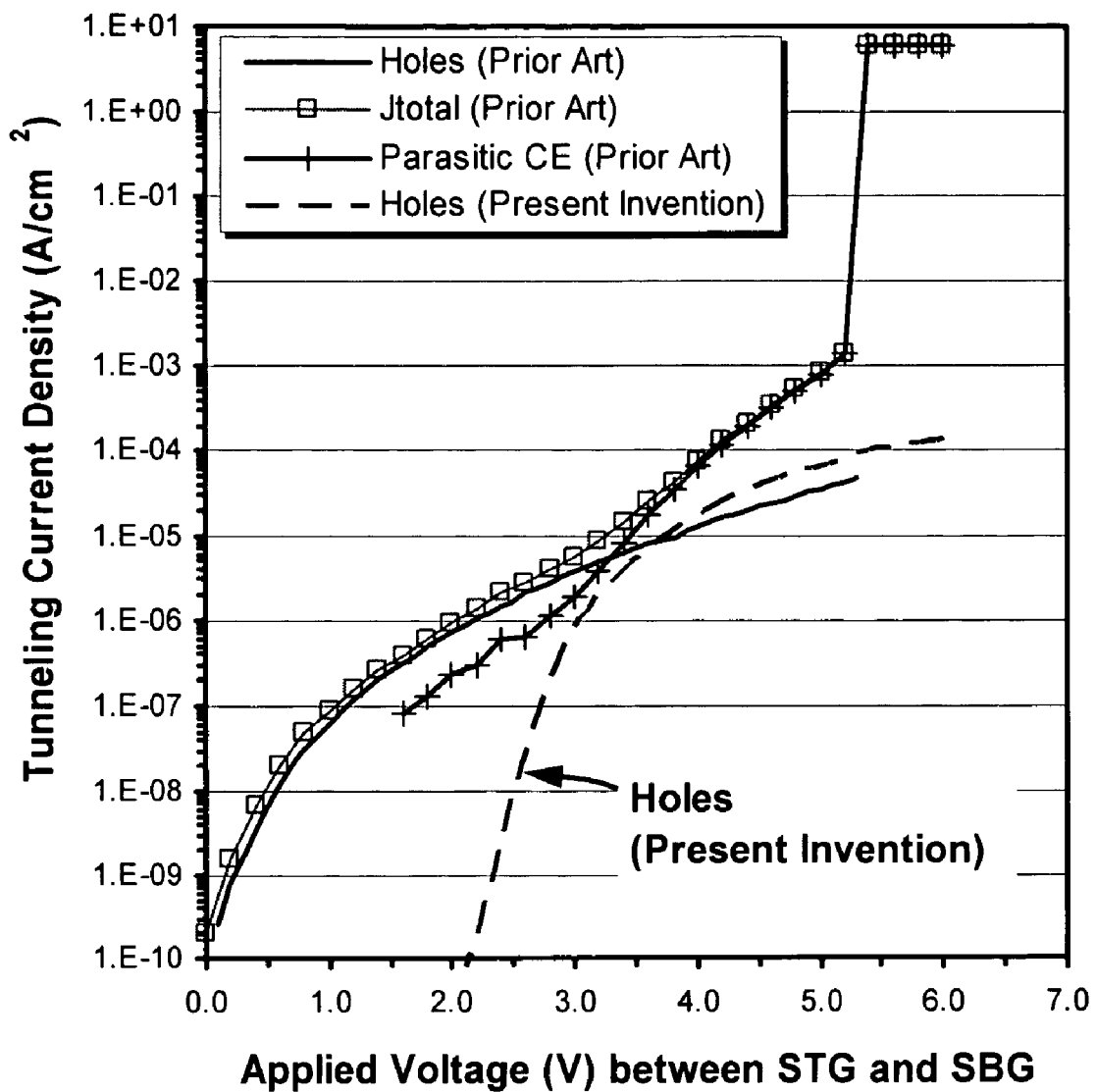
FIG. 19 is a chart illustrating the tunneling current density of various current components as a function of voltage across the STG and the SBG, and further illustrating the difference on these components between the present invention and the prior art.

FIG. 19 illustrates the effect of the barrier height engineering on tunneling currents when STG 60 is positively biased relative to SBG 66. For comparison, FIG. 19 further shows various components on tunneling currents for energy band structure in prior art when gate 10 is positively biased relative to gate 12. The tunneling currents of prior art comprise the hole current in the modest bias range (0 to 3 V) and the parasitic CE current in the higher bias range (3V and higher). As described hereinbefore (see FIG. 3A), the CE current is from the electrons 37 of inversion layer formed in gate 12, which is formed in p+ polysilicon. The CE current and its formation mechanism were overlooked in the prior art. This problem constitutes a major issue on functionality of memory cell in the prior art. In a clear contrast, the total tunneling current of the present invention is found comprising the hole current only. There is no parasitic current observed within the entire bias range. The parasitic CE issue is prevented in the energy band structure of the present invention because a portion of the applied voltage is now absorbed by BD 64. Furthermore, the hole current of the present invention show a much stronger voltage dependence than that in the prior art. As illustrated, the hole current is found at similar level as that in prior art at the erase voltage of about 5V, and is found negligible at a disturb prevention voltage of about 2 V. As is shown at an applied voltage of 2V, the hole current density of the present invention is about $10^4$ times lower than that of prior art. In other words, with the barrier height engineering and the energy band structure provided in the present invention, a memory cell thus constructed can have an erase disturb strength about $10^4$ times stronger than that of memory cells constructed in prior art.

Figure 20A:
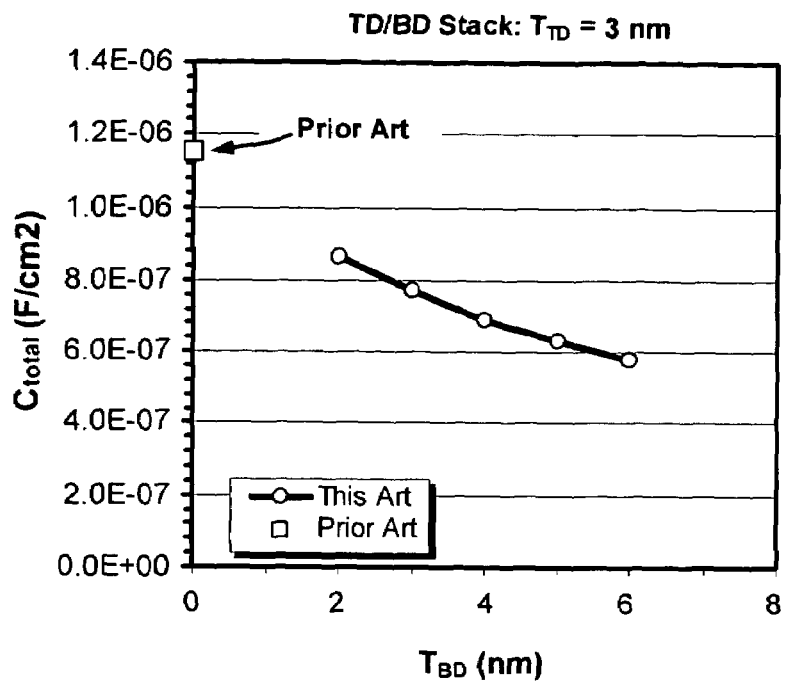
FIG. 20A is a chart illustrating the total capacitance seen by SBG for energy band structure of the present invention and of the prior art; wherein the total capacitance for structure of the present invention is illustrated can be significantly lowered with a proper selection on the BD thickness.
Figure 20B:
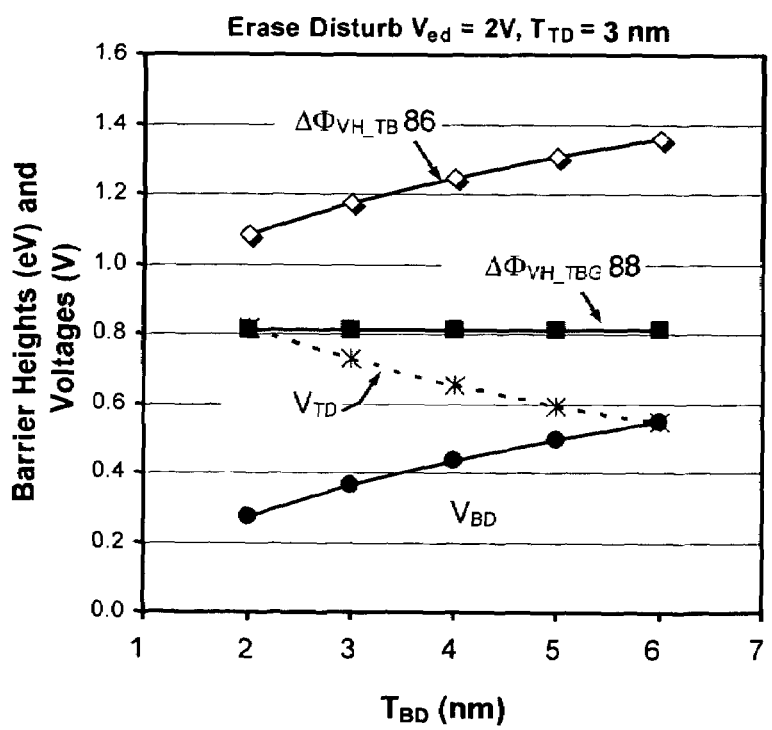
FIG. 20B is a chart illustrating the effect of thickness of the blocking dielectric on barrier heights and on voltages across the tunneling and the blocking dielectrics, and further illustrating there is no compromise between optimizing barrier heights for disturb prevention and optimizing BD thickness for capacitance suppression.

FIG. 20A shows the total capacitance seen by SBG 66 and its dependence on the thickness of BD ($T_{BD}$), and is used to illustrate the advantage on suppressing parasitic capacitance provided in the present invention. The parasitic capacitance between gates 10 and 12 of prior art is shown to be about $1.2 \times 10^{-6}$ Farad/cm$^2$, which corresponds to the thickness of dielectric 28 around 3 nm required for tunneling injection in prior art. In the present invention, such capacitance can be significantly reduced to the range of about $9 \times 10^{-7}$ Farad/cm$^2$ for structure with TD 63 of oxide having same thickness as dielectric 28 in the prior art cell and BD 64 of nitride having a thickness of 2 nm. The capacitance can be further reduced to the range of about $7 \times 10^{-7}$ and $5.8 \times 10^{-7}$ Farad/cm$^2$ as thickening BD to 4 nm and 6 nm, respectively. It should be noted that thickening BD does not have adverse impacts on disturb prevention for program and for erase. This can be better understood by referring to the expressions for the barrier height 88 ($\Delta\Phi_{VH\_TBG}$) for erase and for the barrier height 95 ($\Delta\Phi_{VE\_TBG}$) for program. For the case of erase, as is apparent in the expression for $\Delta\Phi_{VH\_TBG}$ (=$\Delta\Phi_{VB\_TB}$ − ($V_{ed} - V_{fb}$)), the barrier height 88 ($\Delta\Phi_{VH\_TBG}$) is independent of the thickness of BD 64, and hence thickening BD 64 will not change the barrier height 88. As described hereinbefore, keeping a positive barrier height 88 can preserve the valence band barrier 87 of BD 64 in a trapezoidal shape, which is important for blocking tunneling charge carriers. The effect here is advantageous as it permits the optimization on the barrier height 88 for disturb prevention and the optimization on BD 64 thickness for parasitic capacitance suppression be made separately. Therefore, there is no compromise in the optimization process. In fact, thickening BD 64 can permit the trapezoidal barrier be a more effective tunneling barrier to charge carriers on either side of the barrier due to a thicker tunneling distance for these carriers. Furthermore, a thicker BD 64 permits a larger voltage drop across BD 64, and hence a smaller voltage drop across TD 63. The effect of the thickness of BD 64 on barrier heights and on voltage drop across the dielectrics is illustrated in FIG. 20B. The illustration is made for the specific embodiment, where nitride and oxide is employed as the material for BD 64 and TD 63, respectively. As is apparent, the barrier height 88 ($\Delta\Phi_{VH\_TBG}$) is found independent of BD thickness ($T_{BD}$), and is maintained at a value of about 0.8 eV when $V_{ed}$ is set at 2V for disturb prevention. As also shown in FIG. 20B, thickening BD 64 results in a higher barrier height 86 ($\Delta\Phi_{VH\_TB}$). As can be seen in FIG. 11, a higher barrier height 86 is favorable for blocking LH 72 and HH 73 from forward tunneling, and hence is desirable for disturb prevention Although the forgoing discussions in FIGS. 19 and 20 have focused on the erase disturb, it will be clear to those ordinary skills in the art that similar considerations, their effects and advantages apply to the program disturb.

The Memory Cells of the Present Invention

The memory cells of the present invention can be programmed by employing the piezo-ballistic-electron-injection mechanism and erased by employing the piezo-ballistic-hole-injection mechanism described hereinbefore.

Figure 21:
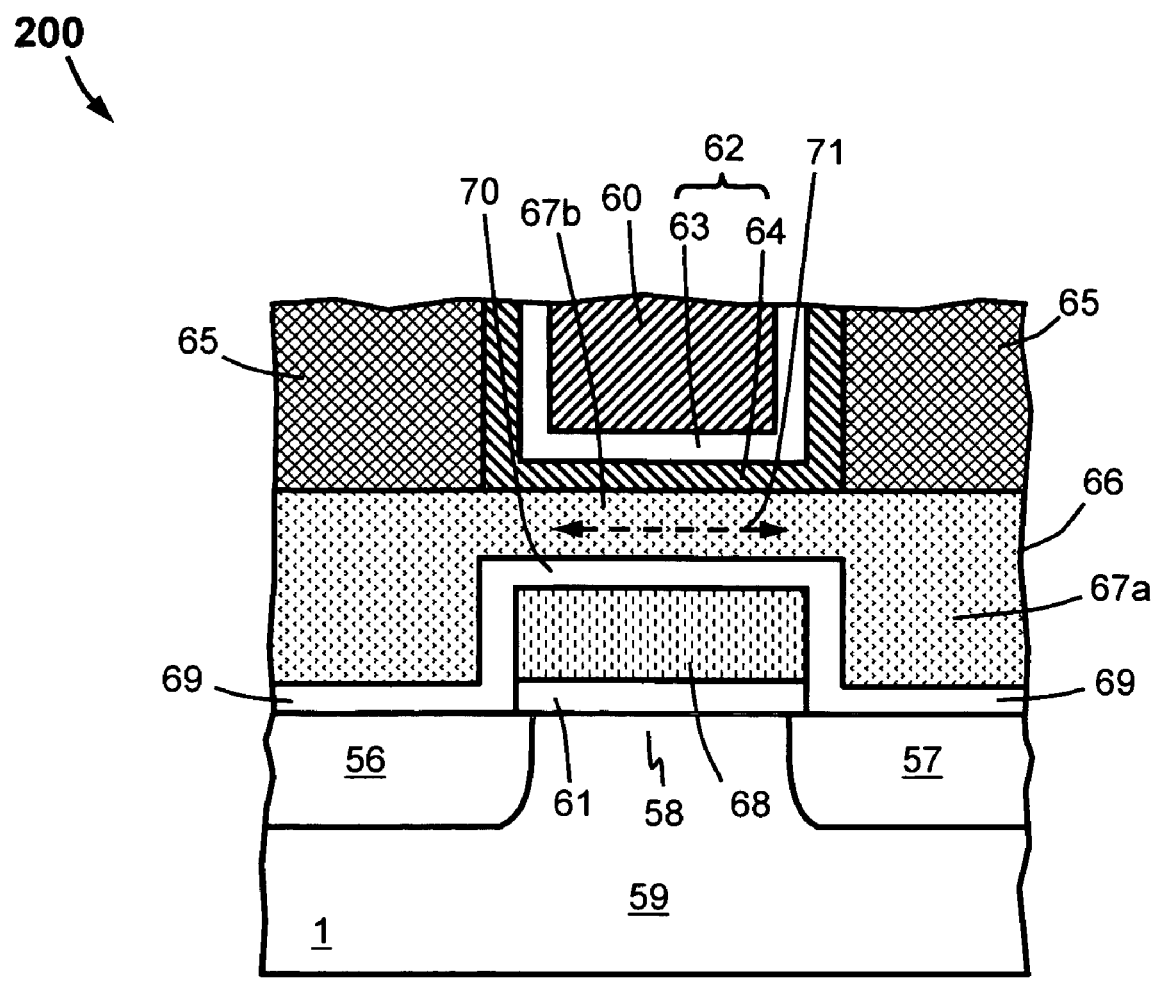
FIG. 21 is the cross sectional view of a cell structure in accordance with one embodiment of the present invention.

FIG. 21 shows a cross sectional view of a memory cell 200 in accordance with one embodiment of the present invention. The cell 200 comprises a source 56, a drain 57 with a channel 58 therebetween, a body 59 in a substrate 1 of a first conductivity type (e.g. p-type), a strained tunneling gate (STG 60), an injection filter 62, a strained ballistic gate (SBG 66), a strain source of a strain material 65, and a charge storage region (CSR 68). The source 56 and drain 57 are formed in the substrate and are typically heavily doped by impurity of a second conductivity type (e.g. n-type) having doping level in the range of about $1 \times 10^{18}$ atoms/cm$^3$ to about $5 \times 10^{21}$ atoms/cm$^3$. The CSR 68 is disposed over and insulated from the channel 58 by a channel dielectric 61. The SBG 66 is disposed over and insulated from the CSR 68 and the source/drain 56/57 by a retention dielectric (RD 70) and by a diffusion dielectric 69, respectively. The SBG 66 can be a heavily doped polysilicon, poly SiGe, low resistivity interconnect material such as silicide, or a refractory metal. The STG 60 is disposed over and insulated from the SBG 66 by the injection filter 62 comprising a tunneling dielectric (TD 63) and a blocking dielectric (BD 64). The STG 60 can be a heavily doped polysilicon, poly SiGe, low resistivity interconnect material such as silicide, or a refractory metal, with a thickness in the range of about 20 nm to 400 nm. The TD 63 is disposed in between the STG 60 and the BD 64. The material for TD 63 can be oxide, nitride, oxynitride, aluminum oxide, hafnium oxide, zirconium oxide or an alloy of these materials, and has a thickness in the range of about 1.5 nm to about 4 nm. The material for BD 64 can have a narrower energy band gap than that of TD 63, and can be selected from the group of oxynitride, nitride, aluminum oxide, hafnium oxide, zirconium oxide and alloys of these materials. The thickness for BD 64 can be in the range of about 1 nm to about 6 nm. The strain material 65 can be the strain source providing mechanical stress to strain SBG 66 disposed thereunder, and/or to strain STG 60 disposed laterally adjacent to and insulated therefrom by the injection filter 62. Though not shown, a portion of the strain material 65 can also be disposed over the STG 60 to further provide strain to that region. The STG 60 overlaps with the SBG 66 at an overlapping region, where at least a portion of the CSR 68 is disposed thereunder. In a preferred embodiment, the SBG 66 comprises two portions: A first portion 67a having a thickness on the order of about 40 nm to about 400 nm is disposed generally over the source 56 and drain 57, and a second portion 67b having a thickness on the order of about 10 nm to about 200 nm is disposed generally over CSR 68. The surfaces of the first and the second portions 67a and 67b of SBG 66 are generally at same level.

The strain material 65 can be a dielectric providing different types of stress (e.g. compressive stress or tensile stress) and is used for generating piezo-effect in STG 60 and SBG 66 for the piezo-ballistic-charge-injection. The stress can be a uniaxial stress with a stress axis generally parallel to the surface of the second portion 67b of SBG 66 and along a first direction shown in a dash arrow 71. A preferred embodiment for the strain material 65 comprises nitride. The stress level and physical properties of the nitride can be controlled by the thickness and process conditions in its formation. For example, by changing the pressure on chemical elements (e.g. silane) during its formation, magnitude on stress level in the range of about 50 MPa to about 1 giga Pascal ("GPa") can be achieved. The nitride can be formed to have either tensile stress or compressive stress by employing well-known chemical-vapor-deposition ("CVD") techniques such as thermal-CVD (for tensile stress nitride) or plasma-CVD (for compressive stress nitride). Further, the stress level of nitride can be tailored or even be relaxed if necessary by using well-known technique, such as ion implanting Ge into the nitride with implant dosage above a threshold level (e.g. about $1\times10^{14}$ atoms/cm$^2$).

It should be clear to those of ordinary skill in the art having the benefit of this disclosure that the strain source resulting in piezo-effect on SBG and STG in the present invention need not be originated from the strain material 65 and need not be from its shown location, but rather can be from any other means and in any other regions in the memory cell. Further, the stress need not be of the uniaxial type but rather can be other type (e.g. biaxial type). For example, the strain source can be from the SBG when a polysilicon is employed as material for that region. This is because polysilicon can provide tensile stress with stress level typically in the range of about 200 MPa to about 500 MPa. Another material for the strain source is tungsten-silicide, which is a widely used material in manufacturing semiconductor IC. Tungsten-silicide provides stress level in the range of about 1.5 GPa to about 2 GPa, and can be employed alone as the material for SBG or can be formed atop of a polysilicon layer to collectively form the SBG. Other materials such as amorphous polysilicon, polycrystalline Silicon-Germanium ("poly SiGe"), TaN, TiN etc. can also be considered as material for supporting the piezo-ballistic-charge-injection. Moreover, means introducing strain need not be from employing strain materials, but rather can be through other approaches, such as ion implanting heavy atoms (e.g. Si, Ge, As etc.) into the regions of crystal to be strained. Implanting heavy atoms at dosage above a critical dosage can disturb the periodicity of crystal lattice, and create dislocation loops and hence stress in that region. Further the stress in that region can provide strain to region adjacent to it. The stress in the implanted region can be preserved by implanting atom such as nitrogen in that region to prevent stress from being relaxed in later processing steps during cell manufacturing. The ion implantation approach has the advantage on process simplicity as it does not require depositing and etching strain material. Further it can form stress in implanted regions and hence can localize the stress in regions where strain effect is most desired. Among all these approaches, they all provide desired piezo-effect for the piezo-ballistic-charge-injection in accordance with the present invention. Additionally, although one strain source is illustrated in memory cells in accordance with the present invention, it should be clear to those of ordinary skill in the art that two or more strain sources can coexist in the same cell to provide any variations on stress (tensile or compressive) to various regions of memory cell falling within the scope of the appended claims.

Figure 22:
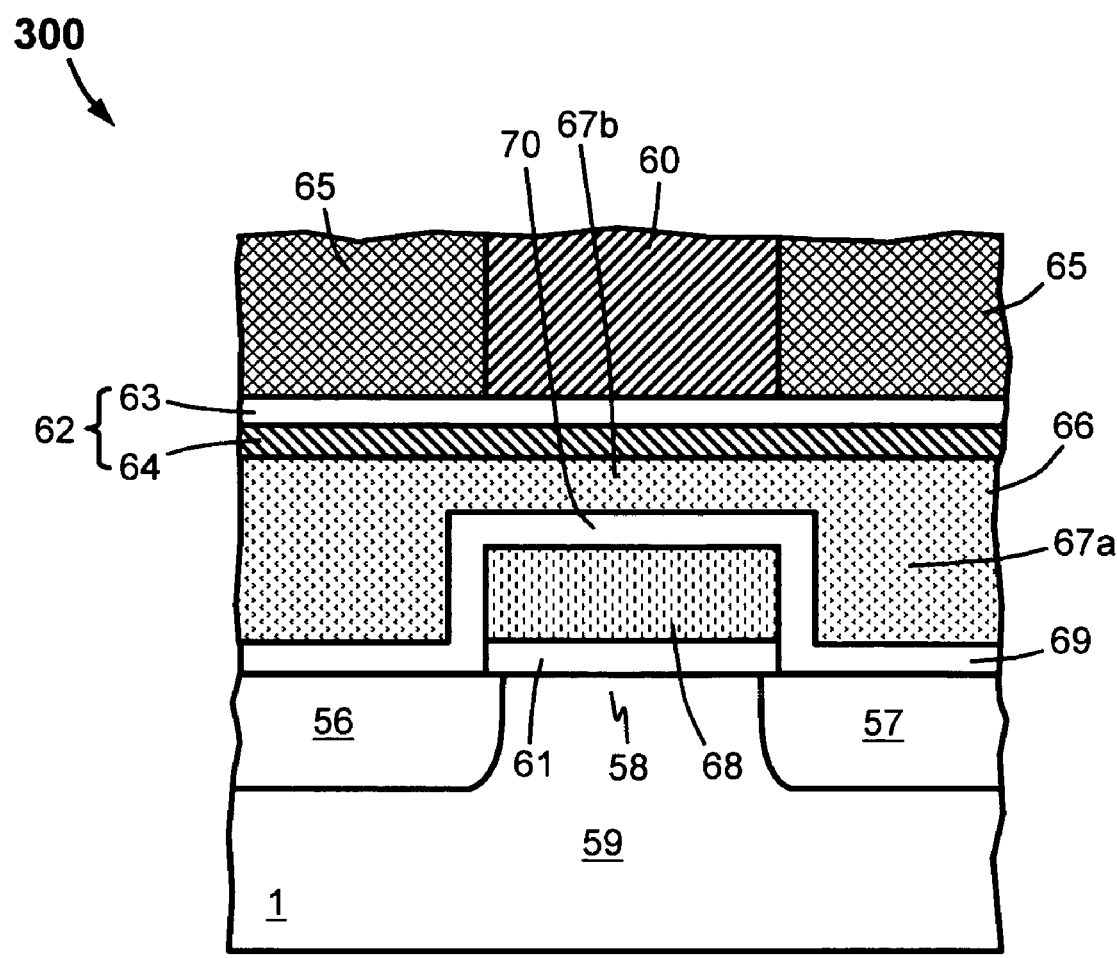
FIG. 22 is the cross sectional view of a cell structure in accordance with another embodiment of the present invention.

FIG. 22 shows a cross sectional view of a memory cell 300 in accordance with another embodiment of the present invention. This embodiment of the present invention differs from cell 200 illustrated in FIG. 21 in that the strain material 65 is disposed over and isolated from the SBG 66 by the injection filter 62. Further, the sidewalls of strain material 65 are disposed laterally adjacent to but in contact with the sidewalls of STG 60. This can provide stronger strain to STG 60 and hence stronger piezo-effect on charge carriers in that region.

Figure 23:
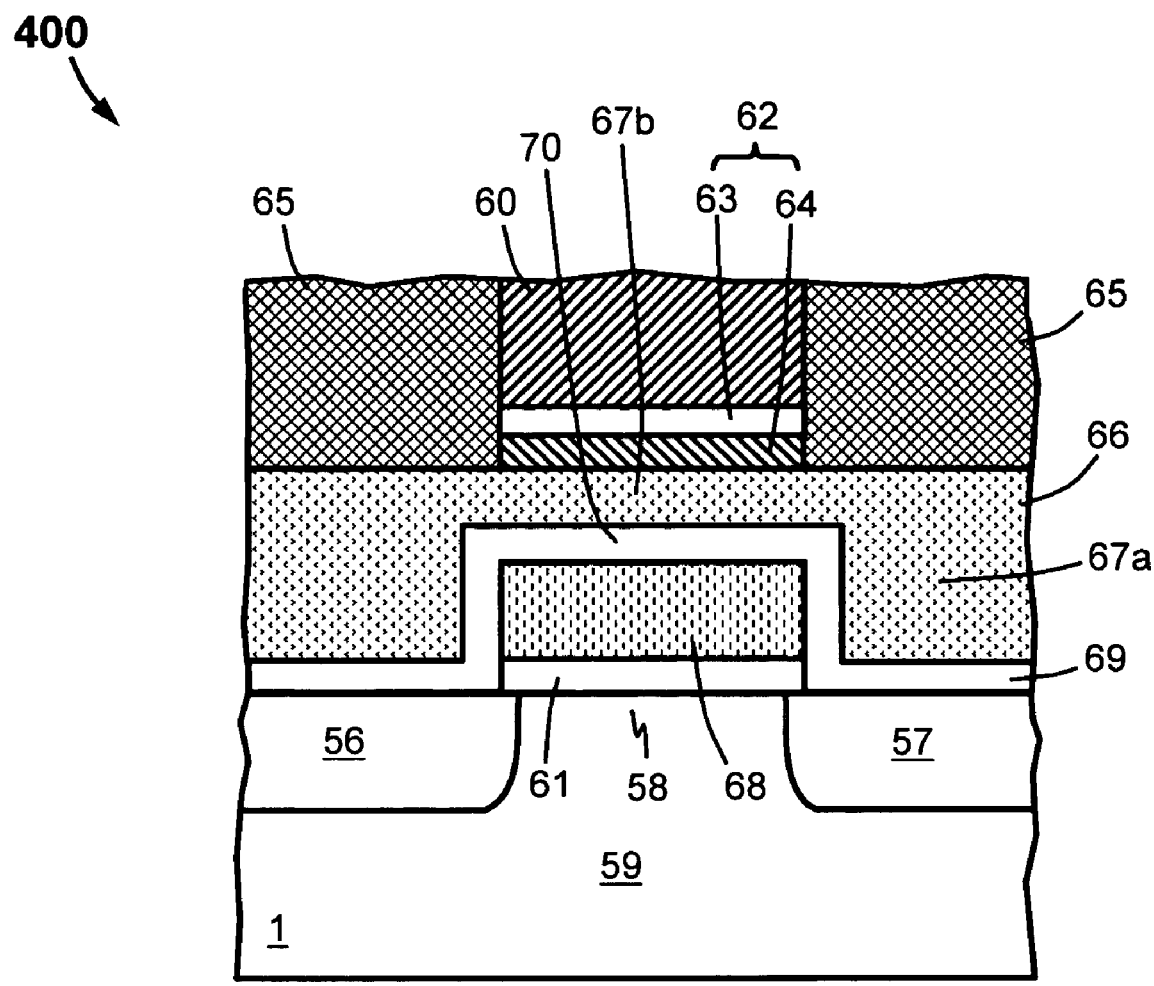
FIG. 23 is the cross sectional view of a cell structure in accordance with another embodiment of the present invention.

FIG. 23 shows a cross sectional view of a memory cell 400 in accordance with another embodiment of the present invention. The memory cell 400 is in all respects except the same as cell 300 of FIG. 22. The difference is that the strain material 65 is in contact with both STG 60 and SBG 66 regions. As shown, the strain material 65 is disposed over the SBG 66 with its bottom in contact with a portion of the surface of SBG 66. Similarly to cell 300 shown in FIG. 22, the sidewalls of strain material 65 are disposed laterally adjacent to but in contact with the sidewalls of STG 60. With direct contact made between the strain source (i.e. the strain material 65) and the strained regions (i.e. STG or SBG), this architecture provides a more effective mean to strain these regions and hence results in a stronger piezo-effect in these regions while employing the piezo-ballistic-charge-injection mechanism for cell operations.

It is thus clear that the strain source (i.e. strain material 65) can be arranged in different ways in memory cell in accordance with the present invention. The strength of the strain effect to the strained regions is typically stronger in regions in direct contact with the strain source, and can be somewhat weaker and relaxed in regions not in direct contact therewith. This provides a scheme to separately optimize the strains in STG and in SBG for an optimum usage of the piezo-ballistic-charges-injection mechanism.

Figure 24:
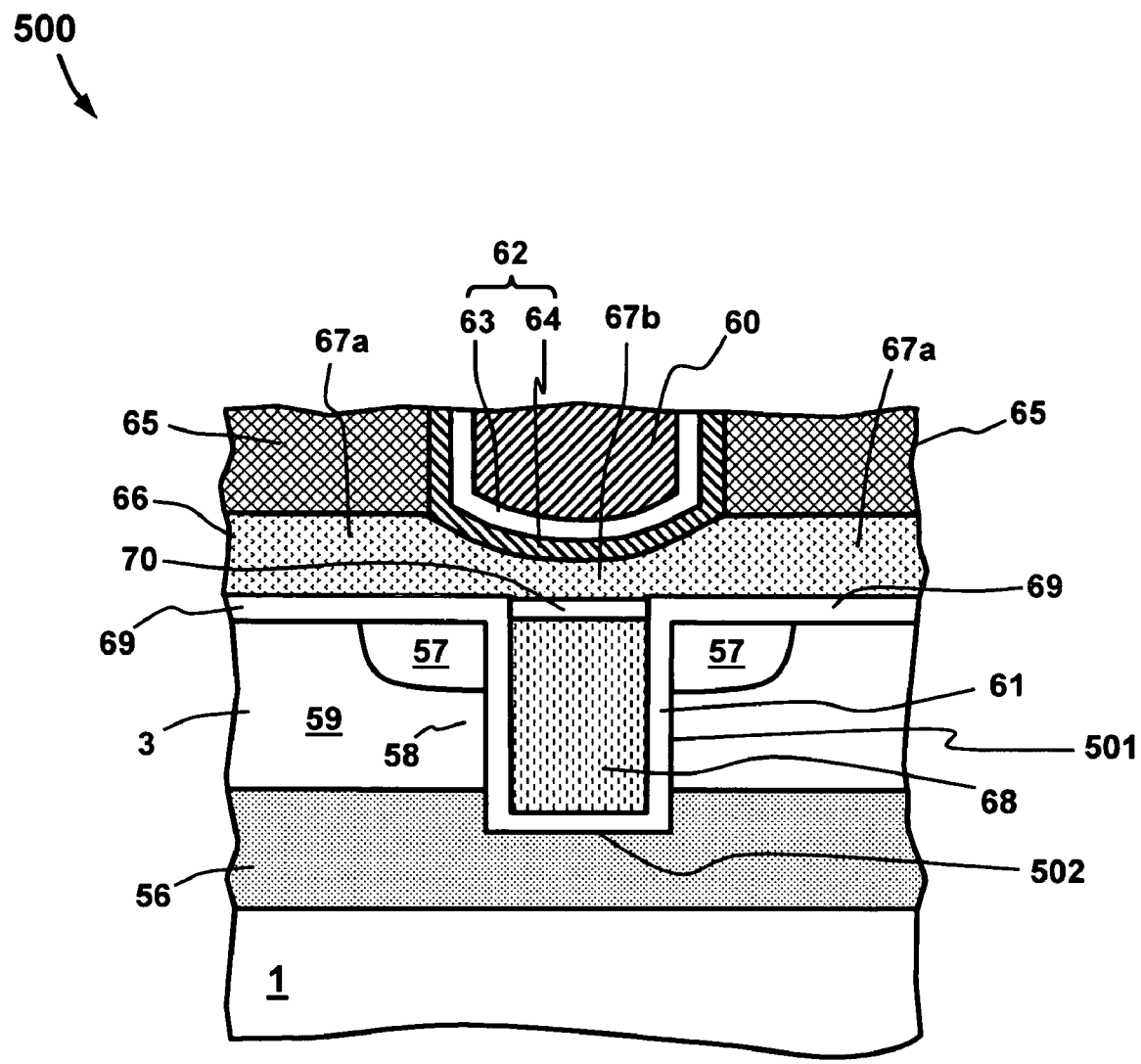
FIG. 24 is the cross sectional view of a cell structure in accordance with another embodiment of the present invention.

FIG. 24 shows a cross sectional view of a memory cell 500 in accordance with another embodiment of the present invention. Memory cell 500 comprises a source 56, a drain 57 with a channel 58 therebetween, a body 59 in a well 3 of a first conductivity type (e.g. p-type), a strained tunneling gate (STG 60), an injection filter 62, a strained ballistic gate (SBG 66), a strain material 65, and a charge storage region (CSR 68). The source 56, drain 57 and well 3 are formed in a substrate 1, which can be either a semiconductor material, such as silicon, or an insulator, such as silicon oxide, silicon sulfide or other dielectrics well-known in the art. For a preferred embodiment, the substrate 1 comprises silicon of the first conductivity type (i.e. p-type) with a lower doping level in the range between about $1\times10^{15}$ atoms/cm$^3$ to about $5\times10^{17}$ atoms/cm$^3$. The well 3 forms the memory well region, wherein individual memory cell resides, and is isolated from the substrate 1 by the source 56. The well 3 can be of the first conductivity type with a higher doping level than the substrate 1 and is in the range between about $5\times10^{15}$ atoms/cm$^3$ to about $1\times10^{18}$ atoms/cm$^3$. The thickness of the well 3 can be on the order of about 200 nm to about 4000 nm. The source 56 can be a region heavily doped by impurity of a second conductivity type (e.g. n-type) with a doping level in the range of about $1\times10^{18}$ atoms/cm$^3$ to about $5\times10^{21}$ atoms/cm$^3$ and a thickness in the range of about 200 nm to about 2000 nm. The drain 57 can be heavily-doped by impurity of a second conductivity type with a doping level in the range of about $1\times10^{19}$ atoms/cm$^3$ to about $5\times10^{21}$ atoms/cm$^3$. The drain 57 can have a thickness on the order of about 50 nm to about 250 nm and is defined in location adjacent to the surface of the well 3. The memory 500 further comprises a trench hole with a trench sidewall 501 extends through the drain 57, the well 3, and a portion of the source 56 with a trench bottom 502 preferably reside within the source 56. The drain 57 in together with the source 56 defined therebetween the channel 58 formed along the trench sidewall 501. A channel dielectric 61 is disposed adjacent to the trench sidewall 501 and the trench bottom 502, and can be made from oxide, nitride, oxynitride or materials of high dielectric constant (such as aluminum oxide, hafnium oxide, zirconium oxide etc.). Typical thickness of the channel dielectric 61 can be in the range of about 5 nm to about 50 nm. A diffusion dielectric 69 is disposed over the drain 57 and the well 3, and can have a thickness in the range of about 10 nm to about 500 nm. The CSR 68 is provided within the trench hole and is insulated from the drain 57, well 3, and source 56 through the channel dielectric 61. The CSR 68 can be with a width on the order of about 10 nm to about 500 nm and with a depth on the order of about 100 nm to about 4000 nm and is generally in a rectangular shape. Disposed over the CSR 68 is a retention dielectric (RD) 70 having a thickness on the order of 5 nm to 40 nm. The material for RD 70 can be made from oxide, nitride, oxynitride, aluminum oxide, hafnium oxide, zirconium oxide or a combination of these materials, such as oxide/nitride/oxide composite film. Disposed over the RD 70 and the diffusion dielectric 69 is the SBG 66 having material similar to that in cell 200. In a preferred embodiment, the SBG 66 comprises two portions: A first portion 67a having a thickness on the order of about 40 nm to about 400 nm generally disposed over the diffusion dielectric 69; a second portion 67b having a thickness in the range of about 10 nm to about 200 nm generally disposed over the CSR 68. Other alternate configurations on the SBG 66 will be described in a greater detail hereinafter. The STG 60 is disposed over and insulated from the SBG 66 by the injection filter 62. The material for STG 60 can be similar to that in cell 200. The injection filter 62 comprises a tunneling dielectric (TD 63) and a blocking dielectric (BD 64) with TD 63 disposed in between the STG 60 and the BD 64. The specification for TD 63 and BD 64 can be similar to that described hereinbefore in cell 200. The strain material 65 is a strain source providing mechanical stress to strain SBG 66 disposed thereunder, and to strain STG 60 disposed laterally adjacent to and insulated therefrom by the injection filter 62. Though not shown, a portion of the strain material 65 can also be disposed over the STG 60 to further provide strain to that region. The STG 60 overlaps with the SBG 66 at an overlapping region, where at least a portion of the CSR 68 is disposed thereunder.

Figure 25:
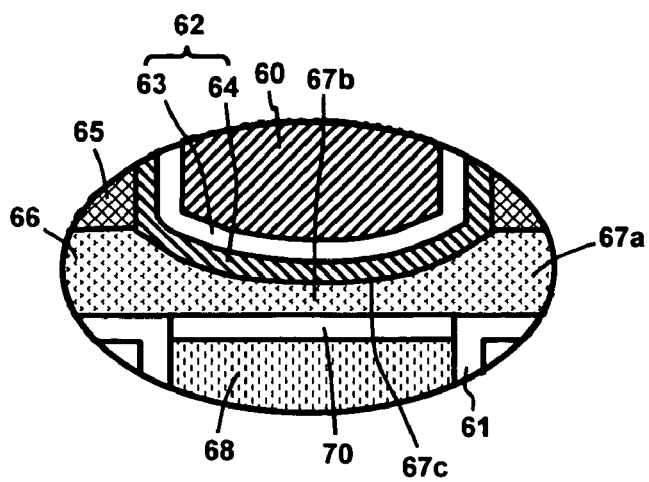
FIGS. 25-A, 25-B, 25-C are enlarged partial cross sections of alternative configurations on SBG in accordance with the present invention.
Figure 25:
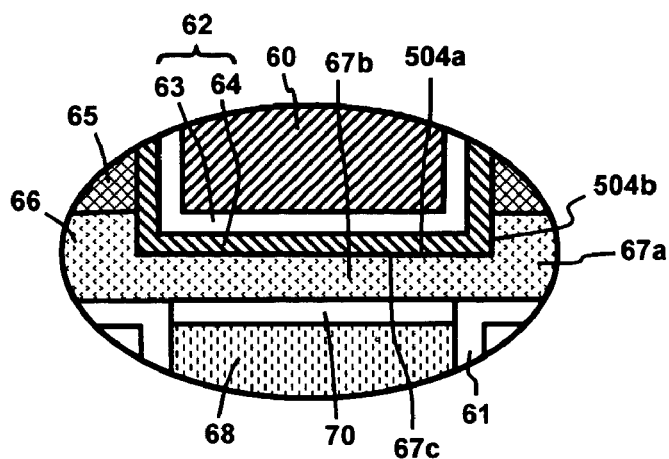
Figure 25:
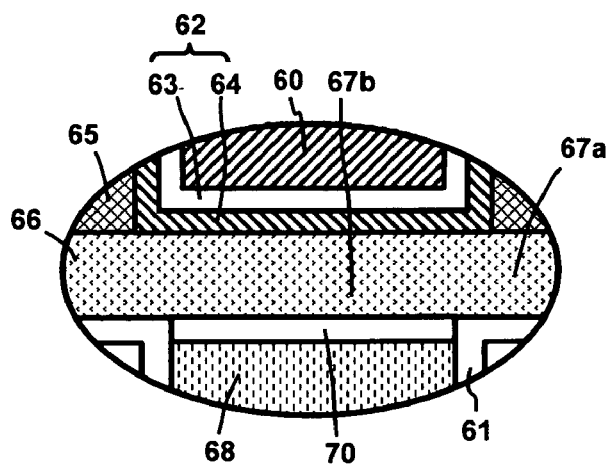

FIG. 25 shows enlarged view illustrating partial cross sections of three alternative embodiments on SBG 66. In the embodiments shown in FIGS. 25-A and 25-B, the object is to form the second portion 67b of the SBG 66 with a reduced thickness than the first portion 67a to enhance the piezo-ballistic-charges-injection efficiency during a program or erase operation of the cells in accordance with the present invention. In the embodiment shown in FIG. 25-A, the reduced thickness is achieved by providing the second portion 67b with a recessed surface 67c inward toward the SBG 66, wherein the recessed surface 67c is substantially a concave contour. In the embodiment shown in FIG. 25-B, the reduced thickness on the second portion 67b is achieved by providing the recessed surface 67c of the second portion 67b in line with the bottom surface 504a of a semi-recessed trench formed within the SBG 66, wherein the trench sidewall 504b is substantially perpendicular to the substrate surface. The degree of thinning on the second portion 67b can be determined based on the type of materials used for the SBG 66 and based on the desired optimum performance of the cell operation, and is in general range from about 10% to about 80% of the thickness of the first portion 67a. Finally, there is shown the embodiment with a simpler configuration on SBG 66 in FIG. 25-C. The structure comprises SBG 66 configured with the second portion 67b being substantially identical, in thickness, to the first portion 67a. The main advantage of this embodiment is on the simpler process for forming the SBG 66 during cell manufacturing.

Figure 26:
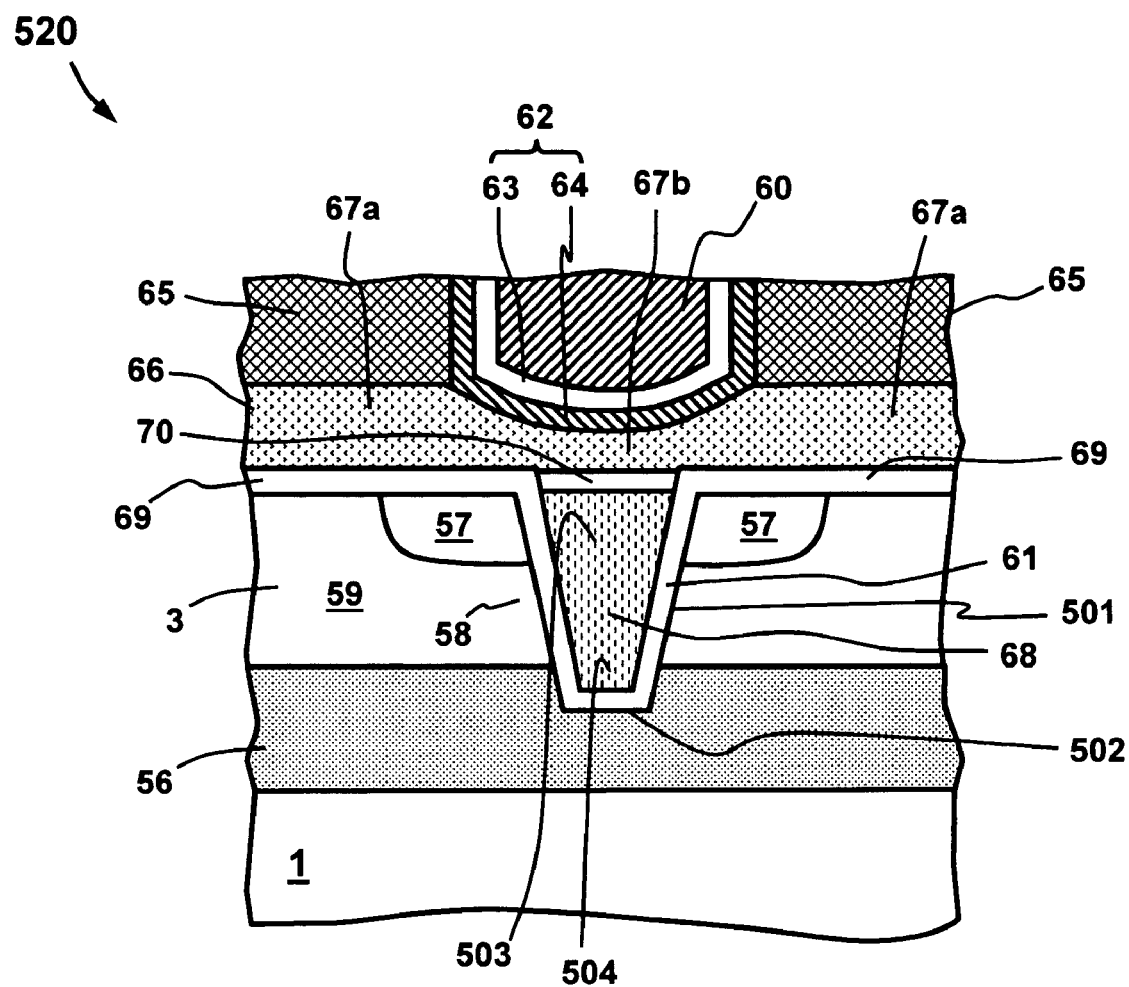
FIG. 26 is the cross sectional view of a cell structure in accordance with another embodiment of the present invention.

FIG. 26 shows a cross sectional view of a memory cell 520 in accordance with another embodiment of the present invention. Memory cell 520 comprises similar provisions as defined in the memory cell 500 of FIG. 24 except with a major difference on the CSR 68. The memory cell 500 defines CSR 68 substantially in a rectangular shape, whereas memory cell 520 defines CSR 68 substantially in a "V" shape or a truncated "V" shape. The "V"-shape CSR 68 comprises two portions: An upper portion 503 can be with a width on the order of about 100 nm to about 2000 nm; a lower portion 504 can be with a width on the order of about 10 nm to about 100 nm. The provision of a "V" shape CSR 68 results in minimum coupling capacitance between CSR 68 and source 56, and hence has the advantage of enhancing capacitive coupling from SBG 66 to CSR 68.

Figure 27:
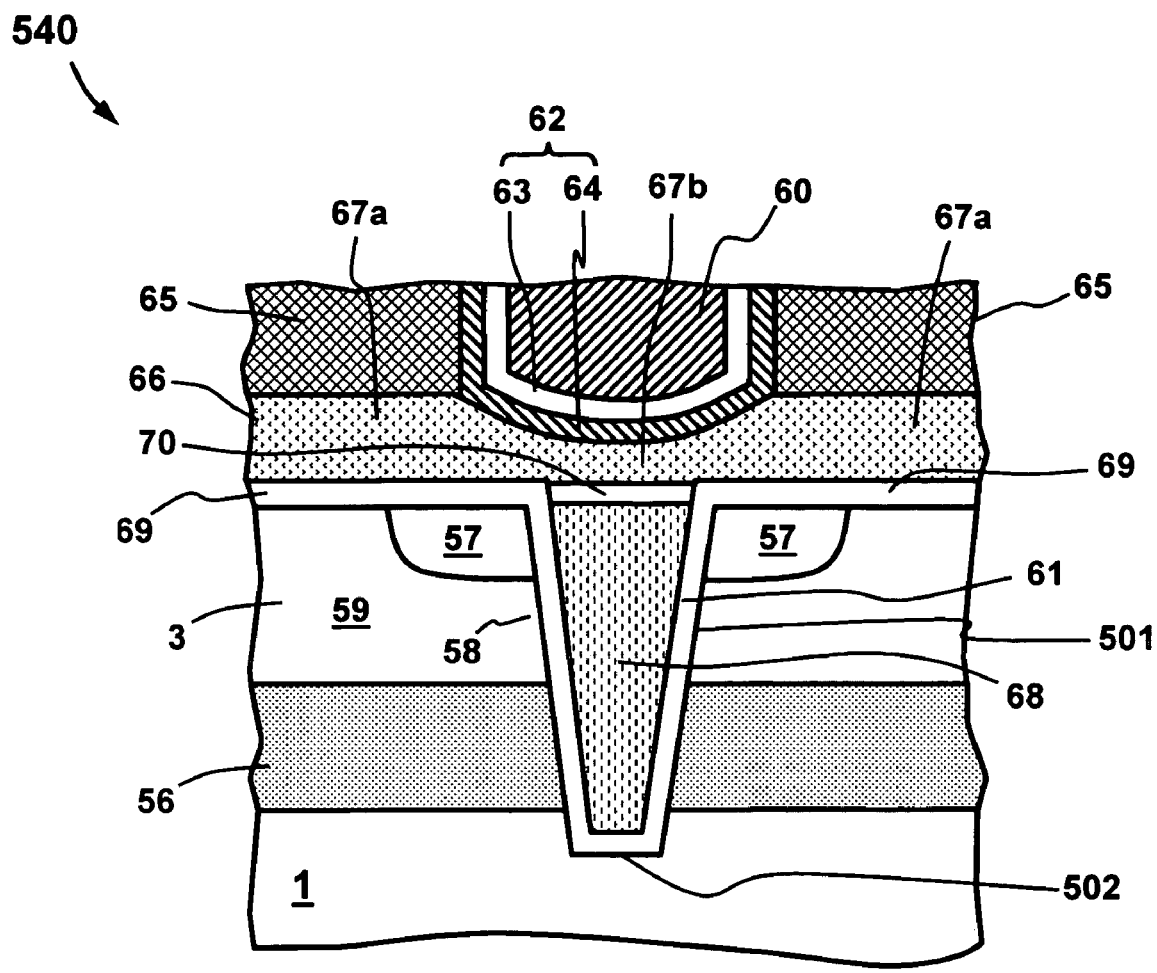
FIG. 27 is the cross sectional view of a cell structure in accordance with another embodiment of the present invention.

FIG. 27 shows a cross sectional view of a memory cell 540 in accordance with another embodiment of the present invention. Memory cell 540 comprises similar provisions as defined in the memory cells 500 and 520 except with a major difference on the CSR 68. The memory cells 500 and 520 define CSR 68 with the trench bottom 502 reside within the source 56, whereas memory cell 540 define CSR 68 extending through the source 56 with the trench bottom 502 reside within the substrate 1.

Figure 28:
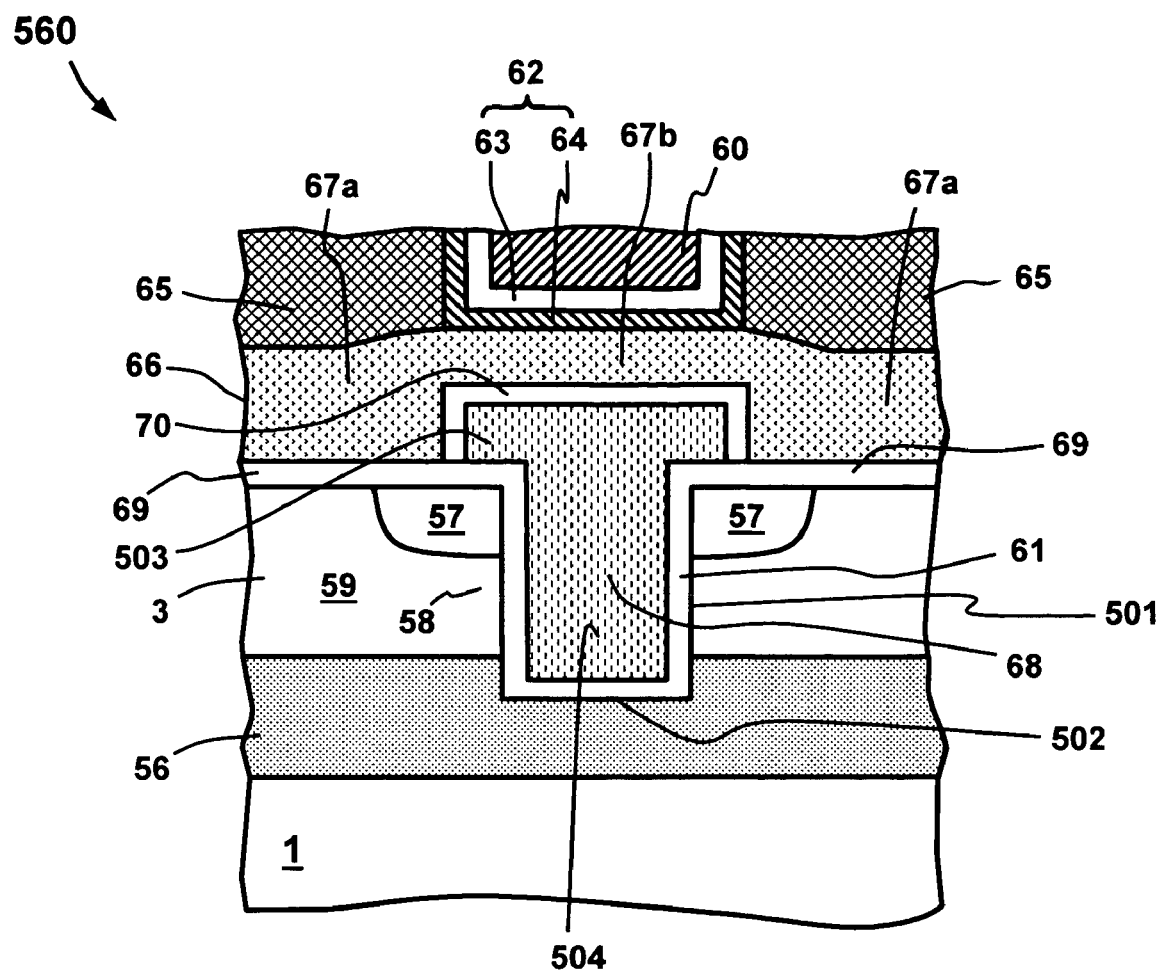
FIG. 28 is the cross sectional view of a cell structure in accordance with another embodiment of the present invention.

FIG. 28 shows a cross sectional view of a memory cell 560 in accordance with another embodiment of the present invention. Memory cell 560 comprises similar provisions as defined in the memory cell 500 in FIG. 24 except with a difference on the CSR 68. The memory cell 500 define CSR 68 substantially in a rectangular shape with the surface of CSR 68 be substantially co-planar with the substrate surface, whereas memory cell 560 define CSR 68 substantially in a "T" shape with a protruding portion 503 of the upper portion of CSR 68 be disposed over and insulated from a portion of the substrate surface. The protruding portion results in the top surface of CSR 68 substantially higher than the substrate surface. The "T"-shape CSR 68 comprises generally two portions: the protruding portion 503 can be with a width on the order of about 150 nm to about 2000 nm; the lower portion 504 adjacent to the trench sidewall 501 and bottom 502 can be with a width on the order of about 50 nm to about 1500 nm. The provision of a "T"-shape CSR 68 has the advantage of a stronger capacitive coupling between the SBG 66 and the CSR 68. Furthermore, the topography of the second portion 67b of SBG 66 can have a convex shaped structure over the protruding portion 503 of CSR 68. A thinner thickness for the second portion 67b of the SBG 66 can be naturally achieved in manufacturing process and thus can be formed in a self-aligned manner to the CSR 68 thereunder. The thinner thickness for the second portion 67b has the advantage on cell operation using piezo-ballistic-carriers-injection mechanism.

Figure 29:
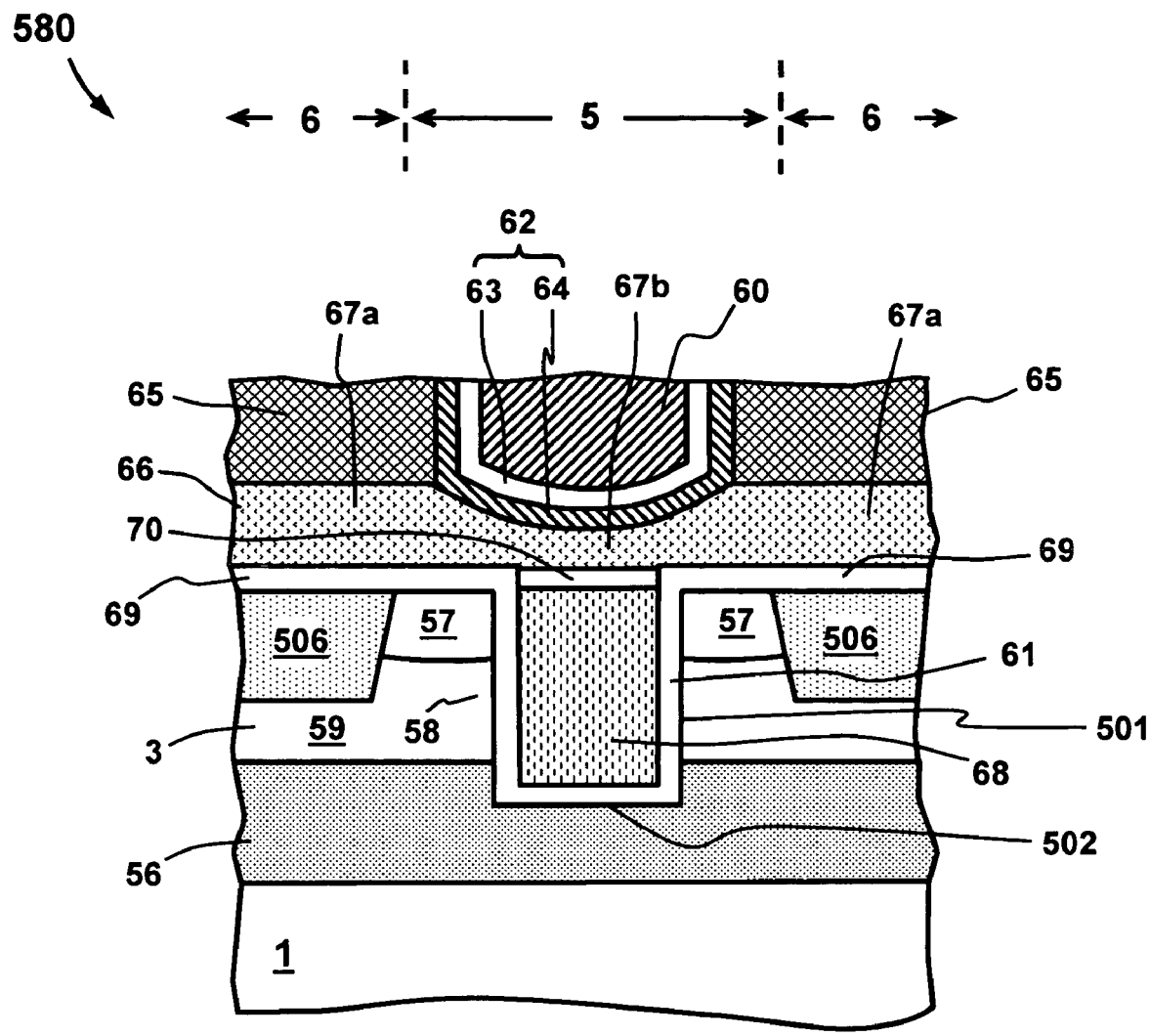
FIG. 29 is the cross sectional view of a cell structure in accordance with another embodiment of the present invention.
Figure 30:
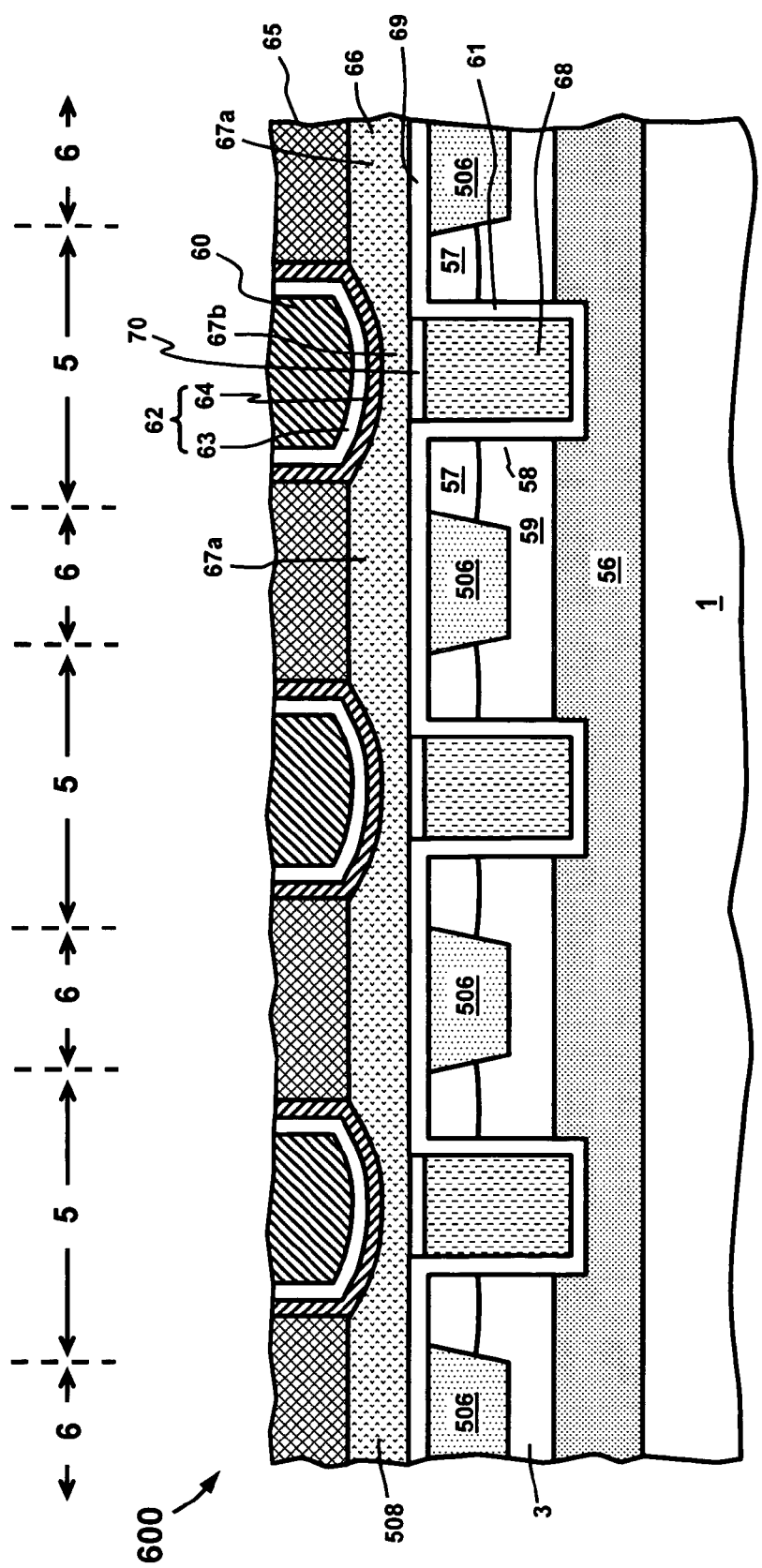
FIG. 30 is the cross sectional view of a segment of a non-volatile electrically alterable memory array in accordance with the embodiments of the present invention.

The isolation scheme for all the memory cells disclosed so far are illustrated based on junction isolation scheme, where drain 57 of two adjacent cells are isolated by the well 3. FIG. 29 shows an example on an alternative scheme for isolating cells in accordance with the present invention. Memory cell 500 of FIG. 24 is used as an example on cell structure for this illustration. Additional elements on this illustration are shown in cell 580 of FIG. 29. Referring to FIG. 29, there are shown two isolation regions 6 with an active region 5 disposed therebetween. Field insulators 506 can be formed in the well 3 to provide isolation function isolating adjacent cells from each other. As shown, field insulators 506 can be disposed under the first portion 67a of the SBG 66 with a depth deeper than the depth of drain 57 but not quite to an upper surface of the source 56. This type of field insulator can be formed by conventional techniques, such as LOCOS process or shallow-trench-isolation ("STI"), well-known in the art. In a preferred embodiment, the field insulator 506 of STI is employed as it can be more precisely formed at smaller design rules. The field insulator 506 is substantially in a rectangular shape with a thickness on the order of about 200 nm and a width of about 100 nm, and can be typically made from insulator such as oxide or other dielectrics well-known in the art. The object in this embodiment is to minimize capacitive coupling between SBG 66 and well 3 on parasitic capacitive components contributed from the first portion 67a of SBG 66. Minimizing the capacitive coupling of SBG 66 has the advantage on reducing capacitance seen by that region in each memory cell and thereby can reduce the operation speed in cell operations (e.g. program, erase, and read) of memory cell. The scheme on cell isolation using region 506, whereby adjacent cells are divided from each other, and the effect of this scheme on minimizing capacitive loading become more appreciable with cross sectional view on structure shown in FIG. 30, wherein there is shown three identical memory cells 580 interconnected together. The active regions 5, wherein memory cells reside, are interlaced with field insulator 506 in isolation regions 6 to form a segment of memory array 600. It should be appreciated that while only a small segment of array 600 is shown, the provisions here illustrate any size of array. The SBG 66 regions of each cell are interconnected to define a SBG line trace 508, which is typically extended across the entire array of memory cells. For example, with an array having a plurality of interlaced columns of isolation and active regions, with a plurality of memory cells in each active region, memory cell elements such as SBG 66 can be interconnected to continuously extend across an entire row or column of memory cells. As a result, the capacitive loading effect appear at the SBG 66 is a multiplication of the total number of cells on a same SBG line to the capacitance of SBG of each individual cell. Therefore, a reduction of 50% on capacitance of SBG in each individual cell can be directly translated to a reduction of 50% on total capacitance of each SBG line, thereby a 50% improvement on speed accessing a cell in a memory array providing other parameters and conditions in cell operation kept the same.

It should be clear to those of ordinary skill in the art that although the cell structures from 500 to 580 in forgoing embodiments are illustrated with the strain material 65 in contact with SBG 66 directly, other alternative configurations on the SBG 66, such as examples shown in FIGS. 22 and 23, can be employed for these cell structures to benefit the piezo-ballistic-charges-injection mechanism. Further, although memory cell 500 is used as the example on illustrating the alternative scheme for isolating cells, it should be clear to those of ordinary skill in the art that other cells in accordance with the present invention can be readily used for the same illustration shown in FIG. 30.

The unique portion of present invention lies in the effects provided by the piezo-ballistic-charge-injection mechanism and by the barrier-height-engineering. These effects result in unique components in the cell structures, namely, the strain source for the piezo-ballistic-charge-injection mechanism and the injection filter for the barrier-height-engineering. Although both the components are illustrated simultaneously in memory cells in accordance with the present invention, it should be clear to those of ordinary skill in the art that the two components need not coexist in the same cell, but can exist in any variations on memory cell falling within the scope of the appended claims. For example, the memory cells of the present invention can comprise the strain source without the injection filter.

In the prior art, material with a larger work function is one of the major criteria on material selection for ballistic gate 12, where ballistic charges traverse. The present invention removes this constraint totally, and the material for the ballistic transport region SBG 66 can be any kind of conductive materials. To emphasize this effect, the piezo-ballistic-charges-injection mechanism of the present invention is illustrated by choosing material of a smaller work function, namely, n+ polysilicon, for SBG 66. It should be apparent to those of ordinary skill in the art that the material for SBG 66 in present invention is not limited to n+ polysilicon, but can encompass any other type of conductive materials such as p+ polysilicon, amorphous silicon, polycrystalline Silicon-Germanium ("poly SiGe"), Pt, Au, Tungsten (W), Mo, Ru, Ta, TaN, TiN etc.

It should be noted that in the injection filter the dielectric constant of BD 64 is illustrated to be greater than that of TD 63. It should be clear to those of ordinary skill in the art that the teaching of this disclosure can be applied to modify the injection filter to effectively block the parasitic charge carriers (electrons or holes) from backward injection. For example, the BD 64 layer of the filter can be modified to material having energy gap narrower and dielectric constant similar to that of TD 63. Furthermore, the layer of BD 64 need not be a material with a uniform chemical element but can be a material with graded composition on its element. In addition, any appropriate dielectric, such as oxynitride ("SiON"), aluminum oxide ("$Al_2O_3$"), hafnium oxide ("$HfO_2$"), zirconium oxide ("$ZrO_2$"), tantalum pen-oxide ("$Ta_2O_5$") etc. can be used in place of oxide or nitride. Furthermore, any composition of those materials and the alloys formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used in place of oxide or nitride.

It is to be understood that the present invention is not limited to the illustrated herein and embodiments described above, but encompasses any and all variations falling within the scope of the appended claims. For example, although the present invention is illustrated in EEPROM, it should be apparent to those having ordinary skill in the art that it can be extended to any other type of nonvolatile memories (such as Electrical Programmable Memory or EPROM). Further, although the present invention is illustrated in a single cell, it should be apparent to those of ordinary skill in the art that a plurality of cells of the present invention can be arranged in a rectangular array of rows and columns in a NAND or a NOR array architecture well known in the art. Additionally, the present invention is illustrated in non-volatile memory cell storing charges on a charge storage region of a conductive or semiconductor material (i.e. the "floating-gates") that is electrically insulated from but capacitively coupled to surrounding electrodes. In such storage scheme, charges are evenly distributed through out the conductive region. However, it should be apparent to those of ordinary skill in the art that the present invention is not limited to the illustrated herein and embodiments described above, but can encompass any other type of schemes for storing charges. For example, the memory cells of the present invention can store charges in localized storage sites such as silicon nano-crystals or traps in a dielectric layer. The advantage of these charge storing schemes is a negligible interference between adjacent cells when they are arranged in a memory array. Furthermore, in the event there is a local breakdown in surrounding insulators of one of the storage sites, charges stored at other sites can still be retained. The dielectric having traps as the storage sites can be a nitride layer formed, for example, by using LPCVD (Low-Pressure-Chemical-Vapor-Deposition) technique well-known in the art. The silicon nano-crystals as the storage sites can be in an oval shape having a diameter in the range of about 2 nm to about 7 nm, and can be formed by using well-known CVD technique.

Furthermore, the strain material of the present invention need not be disposed on both sides of STG, need not be disposed over SBG, need not be rectangular in their cross-sections, need not be in direct contact with STG, need not be in direct contact with SBG, but rather can be disposed over STG, can be disposed under SBG, can be in any position adjacent to STG and SBG, can be any size and shape in their cross-sections, can be in indirect contact with STG, and can be in indirect contact with SBG that effectively provide strain to STG and to SBG in each memory cell. Additionally, the strain material of the present invention need not be nitride, need not be a dielectric, need not be providing tensile stress, need not be providing compressive stress, but rather can be any other types of material and can provide any type of stress (e.g. shear stress) that effectively provide piezo-effect for piezo-ballistic-charges injection.

Moreover, the charge storage region of the present invention need not be in rectangular shape in their top view, need not be in rectangular in their cross-sections, but rather can be any size and shape in their top view and in their cross-sections that effectively store charges and effectively connects the drain 57 and source 56 regions in each memory cell. Additionally, the top surface portion of the charge storage region need not be co-planar with the substrate surface, but rather can be at any level under or above the substrate surface that permit the charge storage region to effectively store charges, effectively capacitive-coupled with SBG 66 and the body 59, and effectively connects the drain 57 and source 56 regions in each memory cell. Similarly, the bottom surface portion of the charge storage region need not be parallel to the substrate surface, need not be flat, but rather can be with other shape that permit charge storage region to effectively store charges, effectively capacitive-coupled with SBG 66 and the body 59, and effectively connects the drain 57 and source 56 regions in each memory cell. Likewise, the top and the bottom surface portion of TD 63 and BD 64 need not be parallel to the substrate surface, need not be flat, need not be co-planar with the substrate surface, but rather can be at any level under or above the substrate surface, in any angle with the substrate surface, and with other shape that can effectively permit piezo-effect charge carriers tunneling in the forward direction and blocked in the backward direction. Additionally, the surface of the channel region need not be co-planar with the substrate surface, but rather can be at any level under or above the substrate surface or in any angle with the substrate surface that effectively connects the drain 57 and source 56 regions in each memory cell. Moreover, source 56 and drain 57 regions, and/or source and drain lines, can be swapped. It should be understood that while the figures show the substrate uniformly doped, it is well known that any and/or all of the regions formed therein (source, drain, channel region, body region, etc.) can be formed in one or more well regions (of differently doped silicon).

It should be clear to those of ordinary skill in the art that the teachings of this disclosure can be applied to modify the architecture of the strain source and the charge injection filter through which the effects resulting in the advantages of the present invention can be achieved.

Finally, the read operation of the cells in accordance with the present invention is described herein for completeness on cell operations. The read operation can best be described when cells are arranged in a rectangular array of rows and columns, wherein a plurality of cells are constructed in NOR or NAND architecture well-known in the art. The read operation can be illustrated with cells constructed with source 56 and drain 57 of n-type conductivity, and body 59 of p-type conductivity. To read the memory cells, a ground potential is applied to the source. A read voltage of approximately +1 volt is applied to the drain and approximately 2.5 volts (depending upon the power supply voltage of the device) is applied to SBG 66. Other regions (i.e. STG 60 and body 59) are at ground potential. If CSR 68 is positively charged (i.e. CSR is discharged of electrons), then the channel 58 is turned on. Thus, an electrical current will flow from source 56 to drain 57. This would be the "1" state.

On the other hand, if CSR 68 is negatively charged, the channel 58 is either weakly turned on or is entirely shut off. Even when SBG and drain are raised to the read potential, little or no current will flow through channel 58. In this case, either the current is very small compared to that of the "1" state or there is no current at all. In this manner, the memory cell is sensed to be programmed at the "0" state. Ground potential is applied to source 56, drain 57, and SBG 66 for cells in non-selected columns and rows so only the selected memory cell is read. For both selected and non-selected memory cells, ground potential is applied to the body region 59.

The memory cell can be formed in an array with peripheral circuitry including conventional row address decoding circuitry, column address decoding circuitry, sense amplifier circuitry, output buffer circuitry and input buffer circuitry, which are well known in the art.

What is claimed is:

1. A nonvolatile memory device, comprising:
    a charge storage region;
    a ballistic gate disposed adjacent to and insulated from the charge storage region;
    a tunneling gate disposed adjacent to and insulated from the ballistic gate; and
    a strain source providing a mechanical stress for generating Piezo-effect in at least one of the tunneling and the ballistic gates.

2. The memory device of claim 1, further comprising:
    a charge injection filter disposed in between the ballistic gate and the tunneling gate, wherein the charge injection filter permits transporting of charge carriers of one polarity type from the tunneling gate through the ballistic gate to the charge storage region and blocks transporting of charge carriers of an opposite polarity type from the ballistic gate to the tunneling gate.

3. The memory device of claim 2, wherein the charge injection filter comprises:
    a first dielectric disposed adjacent to the ballistic gate; and
    a second dielectric disposed adjacent to the first dielectric, wherein the first dielectric has an energy band gap narrower than an energy band gap of the second dielectric.

4. The memory device of claim 3, wherein a product of a dielectric constant of the first dielectric and a thickness of the second dielectric is substantially greater than a product of a dielectric constant of the second dielectric and a thickness of the first dielectric.

5. The memory device of claim 1, further comprising:
    means for injecting electrons from the tunneling gate through the ballistic gate onto the charge storage region; and
    means for injecting holes from the tunneling gate through the ballistic gate onto the charge storage region.

6. The memory device of claim 5, wherein the holes comprise light-holes.

7. A nonvolatile memory device, comprising:
    a body of a semiconductor material having a first conductivity type;

a first and a second spaced-apart regions formed in the body and having a second conductivity type, with a channel region of the body defined there between;

a charge storage region disposed adjacent to and insulated from the channel region;

a ballistic gate disposed adjacent to and insulated from the charge storage region;

a tunneling gate disposed adjacent to and insulated from the ballistic gate; and a strain source providing a mechanical stress for generating Piezo-effect in at least one of the tunneling and the ballistic gates.

8. The memory device of claim 7, further comprising:
a charge injection filter disposed in between the ballistic gate and the tunneling gate, wherein the charge injection filter permits transporting of charge carriers of one polarity type from the tunneling gate through the ballistic gate to the charge storage region and blocks transporting of charge carriers of an opposite polarity type from the ballistic gate to the tunneling gate.

9. The memory device of claim 8, wherein the charge injection filter comprises:
a first dielectric disposed adjacent to the ballistic gate; and
a second dielectric disposed adjacent to the first dielectric, wherein the first dielectric has an energy band gap narrower than an energy band gap of the second dielectric.

10. The memory device of claim 9, wherein a product of a dielectric constant of the first dielectric and a thickness of the second dielectric is substantially greater than a product of a dielectric constant of the second dielectric and a thickness of the first dielectric.

11. The memory device of claim 9, wherein the second dielectric comprises oxide, and the first dielectric comprises material selected from the group consisting of nitride, oxynitride, $Al_2O_3$, $HfO_2$, $TiO_2$, $ZrO_2$, $Ta_2O_5$, and alloys formed thereof.

12. The memory device of claim 9, wherein the second dielectric comprises oxynitride, and the first dielectric comprises material selected from the group consisting of nitride, $Al_2O_3$, $HfO_2$, $TiO_2$, $ZrO_2$, $Ta_2O_5$, and alloys formed thereof.

13. The memory device of claim 7, wherein the charge storage region comprises polysilicon.

14. The memory device of claim 7, wherein the charge storage region comprises a plurality of spaced-apart nano-crystals of a semiconductor material.

15. The memory device of claim 7, wherein the charge storage region comprises a dielectric having a plurality of charge storing traps.

16. The memory device of claim 7, further comprising:
means for injecting electrons from the tunneling gate through the ballistic gate onto the charge storage region; and
means for injecting holes from the tunneling gate through the ballistic gate onto the charge storage region.

17. The memory device of claim 16, wherein the holes comprise light-holes.

18. The memory device of claim 7, wherein the mechanical stress is a tensile stress.

19. The memory device of claim 7, wherein the mechanical stress is a compressive stress.

20. The memory device of claim 7, wherein the strain source is a first strain source and the mechanical stress is a first mechanical stress, and further comprising:
a second strain source providing a second mechanical stress to at least one of the tunneling and the ballistic gates.

21. The memory device of claim 20, wherein the first mechanical stress comprises a compressive stress and the second mechanical stress comprises a tensile stress.

22. The memory device of claim 20, wherein the first mechanical stress and the second mechanical stress comprise compressive stress.

23. The memory device of claim 20, wherein the first mechanical stress and the second mechanical stress comprise tensile stress.

24. The memory device of claim 7, wherein the ballistic gate comprises material selected from the group consisting of Pt, Au, W, Mo, Ru, Ta, TaN, TiN, n+ polysilicon, p+ polysilicon, n+ poly SiGe and p+ poly SiGe.

25. The memory device of claim 7, wherein the ballistic gate includes:
a first portion disposed generally over and insulated from the first and the second regions; and
a second portion disposed generally over and insulated from the charge storage region.

26. The memory device of claim 25, wherein the second portion of the ballistic gate is generally thinner than the first portion.

27. The memory device of claim 7, wherein the charge storage region is disposed in a trench having a sidewall and a bottom formed in the body.

28. The memory device of claim 27, wherein:
the sidewall of the trench is generally perpendicular to a surface of the body; and
the bottom of the trench is generally parallel to the surface of the body.

29. The memory device of claim 7, wherein the strain source comprises material selected from the group consisting of nitride, tungsten-silicide, amorphous silicon, poly SiGe, TaN, and TiN.

30. The memory device of claim 7, wherein the strain source comprises dislocation loops in at least one of the tunneling and the ballistic gates.

31. The memory device of claim 7, wherein the mechanical stress is at a level in the range of about 50 MPa to about 1 GPa.

* * * * *

UNITED STATES PATENT AND TRADEMARK OFFICE
CERTIFICATE OF CORRECTION

| | | |
|---|---|---|
| PATENT NO. | : 7,115,942 B2 | Page 1 of 1 |
| APPLICATION NO. | : 11/007907 | |
| DATED | : October 3, 2006 | |
| INVENTOR(S) | : Chih-Hsin Wang | |

It is certified that error appears in the above-identified patent and that said Letters Patent is hereby corrected as shown below:

Title Page, Item (63)

"Related U.S. Application Data", after the text "filed on Nov. 8, 2004", insert the following --and Provisional application No. 60/585,238, filed on July 1, 2004--.

Signed and Sealed this

Twenty-seventh Day of February, 2007

JON W. DUDAS
*Director of the United States Patent and Trademark Office*